(12) United States Patent
Park et al.

(10) Patent No.: US 12,297,365 B2
(45) Date of Patent: May 13, 2025

(54) COMPOSITION FOR FORMING LIGHT-EMITTING DEVICE, METHOD OF MANUFACTURING LIGHT-EMITTING DEVICE USING THE COMPOSITION, AND LIGHT-EMITTING DEVICE MANUFACTURED USING THE METHOD

(71) Applicant: Samsung Display Co., Ltd., Yongin-si (KR)

(72) Inventors: Wonjun Park, Yongin-si (KR); Lokgam Jung, Yongin-si (KR); Sehun Kim, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 702 days.

(21) Appl. No.: 17/450,138

(22) Filed: Oct. 6, 2021

(65) Prior Publication Data

US 2022/0195228 A1 Jun. 23, 2022

(30) Foreign Application Priority Data

Dec. 22, 2020 (KR) ........................ 10-2020-0181179

(51) Int. Cl.

| | | |
|---|---|---|
| *C09D 11/50* | (2014.01) | |
| *C09D 11/033* | (2014.01) | |
| *C09D 11/037* | (2014.01) | |
| *C09D 11/322* | (2014.01) | |
| *C09D 11/36* | (2014.01) | |
| *C09D 11/52* | (2014.01) | |
| *C09K 11/02* | (2006.01) | |
| *H10K 85/10* | (2023.01) | |
| *H10K 85/60* | (2023.01) | |
| *H10K 50/11* | (2023.01) | |
| *H10K 50/15* | (2023.01) | |
| *H10K 50/16* | (2023.01) | |
| *H10K 71/13* | (2023.01) | |
| *H10K 71/15* | (2023.01) | |
| *H10K 101/10* | (2023.01) | |

(52) U.S. Cl.
CPC ............ *C09D 11/50* (2013.01); *C09D 11/033* (2013.01); *C09D 11/037* (2013.01); *C09D 11/322* (2013.01); *C09D 11/36* (2013.01); *C09D 11/52* (2013.01); *C09K 11/02* (2013.01); *H10K 85/111* (2023.02); *H10K 85/1135* (2023.02); *H10K 85/631* (2023.02); *H10K 50/11* (2023.02); *H10K 50/15* (2023.02); *H10K 50/16* (2023.02); *H10K 71/135* (2023.02); *H10K 71/15* (2023.02); *H10K 2101/10* (2023.02)

(58) Field of Classification Search
CPC ....... C09K 11/02; C09D 11/50; C09D 11/033; C09D 11/037; C09D 11/322; C09D 11/36; C09D 11/52; H10K 2101/10; H10K 71/135; H10K 71/15; H10K 85/631; H10K 85/111; H10K 50/16; H10K 50/11; H10K 50/15; H10K 85/1135
See application file for complete search history.

(56) References Cited

U.S. PATENT DOCUMENTS

| | | | |
|---|---|---|---|
| 5,458,974 A * | 10/1995 | Earhart ................... | C07C 15/14 |
| | | | 106/311 |
| 2008/0206447 A1 | 8/2008 | Inoue et al. | |
| 2012/0001124 A1* | 1/2012 | Ishino ................... | H10K 71/15 |
| | | | 252/301.16 |
| 2019/0002722 A1* | 1/2019 | May ..................... | H10K 85/115 |
| 2020/0259093 A1 | 8/2020 | Kim et al. | |

FOREIGN PATENT DOCUMENTS

| | | | |
|---|---|---|---|
| EP | 0 601 690 B1 | 4/1997 | |
| JP | 2019214659 A * | 12/2019 | |
| KR | 10-2018-0093430 A | 8/2018 | |
| KR | 10-2020-0099217 A | 8/2020 | |
| WO | WO-2019212022 A1 * | 11/2019 | ........... C09D 11/033 |

OTHER PUBLICATIONS

EPO machine translation JP 2019214659 A published Dec. 19, 2019 (Year: 2019).*
Clarivate Analytics machine translation WO 2019212022 A1 published Nov. 7, 2019 (Year: 2019).*
Google Search of "Dibutyl Phthalate", URL: https://g.co/kgs/vnPpz5, PDF Capture May 25, 2021, 2 Pages.
National Center for Biotechnology Information (2021). PubChem Compound Summary for CID 3026, Dibutyl phthalate. Retrieved Oct. 4, 2021 from https://pubchem.ncbi.nlm.nih.gov/compound/Dibutyl-phthalate, 44 Pages.
Google Search of "Diisobutyl Phthalate", URL: https://g.co/kgs/ZyhMvK, PDF Capture Apr. 21, 2021, 2 Pages.
Avantor Product Page for 1-Ethylnaphthalene, URL: https://us.vwr.com/store/product/9559675/1-ethylnaphthalene-97-0, PDF Capture Apr. 21, 2021, 2 Pages, VWR International, LLC.
Google Search of "Anisole", URL: https://g.co/kgs/LJWkNh, PDF Capture Apr. 21, 2021, 2 Pages.
Google Search of "Cyclohexanol", URL: https://g.co/kgs/7kqn5H, PDF Capture Apr. 21, 2021, 2 Pages.
National Center for Biotechnology Information (2021). PubChem Compound Summary for CID 6782, Diisobutyl phthalate. Retrieved Oct. 4, 2021 from https://pubchem.ncbi.nlm.nih.gov/compound/Diisobutyl-phthalate, 49 Pages.

* cited by examiner

*Primary Examiner* — Jane L Stanley
(74) *Attorney, Agent, or Firm* — Womble Bond Dickinson (US) LLP

(57) ABSTRACT

A composition for forming a light-emitting device, a method of manufacturing a light-emitting device utilizing the composition, and a light-emitting device manufactured utilizing the composition are provided. The composition includes two or more solvents and a boiling point of a first solvent having the highest boiling point among the two or more solvents is greater than 300° C.

19 Claims, 3 Drawing Sheets

COMPOSITION FOR FORMING LIGHT-EMITTING DEVICE, METHOD OF MANUFACTURING LIGHT-EMITTING DEVICE USING THE COMPOSITION, AND LIGHT-EMITTING DEVICE MANUFACTURED USING THE METHOD

CROSS-REFERENCE TO RELATED APPLICATION

This application claims priority to and the benefit of Korean Patent Application No. 10-2020-0181179, filed on Dec. 22, 2020, in the Korean Intellectual Property Office, the disclosure of which is incorporated by reference herein in its entirety.

BACKGROUND

1. Field

One or more embodiments relate to a composition for forming a light-emitting device, a method of manufacturing a light-emitting device using the composition, and a light-emitting device manufactured using the method.

2. Description of the Related Art

Among light-emitting devices, self-emissive devices have wide viewing angles, high contrast ratios, short response times, and/or suitable (e.g., excellent) characteristics in terms of luminance, driving voltage, and/or response speed.

In a light-emitting device, a first electrode may be located on a substrate, and a hole transport region, an emission layer, an electron transport region, and a second electrode may be sequentially arranged on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. The excitons transition from an excited state to a ground state to thereby generate light.

An interlayer of a light-emitting device may be formed as a film by utilizing a solution process (e.g., a method utilizing a solution process) such as spin coating and/or inkjet printing. When the interlayer is formed by inkjet printing, ink including a solute and a solvent is ejected from an inkjet print head onto a pixel region, and the solvent of the ink is dried to form the interlayer.

SUMMARY

When an interlayer of a light-emitting device is formed by utilizing a solution process, it is desired (e.g., required) to control drying conditions of a solvent, physical properties of a solution for forming the interlayer, and/or the like, in order to increase film uniformity. Because the light-emitting device has a multi-layered structure, when a film printed by the solution process is not flat, efficiency and lifespan of the light-emitting device may be reduced.

An aspect according to one or more embodiments is directed toward a composition for forming a light-emitting device, wherein a film having improved flatness may be formed by utilizing a solvent having a high boiling point and viscosity. Aspects according to one or more embodiments are directed toward a method of manufacturing a light-emitting device utilizing the composition, and a light-emitting device manufactured utilizing the method.

Additional aspects will be set forth in part in the description, which follows and, in part, will be apparent from the description, or may be learned by practice of the presented embodiments of the disclosure.

According to one or more embodiments, a composition for forming a light-emitting device includes
two or more solvents,
a boiling point of a first solvent having the highest boiling point among the two or more solvents is greater than 300° C.,
a viscosity at 25° C. of the first solvent is from about 10 centipoise (cP) to about 30 cP, and
the first solvent includes a compound represented by Formula 1.

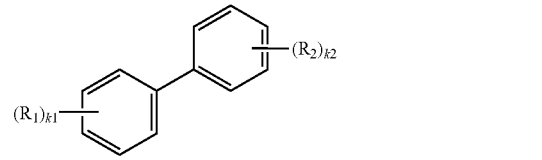

Formula 1

In Formula 1,
$R_1$ and $R_2$ may each independently be a $C_1$-$C_{10}$ alkyl group unsubstituted or substituted with at least one $R_{10a}$, a $C_2$-$C_{10}$ alkenyl group unsubstituted or substituted with at least one $R_{10a}$, a $C_3$-$C_{10}$ cycloalkyl group unsubstituted or substituted with at least one $R_{10a}$, a $C_3$-$C_{10}$ cycloalkenyl group unsubstituted or substituted with at least one $R_{10a}$, a $C_6$-$C_{20}$ aryl group unsubstituted or substituted with at least one $R_{10a}$, or a monovalent non-aromatic condensed polycyclic group unsubstituted or substituted with at least one $R_{10a}$,
k1 and k2 may each independently be an integer from 1 to 5, and
$R_{10a}$ may be
deuterium, —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof,
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the compound represented by Formula 1 may not contain a heteroatom. In an embodiment, the compound represented by Formula 1 may be an aromatic hydrocarbon-based compound not containing a heteroatom.

In an embodiment, $R_1$ and $R_2$ in Formula 1 may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group.

In an embodiment, the first solvent may be 4,4'-diisopropyl-1,1'-biphenyl, 3,3'-diisopropyl-1,1'-biphenyl, 2,2'-diisopropyl-1,1'-biphenyl, 3,4'-diisopropyl-1,1'-biphenyl, 2,4'-diisopropyl-1,1'-biphenyl, 2,3'-diisopropyl-1,1'-biphenyl, or any combination thereof.

In an embodiment, a vapor pressure at 25° C. of the first solvent may be from about $1 \times 10^{-5}$ torr to about $1 \times 10^{-4}$ torr.

In an embodiment, the composition for forming a light-emitting device may include two solvents (e.g., two or more solvents or just two solvents). A second solvent having a lower boiling point than the first solvent may have a vapor pressure at 25° C. of about $1 \times 10^{-2}$ torr to about $1 \times 10^{-1}$ torr.

In an embodiment, the composition for forming a light-emitting device may include three solvents (e.g., three or more solvents or just three solvents). A second solvent and a third solvent each having a lower boiling point than the first solvent may each independently have a vapor pressure at 25° C. of about $1 \times 10^{-2}$ torr to about $1 \times 10^{-1}$ torr.

In an embodiment, a ratio of the vapor pressure at 25° C. of the second solvent to the vapor pressure at 25° C. of the first solvent may be from about 100 to about 10,000, and a ratio of the vapor pressure at 25° C. of the third solvent to the vapor pressure at 25° C. of the first solvent may be from about 100 to about 10,000.

In an embodiment, the second solvent and the third solvent may each independently have a viscosity at 25° C. of about 1 cP to about 10 cP.

In an embodiment, the first solvent may be included in a range of about 15 wt % to about 25 wt % in amount based on a total weight of the composition for forming a light-emitting device, the second solvent may be included in a range of about 50 wt % to about 55 wt % in amount based on the total weight of the composition for forming a light-emitting device, and the third solvent may be included in a range of about 25 wt % to about 30 wt % in amount based on the total weight of the composition for forming a light-emitting device.

In an embodiment, the second solvent and the third solvent may each independently be an aromatic hydrocarbon-based compound not containing a heteroatom or a non-aromatic cyclic hydrocarbon-based compound not containing a heteroatom.

In an embodiment, the second solvent and the third solvent may each independently be cyclohexylbenzene, 1-ethylnaphthalene, 2-ethylnaphthalene, or 2-ethylbiphenyl.

In an embodiment, the composition for forming a light-emitting device may further include a light-emitting material.

In an embodiment, the light-emitting material may include a host and a dopant.

In an embodiment, the composition for forming a light-emitting device may further include a hole-transporting material.

In an embodiment, the composition for forming a light-emitting device may further include an electron-transporting material.

According to one or more embodiments, a method of manufacturing a light-emitting device includes forming an interlayer including an emission layer on a first electrode,
wherein the forming of the interlayer includes a solution process utilizing a composition for forming the light-emitting device,
the composition includes two or more solvents,
a boiling point of a first solvent having the highest boiling point among the n kinds of solvents is greater than 300° C.,
a viscosity at 25° C. of the first solvent is from about 10 cP to about 30 cP, and
the first solvent includes a compound represented by Formula 1.

In an embodiment, the solution process may be performed by inkjet printing, nozzle printing, screen printing, flexographic printing, and/or offset printing.

According to one or more embodiments, a light-emitting device includes a first electrode, a second electrode facing the first electrode, and an interlayer between the first electrode and the second electrode and including an emission layer, wherein the interlayer is formed by utilizing the composition for forming the light-emitting device described above.

In an embodiment, the first electrode may be an anode, the second electrode may be a cathode, the interlayer may further include a hole transport region between the first electrode and the emission layer and an electron transport region between the emission layer and the second electrode, and at least one of the hole transport region, the emission layer, and the electron transport region may be formed by utilizing the composition for forming the light-emitting device described above.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
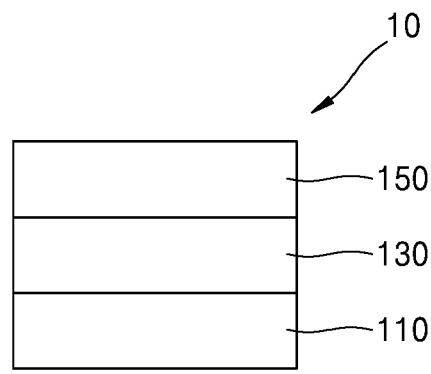
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diversely modified embodiments, example embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

Composition for Forming Light-Emitting Device

A composition for forming a light-emitting device according to an embodiment may include n kinds (e.g., types) of solvents,
  wherein n may be an integer of 2 or more,
  a boiling point of a first solvent having the highest boiling point among the n kinds (e.g., types) of solvents may be greater than 300° C., and
  a viscosity at 25° C. of the first solvent may be from about 10 centipoise (cP) to about 30 cP.

In an embodiment, n may be an integer from 2 to 10. That is, the composition for forming a light-emitting device may include 2 to 10 kinds (e.g., types) of solvents.

In an embodiment, n may be an integer from 2 to 4. That is, the composition for forming a light-emitting device may include 2 to 4 kinds (e.g., types) of solvents.

In a solution process for forming an interlayer of a light-emitting device, it is desired (e.g., required) to control drying conditions of a solvent, conditions of an underlayer on which a solution is coated, physical properties of a solution for forming the interlayer, and/or the like, in order to improve in pixel uniformity (IPU).

In related art, two kinds (e.g., types) of solvents having similar boiling points and viscosities are mixed and utilized as a composition for forming an interlayer of a light-emitting device. However, a film formed by utilizing a composition for forming an interlayer of the related art has an IPU of only about 50%, and thus, there is a need to increase the IPU to improve efficiency and lifespan of a light-emitting device.

According to an embodiment of the present disclosure, a composition for forming a light-emitting device is provided, wherein the usage (e.g., use) of a solvent having a high boiling point and a high viscosity may significantly improve the IPU.

In the composition for forming a light-emitting device according to an embodiment, when the n kinds (e.g., types) of solvents are evaporated sequentially starting from the solvent having the lowest boiling point, solutes may move toward a bank that is formed at the edge of a pixel region, and the surface tension at the solution center (e.g., the center of the solution in the pixel region) may be reduced. As a result, the solutes may move toward the solution center again due to the Marangoni effect, thereby increasing the IPU of the film formed after the solvents are dried. Because the composition for forming a light-emitting device of the present disclosure includes solvents having high boiling points and viscosities, the Marangoni effect resulting from the sequential evaporation of the solvents may be enhanced (e.g., maximized), and the flatness of a film formed therefrom may be improved.

The first solvent having the highest boiling point among the n kinds (e.g., types) of solvents may include a compound represented by Formula 1:

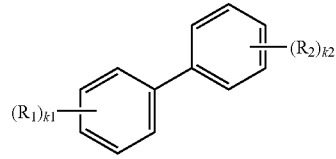

Formula 1 wherein, in Formula 1,
$R_1$ and $R_2$ may each independently be a $C_1$-$C_{10}$ alkyl group unsubstituted or substituted with at least one $R_{10a}$, a $C_2$-$C_{10}$ alkenyl group unsubstituted or substituted with at least one $R_{10a}$, a $C_3$-$C_{10}$ cycloalkyl group unsubstituted or substituted with at least one $R_{10a}$, a $C_3$-$C_{10}$ cycloalkenyl group unsubstituted or substituted with at least one $R_{10a}$, a $C_6$-$C_{20}$ aryl group unsubstituted or substituted with at least one $R_{10a}$, or a monovalent non-aromatic condensed polycyclic group unsubstituted or substituted with at least one $R_{10a}$,
k1 and k2 may each independently be an integer from 1 to 5, and
$R_{10a}$ may be:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the compound represented by Formula 1 may not contain a heteroatom.

In an embodiment, $R_1$ and $R_2$ in Formula 1 may each independently be a $C_1$-$C_5$ alkyl group unsubstituted or substituted with at least one $R_{10a}$.

For example, $R_1$ and $R_2$ may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group.

In an embodiment, the first solvent may be 4,4'-diisopropyl-1,1'-biphenyl, 3,3'-diisopropyl-1,1'-biphenyl, 2,2'-diisopropyl-1,1'-biphenyl, 3,4'-diisopropyl-1,1'-biphenyl, 2,4'-diisopropyl-1,1'-biphenyl, 2,3'-diisopropyl-1,1'-biphenyl, or any combination thereof, but embodiments of the present disclosure are not limited thereto.

In an embodiment, a vapor pressure at 25° C. of the first solvent may be from about $1\times10^{-5}$ torr to about $1\times10^{-4}$ torr.

In an embodiment, a boiling point at 25° C. of the first solvent may be from about 310° C. to about 450° C., for example, about 320° C. to about 400° C., or about 330° C. or more to about 350° C.

In an embodiment, a viscosity at 25° C. of the first solvent may be from about 15 cP to about 20 cP.

In an embodiment, the composition for forming a light-emitting device may include two kinds (e.g., types) of solvents,
wherein, among the two kinds (e.g., types) of solvents, a second solvent having a lower boiling point than the first solvent may have a vapor pressure at 25° C. of about $1\times10^{-2}$ torr to about $1\times10^{-1}$ torr.

A ratio of the vapor pressure at 25° C. of the second solvent to the vapor pressure at 25° C. of the first solvent may be 100 or more. For example, the ratio of the vapor pressure at 25° C. of the second solvent to the vapor pressure at 25° C. of the first solvent may be from about 100 to about 10,000.

In an embodiment, the boiling point of the second solvent may be from about 200° C. to about 300° C., or about 220° C. to about 280° C.

In an embodiment, a viscosity at 25° C. of the second solvent may be from about 1 cP to about 10 cP, or about 1 cP to about 5 cP.

As described above, because the composition for forming a light-emitting device includes the first solvent having a higher boiling point and a higher viscosity than the second solvent, a film having improved film flatness may be formed. In other words, because the composition for forming a light-emitting device according to an embodiment utilizes the two kinds (e.g., types) of solvents having a large difference in vapor pressure and viscosity, a thin film having improved film flatness may be formed.

In one or more embodiments, the composition for forming a light-emitting device may include three kinds (e.g., types) of solvents,
wherein, among the three kinds (e.g., types) of solvents, a second solvent and a third solvent having a lower boiling point than the first solvent may each independently have a vapor pressure at 25° C. of about $1\times10^{-2}$ torr to about $1\times10^{-1}$ torr.

A ratio of the vapor pressure at 25° C. of the second solvent to the vapor pressure at 25° C. of the first solvent and a ratio of the vapor pressure at 25° C. of the third solvent to the vapor pressure at 25° C. of the first solvent may each be 100 or more.

For example, the ratio of the vapor pressure at 25° C. of the second solvent to the vapor pressure at 25° C. of the first solvent may be from about 100 to about 10,000, and the ratio of the vapor pressure at 25° C. of the third solvent to the vapor pressure at 25° C. of the first solvent may be from about 100 to about 10,000.

In an embodiment, the second solvent and the third solvent may each independently have a boiling point of about 200° C. to about 300° C., or about 220° C. to about 280° C.

In an embodiment, the second solvent and the third solvent may each independently have a viscosity at 25° C. of about 1 cP to about 10 cP, or about 1 cP to about 5 cP.

As described above, because the composition for forming a light-emitting device includes the first solvent having a higher boiling point and viscosity than each of the second solvent and the third solvent, a thin film having improved film flatness may be formed. In other words, because the composition for forming a light-emitting device according to an embodiment utilizes the three kinds (e.g., types) of solvents having a large difference in vapor pressure and viscosity, a thin film having improved film flatness may be formed.

In an embodiment, the first solvent may be included in an amount in a range of about 15 wt % to about 25 wt % based on the total weight of the composition for forming a light-emitting device,
the second solvent may be included in an amount in a range of about 50 wt % to about 55 wt % based on the total weight of the composition for forming a light-emitting device, and
the third solvent may be included in an amount in a range of about 25 wt % to about 30 wt % based on the total weight of the composition for forming a light-emitting device.

In an embodiment, the second solvent and the third solvent may each independently be an aromatic hydrocarbon-based compound not containing a heteroatom or a non-aromatic cyclic hydrocarbon-based compound not containing a heteroatom.

For example, the second solvent and the third solvent may each independently be cyclohexylbenzene, 1-ethylnaphthalene, 2-ethylnaphthalene, or 2-ethylbiphenyl, but embodiments of the present disclosure are not limited thereto.

The composition for forming a light-emitting device may further include various suitable solutes according to usage (e.g., function) of an interlayer to be formed (for example, an emission layer, a hole transport layer, an electron transport layer, and/or the like).

In an embodiment, an amount of the solutes may be in a range of about 0.001 wt % to about 20 wt % based on the total weight of the composition for forming a light-emitting device, for example, about 0.1 wt % to about 15 wt %, but embodiments of the present disclosure are not limited thereto. When the range described above is satisfied, the composition for forming a light-emitting device may have a concentration suitable for a solution process.

Materials included as the solutes may have luminescence characteristics, hole transporting characteristics, and/or electron transporting characteristics, may have suitable (e.g., excellent) compatibility with organic materials utilized in an interlayer of a light-emitting device, and may be stably dissolved in the composition for forming a light-emitting device.

In an embodiment, the composition for forming a light-emitting device may further include a light-emitting material, a hole-transporting material, an electron-transporting material, or any combination thereof.

In an embodiment, the composition for forming a light-emitting device may further include a light-emitting material.

The light-emitting material may include, for example, a host and a dopant.

In an embodiment, the host may include at least one compound selected from anthracene-based compounds, pyrene-based compounds, and spiro-bifluorene-based compounds.

In one or more embodiments, the host may include a compound that can be utilized as a host in an emission layer to be described in more detail later.

In an embodiment, the dopant may include at least one selected from a fluorescent dopant and a phosphorescent dopant. An example of the dopant may include a compound that can be utilized as a dopant in an emission layer to be described in more detail later.

In one or more embodiments, the composition for forming a light-emitting device may further include a hole-transporting material.

As the hole-transporting material, a compound that can be utilized in a hole transport region to be described in more detail later may be utilized. For example, the hole-transporting material may include aryl amine, a hole transport polymer, or any combination thereof, but embodiments of the present disclosure are not limited thereto.

In one or more embodiments, the composition for forming a light-emitting device may further include an electron-transporting material.

As the electron-transporting material, a compound that can be utilized in an electron transport region to be described in more detail later may be utilized. In an embodiment, the electron-transporting material may include a metal-free compound including at least one π electron-deficient nitrogen-containing ring, but embodiments of the present disclosure are not limited thereto.

Method of Manufacturing Light-Emitting Device

A method of manufacturing a light-emitting device according to an embodiment may include
  forming an interlayer including an emission layer on a first electrode,
  wherein the forming of the interlayer may include a solution process utilizing a composition for forming a light-emitting device,
  the composition for forming a light-emitting device may include n kinds (e.g., types) of solvents,
  n may be an integer of 2 or more,
  a boiling point of a first solvent having the highest boiling point among the n kinds (e.g., types) of solvents may be greater than 300° C.,
  a viscosity at 25° C. of the first solvent may be from about 10 centipoise (cP) to about 30 cP, and
  the first solvent may include a compound represented by Formula 1.

The solution process in the present specification may include a coating process for applying a composition for forming a light-emitting device and a drying process for removing a solvent (e.g., all solvents) from the applied composition for forming a light-emitting device. A solidified thin film may be formed as a result of the drying process for removing a solvent (e.g., all solvents).

In an embodiment, the solution process may be performed by, for example, spin coating, slot coating, dip coating, bar coating, roll coating, gravure coating, micro-gravure coating, wire coating, spray coating, inkjet printing, nozzle printing, screen printing, flexographic printing, offset printing, and/or casting.

In an embodiment, the solution process may be performed by inkjet printing, nozzle printing, screen printing, flexographic printing, and/or offset printing, but embodiments of the present disclosure are not limited thereto.

The first electrode may be formed by, for example, depositing or sputtering a material for forming a first electrode on a substrate. The material for the first electrode will be described in more detail later.

In an embodiment, the first electrode may be an anode.

In an embodiment, the forming of the interlayer may include forming a hole transport region, forming an emission layer, and forming an electron transport region.

In an embodiment, the composition for forming a light-emitting device may be utilized in the forming of the hole transport region, the forming of the emission layer, and/or the forming of the electron transport region.

In an embodiment, the method of manufacturing a light-emitting device may include: forming a hole injection layer on a first electrode; forming a hole transport layer on the hole injection layer; forming an emission layer on the hole transport layer; forming an electron transport layer on the emission layer; forming an electron injection layer on the electron transport layer; and/or forming a second electrode on the electron injection layer.

In an embodiment, the composition for forming a light-emitting device may be utilized in at least one of the forming of the hole injection layer, the forming of the hole transport layer, the forming of the emission layer, the forming of the electron transport layer, or the forming of the electron injection layer.

Materials constituting each layer will be described in more detail later.

In an embodiment, the solution process may further include removing the n kinds (e.g., types) of solvents. For example, the solution process may include removing the n kinds (e.g., types) of solvents sequentially from the solvent having the lowest boiling to the solvent having the highest boiling point (the first solvent).

Because the solvents in the composition for forming a light-emitting device are removed sequentially starting from the solvent having the lowest boiling point, the film flatness of a film formed by the solution process may be improved.

In an embodiment, the removing of the n kinds (e.g., types) of solvents may be performed under atmospheric condition or under reduced pressure. In the case of the reduced pressure, the pressure may be from about $10^{-6}$ mbar to about 1 bar, for example, about $10^{-6}$ mbar to about 10 mbar.

In an embodiment, the removing of the n kinds (e.g., types) of solvents may include heat-treating at least one of the n kinds (e.g., types) of solvents.

In an embodiment, the heat-treating of the at least one of the n kinds (e.g., types) of solvents may be performed at a temperature of about 100° C. to about 300° C., for example, about 150° C. to about 250° C.

A second electrode may be formed on the interlayer. As a method of forming the second electrode, a material for the second electrode may be provided by a deposition method and/or a sputtering method. The material for the second electrode will be described in more detail later.

In an embodiment, the second electrode may be a cathode.

Light-Emitting Device

In an embodiment, a light-emitting device may be manufactured utilizing the composition for forming a light-emitting device as described above. Accordingly, a light-emitting device manufactured by utilizing the composition for forming a light-emitting device described above may be provided.

In an embodiment, a light-emitting device 10 may include: a first electrode 110; a second electrode 150 facing the first electrode 110; and an interlayer 130 located between the first electrode 110 and the second electrode 150 and including an emission layer, wherein the interlayer 130 may be formed by utilizing the composition for forming a light-emitting device described above.

Because the light-emitting device 10 utilizes the composition for forming a light-emitting device including n kinds (e.g., types) of solvents having a large difference in vapor pressure and viscosity, film flatness of the interlayer 130 may be improved, thereby improving efficiency and lifespan of the light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment will be described in connection with FIG. 1.

First Electrode 110

In FIG. 1, a substrate may be additionally located under the first electrode 110 or above the second electrode 150. As the substrate, a glass substrate or a plastic substrate may be utilized. In one or more embodiments, the substrate may be a flexible substrate, and may include plastics with suitable (e.g., excellent) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode.

When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming a first electrode.

The first electrode 110 may have a single layer consisting of a single-layered structure or a multilayer structure including a plurality of layers. For example, the first electrode 110 may have a three-layered structure of ITO/Ag/ITO.

Interlayer 130

The interlayer 130 may be located on the first electrode 110. The interlayer 130 may include an emission layer, and may further include a hole transport region located between the first electrode 110 and the emission layer and an electron transport region located between the emission layer and the second electrode 150.

The interlayer 130 may further include, in addition to various suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150 and ii) a charge generation layer located between two adjacent emitting units. When the interlayer 130 includes the two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

In some embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, layers are stacked sequentially from the first electrode 110 in the respective stated order.

The hole transport region may include a compound represented by Formula 201, a compound represented by Formula 202, or any combination thereof:

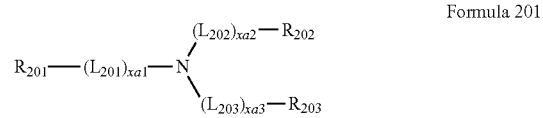

Formula 201

Formula 202

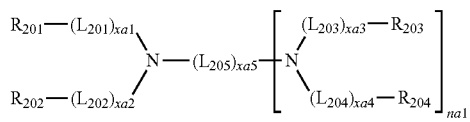

wherein, in Formulae 201 and 202,
$L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5,
xa5 may be an integer from 1 to 10,
$R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of the groups represented by Formulae CY201 to CY217.

CY201

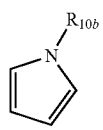

CY202

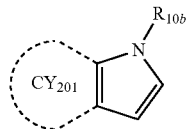

CY203

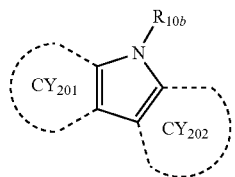

CY204

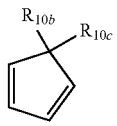

CY205

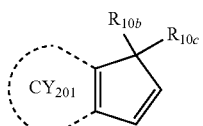

CY206

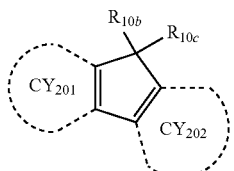

CY207

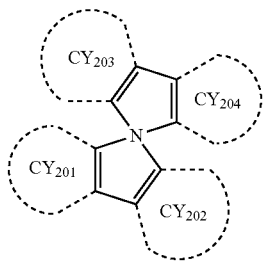

CY208

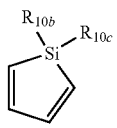

CY209

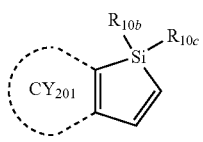

CY210

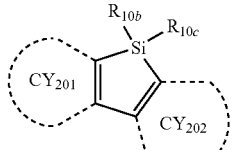

CY211

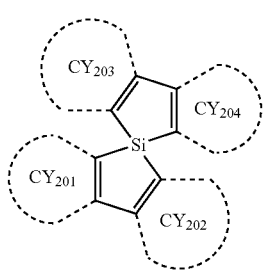

CY212

CY213
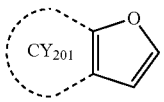

CY214
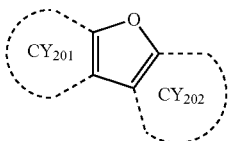

CY215

CY216
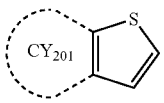

CY217
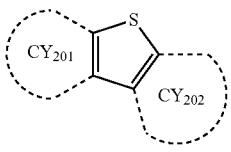

$R_{10b}$ and $R_{10c}$ in Formulae CY201 to CY217 are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include any of the groups represented by Formulae CY201 to CY203.

In one or more embodiments, each of Formulae 201 and 202 may not include any of the groups represented by Formulae CY201 to CY203, and may include at least one of the groups represented by Formulae CY204 to CY217.

In one or more embodiments, each of Formulae 201 and 202 may not include any of the groups represented by Formulae CY201 to CY217.

In an embodiment, the hole transport region may include one of Compounds HT1 to HT46, m-MTDATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
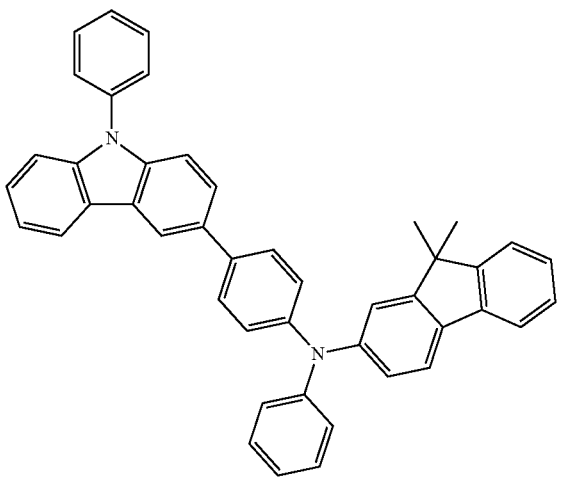

HT2
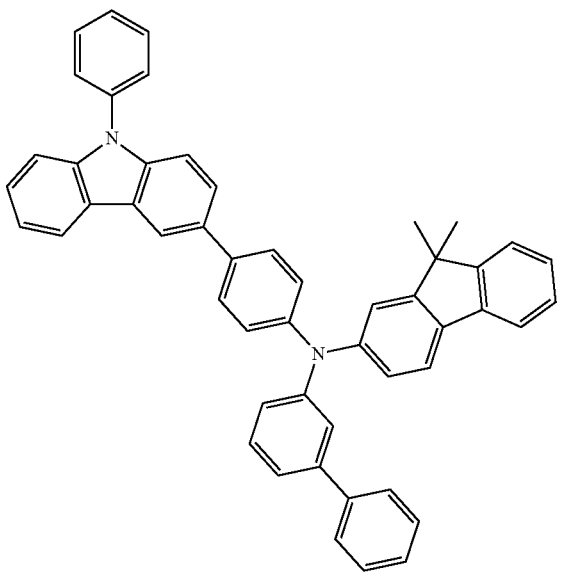

HT3
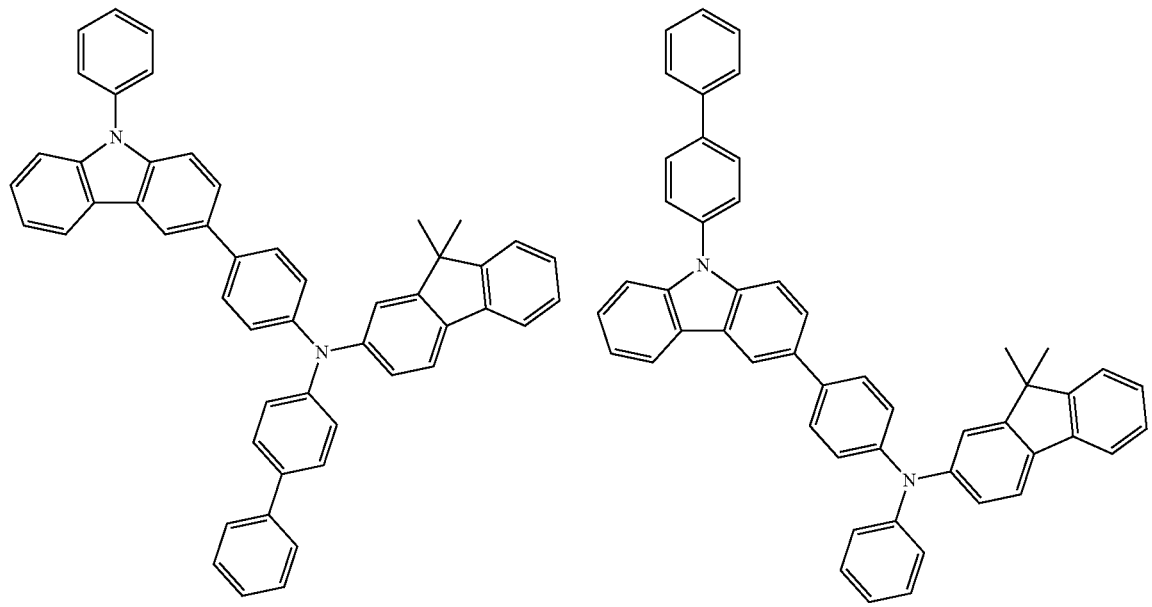
HT4
HT5
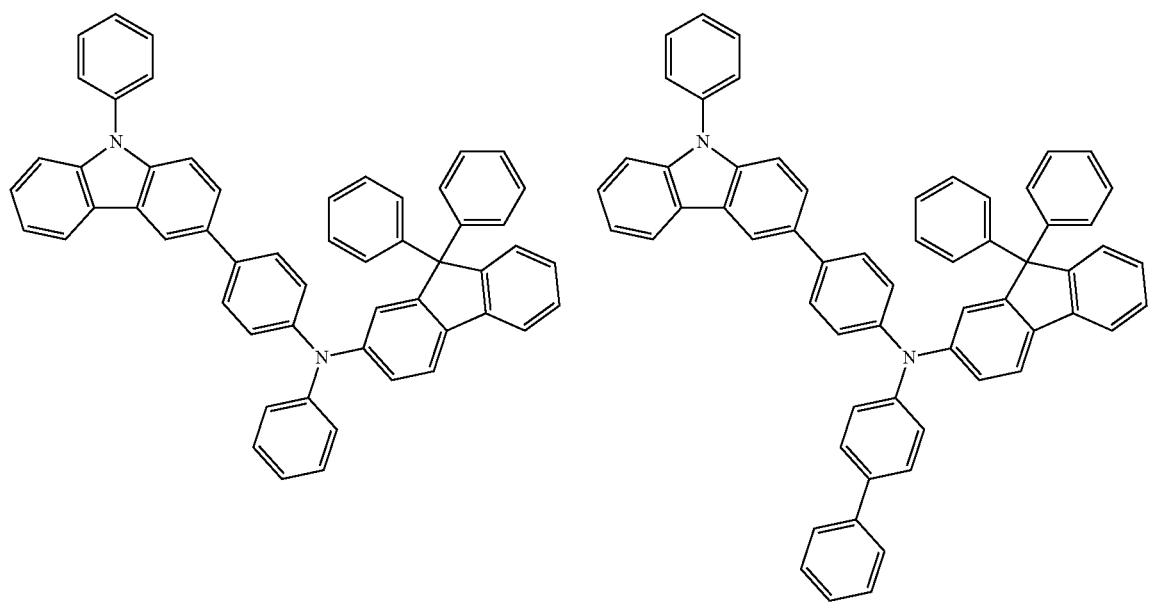
HT6

-continued
HT7
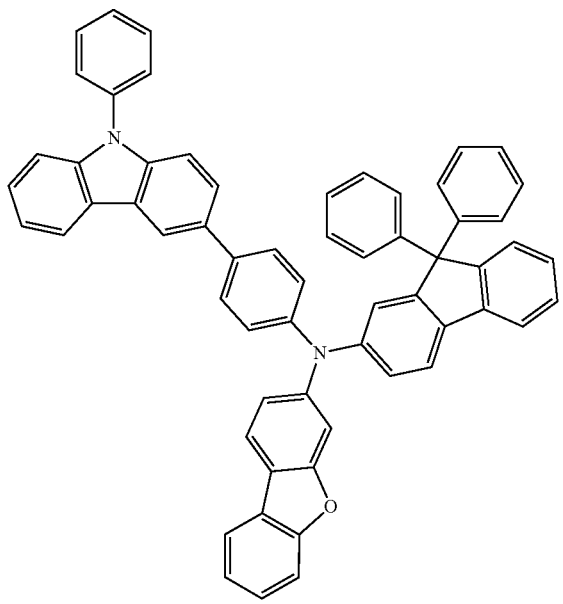
HT8
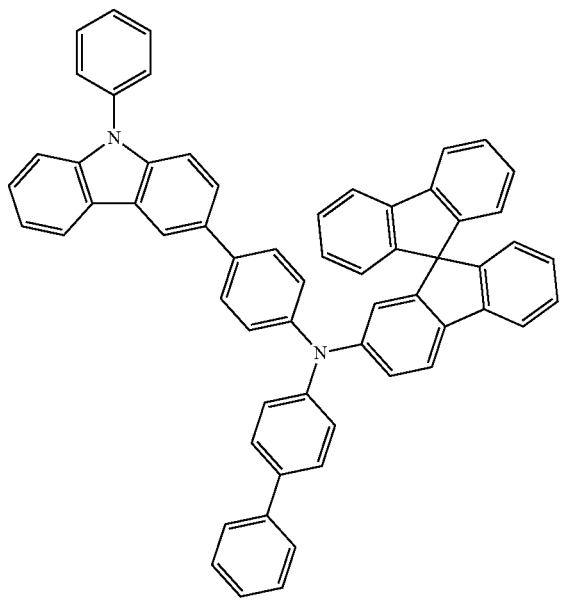
HT9
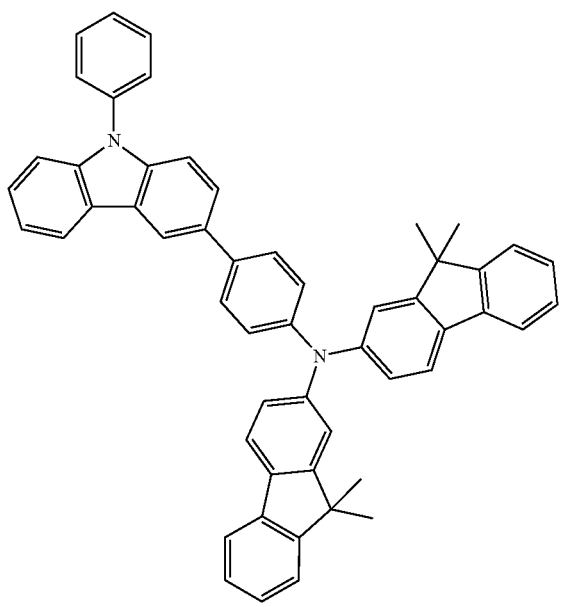
HT10
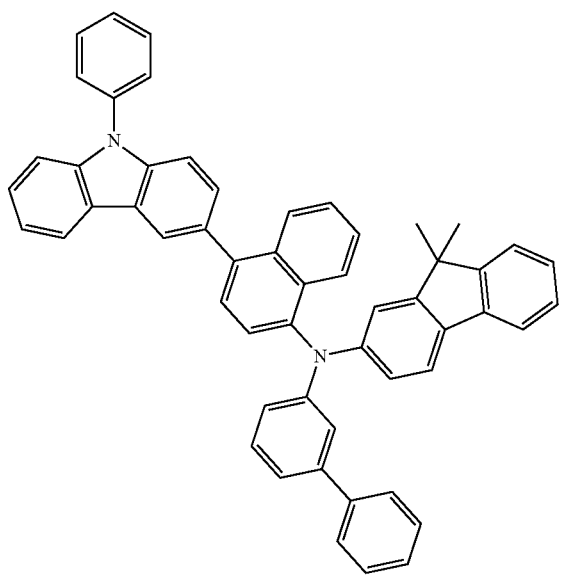

-continued
HT11
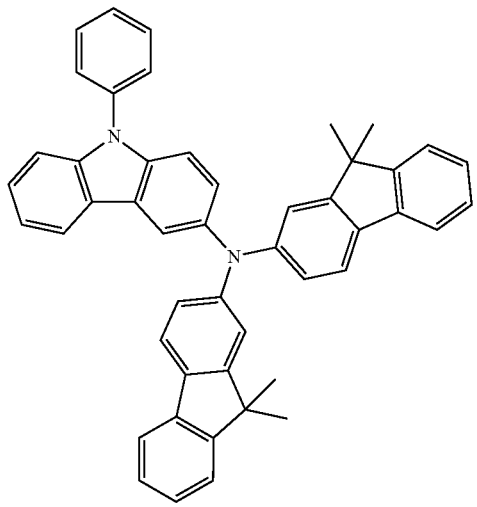
HT12
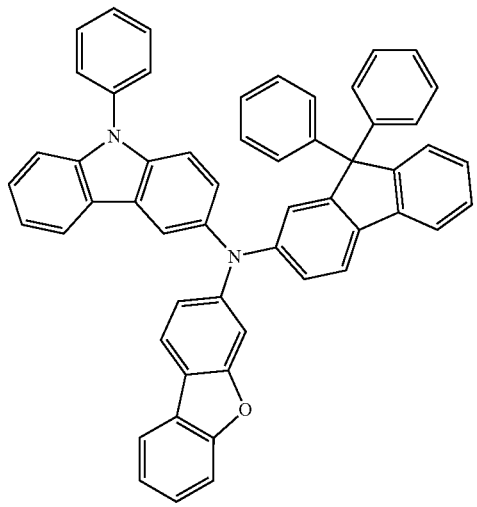
HT13
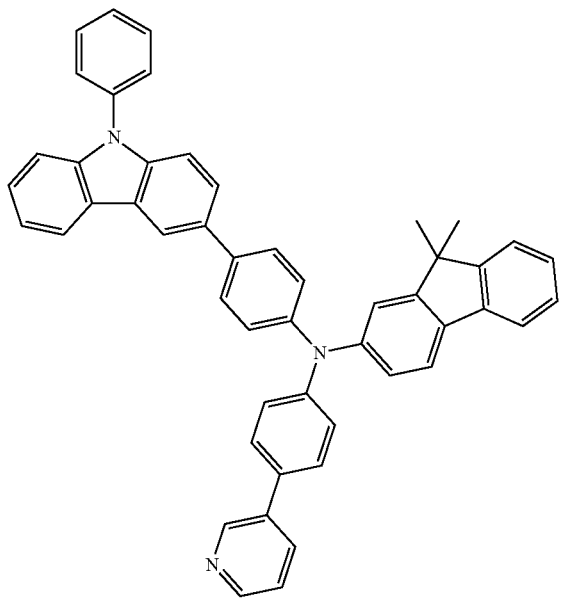
HT14
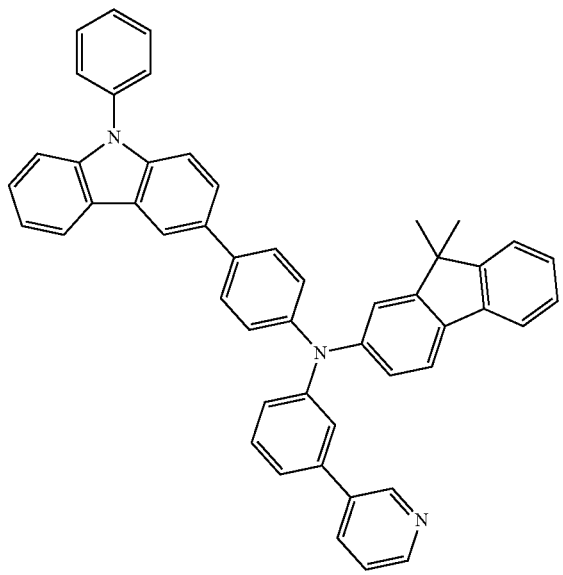
HT15
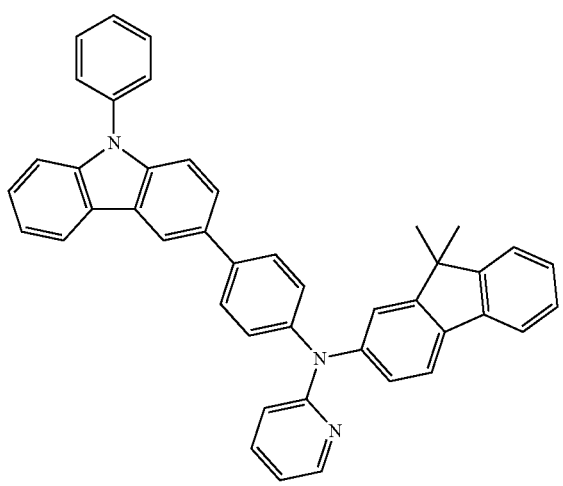
HT16
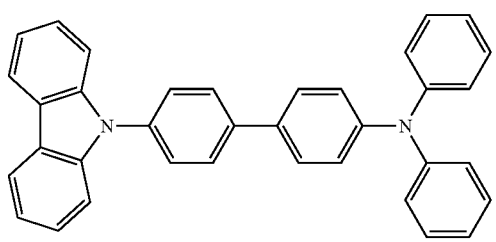

-continued
HT17
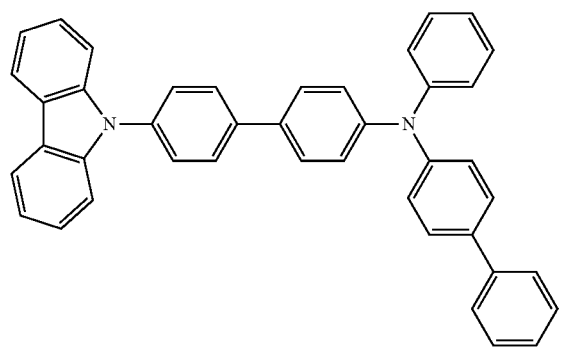
HT18
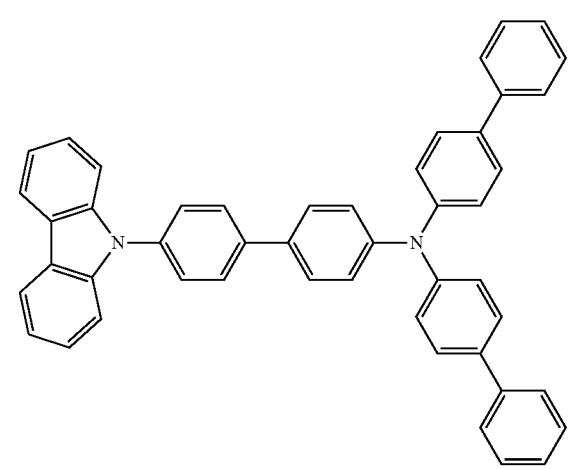
HT19
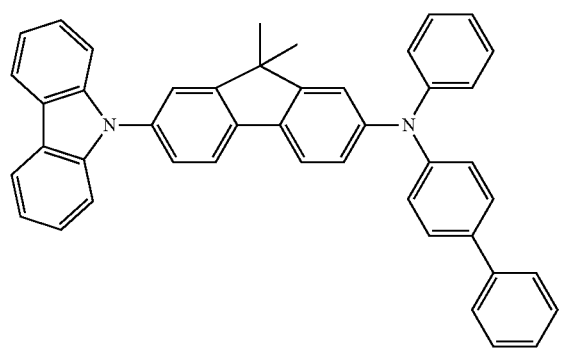
HT20
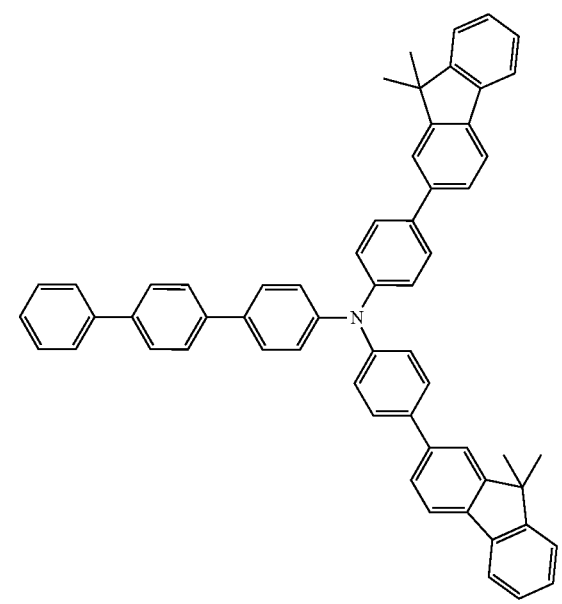

HT21
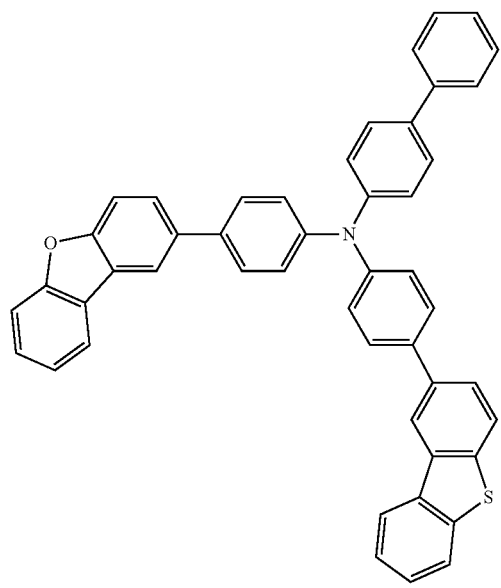
HT22
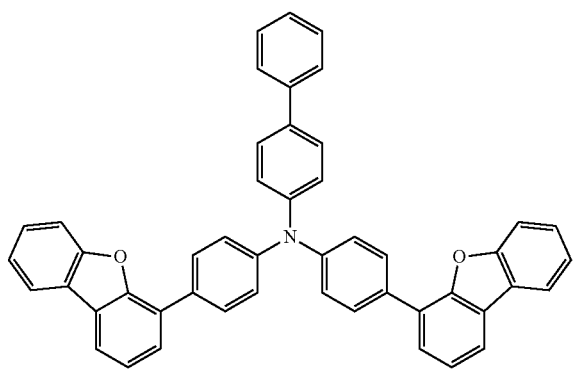
HT23
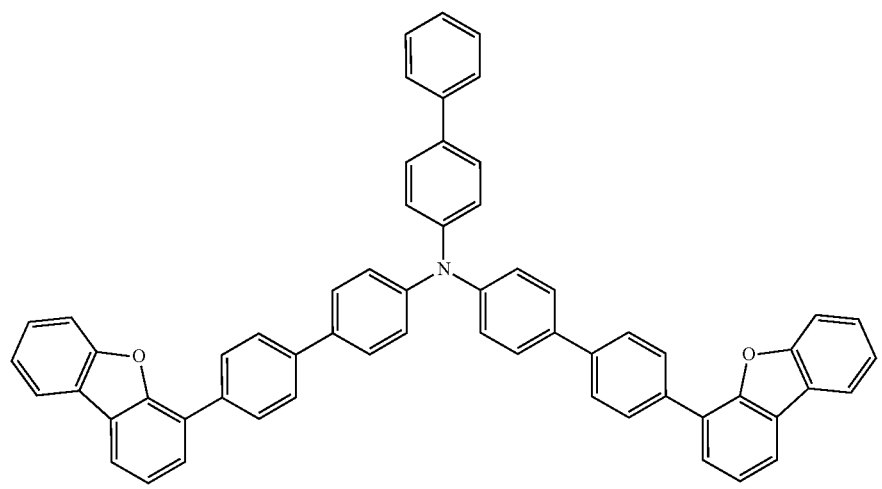
HT24
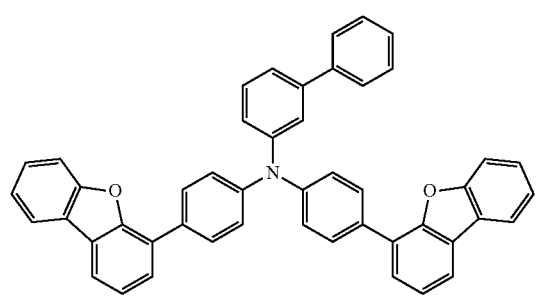
HT25
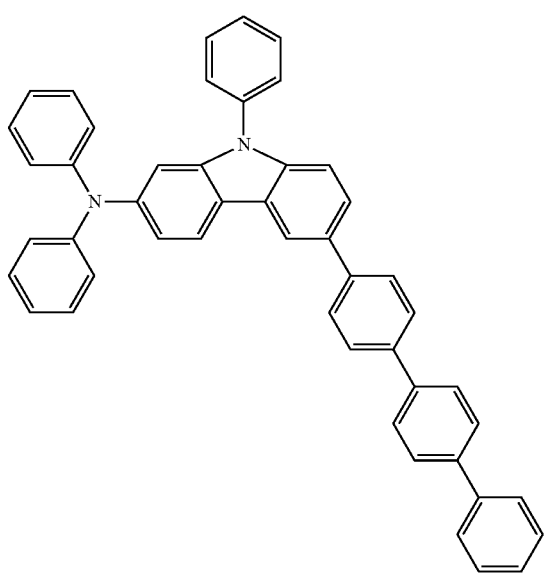

-continued
HT26
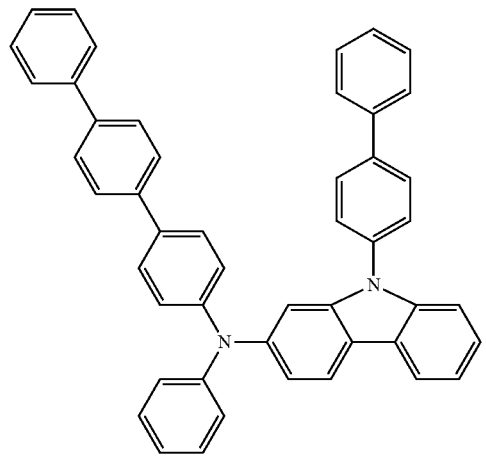
HT27
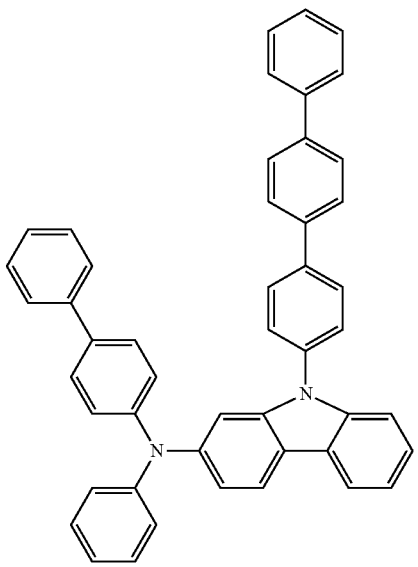
HT28
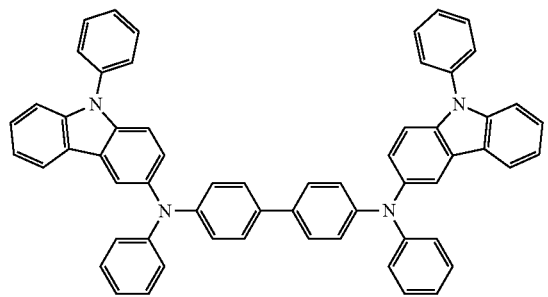
HT29
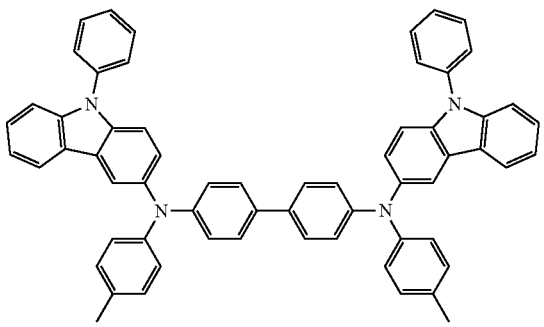
HT30
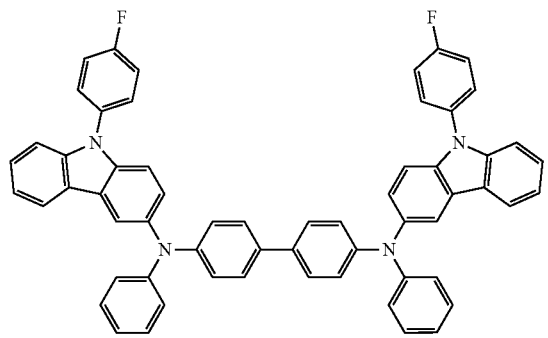
HT31
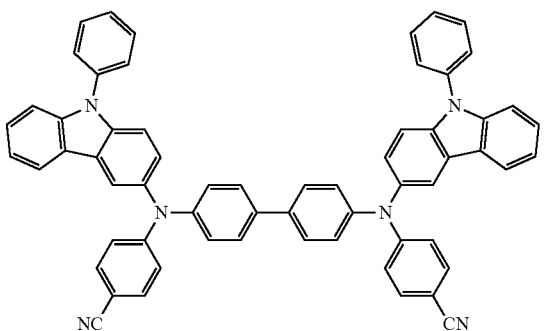

HT32
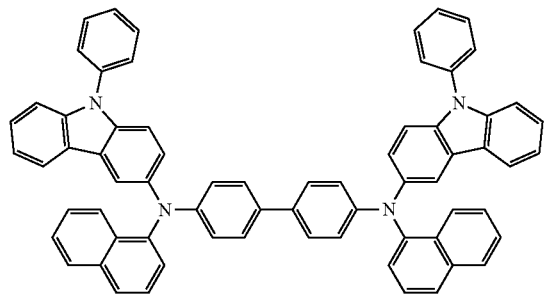
HT33
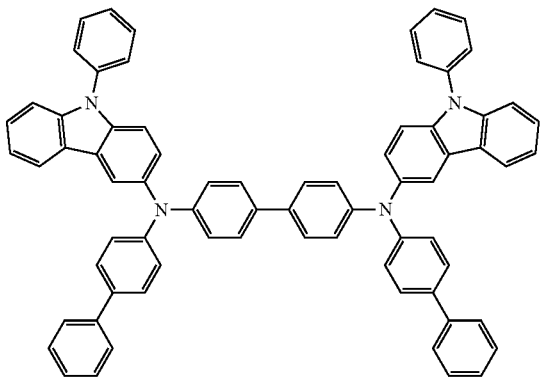
HT34
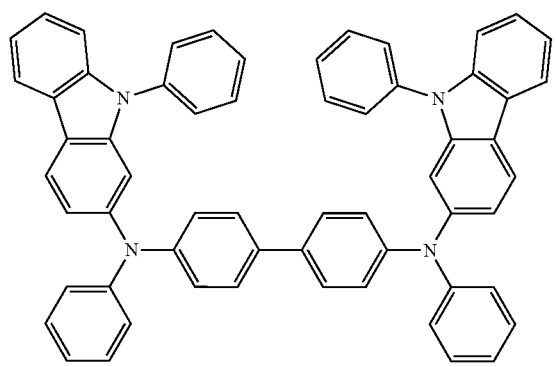
HT35
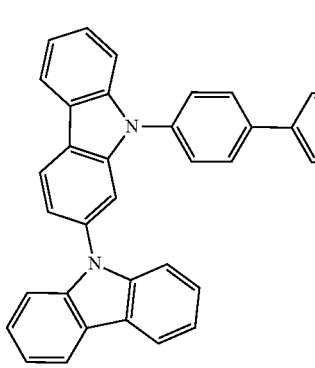
HT36
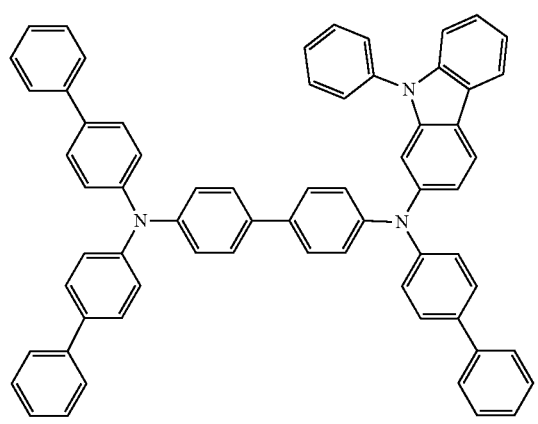
HT37
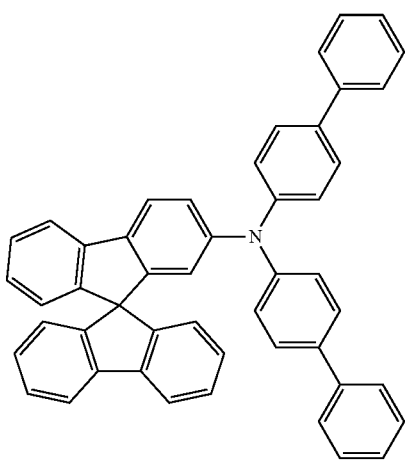

-continued
HT38
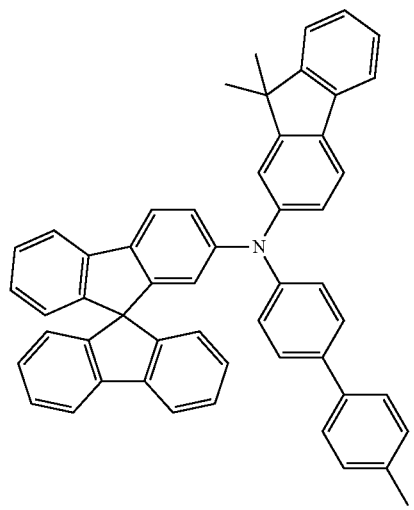
HT39
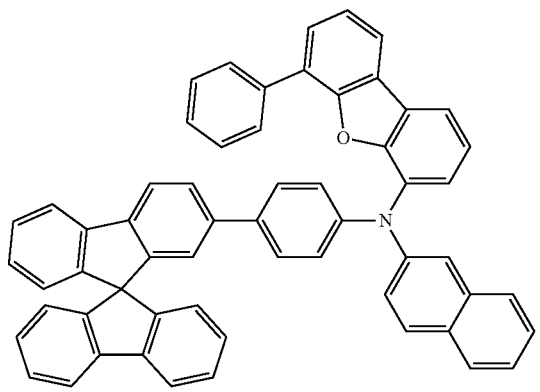
HT40
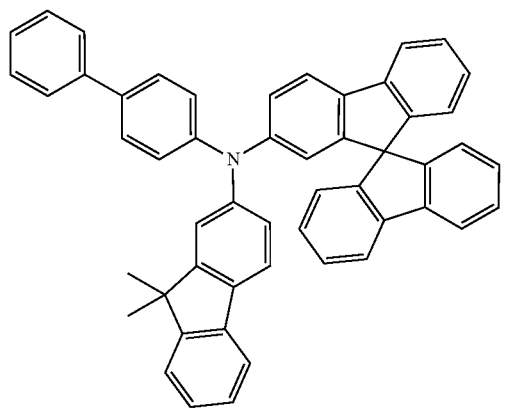
HT41
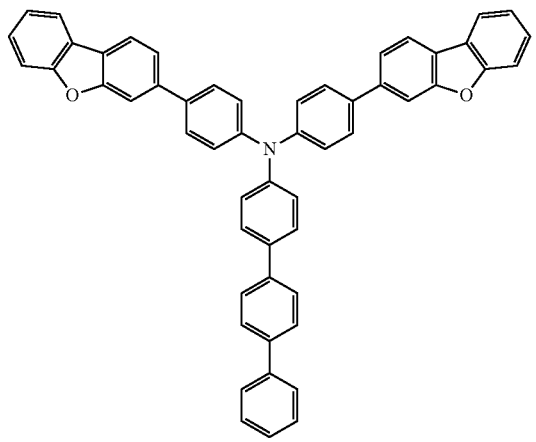
HT42
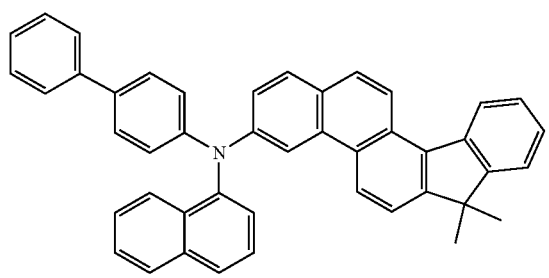
HT43
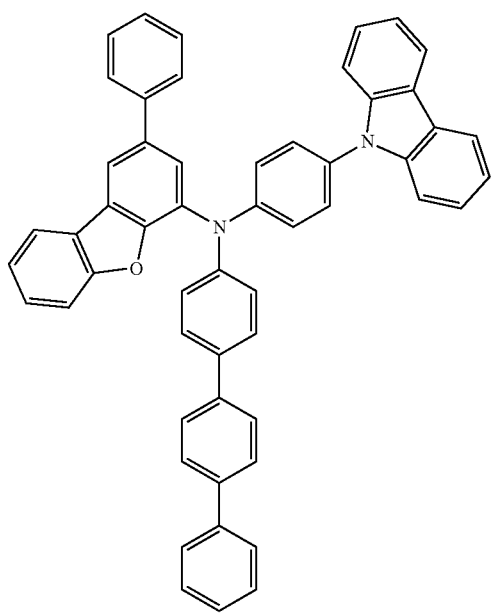

HT44
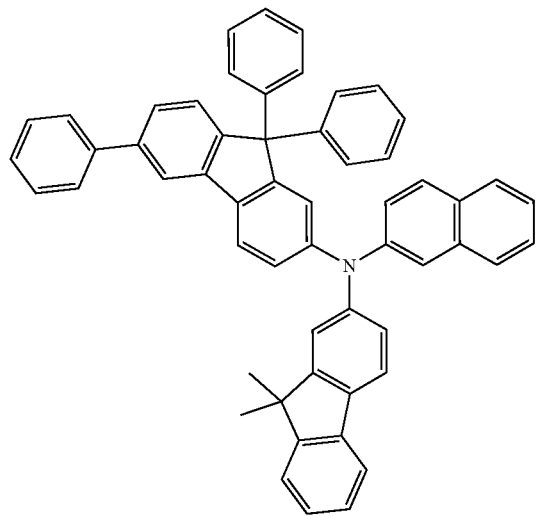
HT45
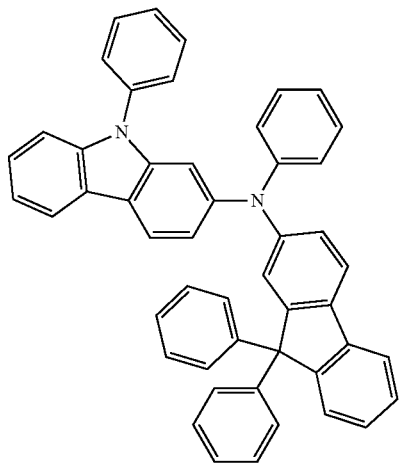
HT46
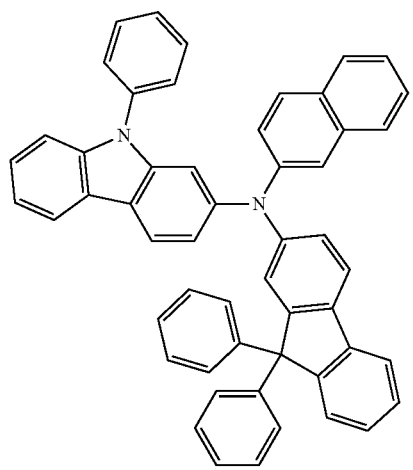
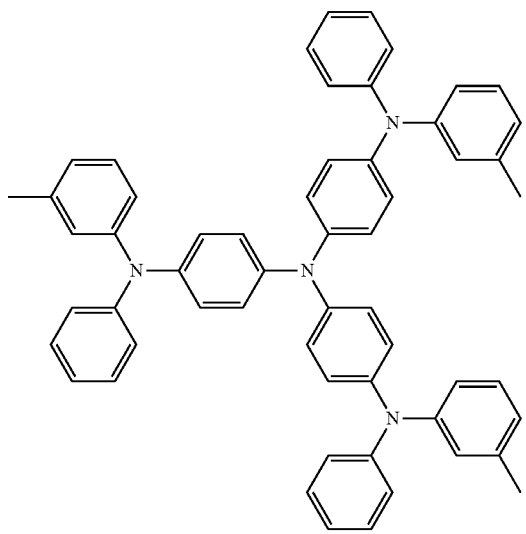
m-MTDATA

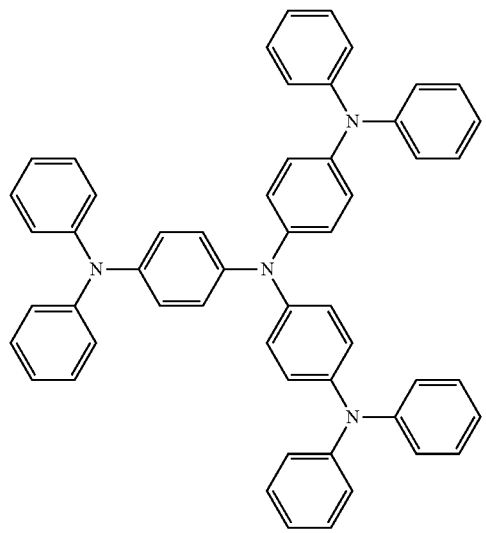
TDATA
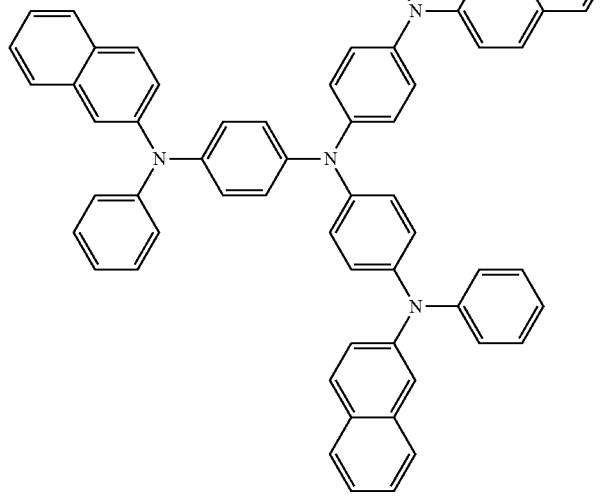
2-TNATA
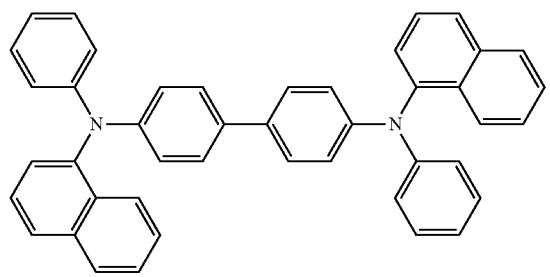
NPB
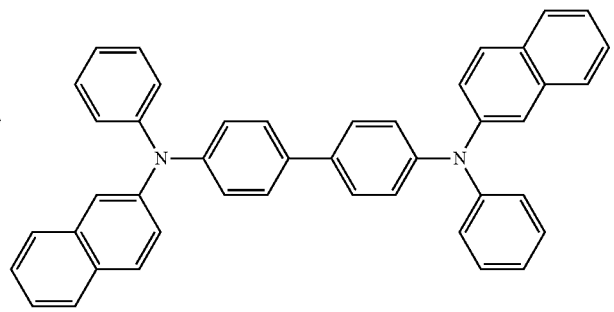
β-NPB
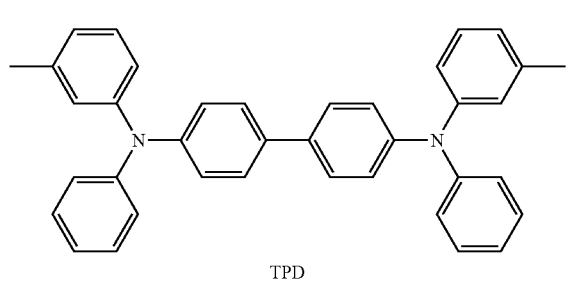
TPD
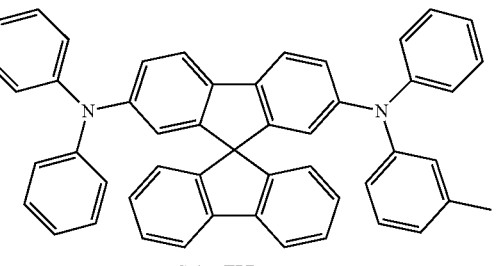
Spiro-TPD
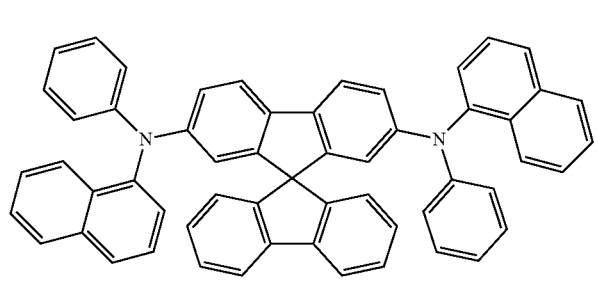
Spiro-NPD
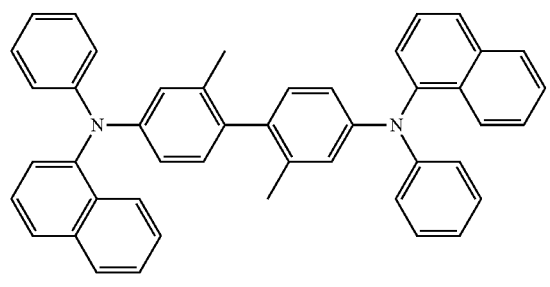
methylated-NPB

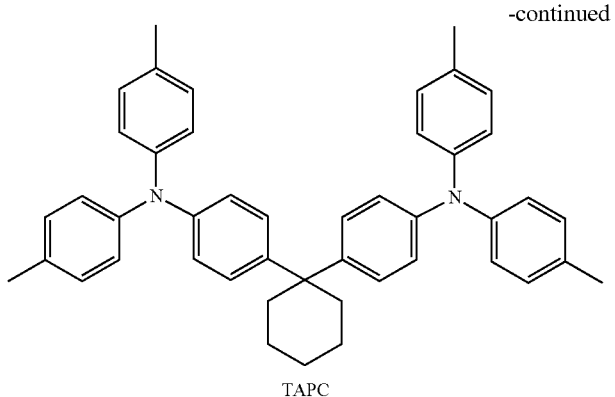

TAPC

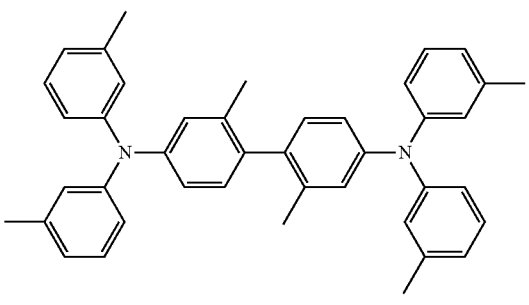

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the flow (e.g., leakage) of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound containing element EL1 and element EL2 (to be described in more detail below), or any combination thereof.

Examples of the quinone derivative may include TCNQ, F4-TCNQ, etc.

Examples of the cyano group-containing compound may include HAT-CN, and a compound represented by Formula 221 below.

TCNQ

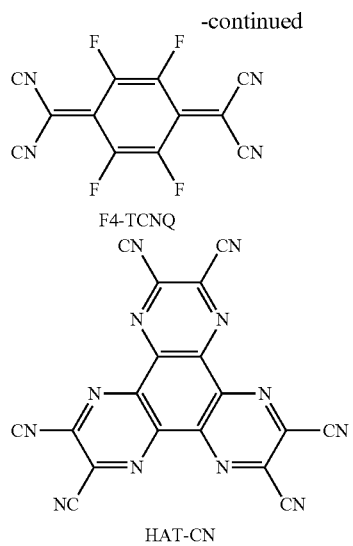

F4-TCNQ

HAT-CN

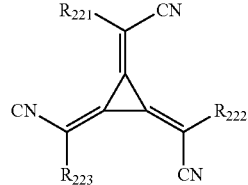

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In one or more embodiments, examples of the compound containing element EL1 and element EL2 may include a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide is antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 to about 15 parts by weight based on 100 parts by weight of the host.

In one or more embodiments, the emission layer may include a quantum dot.

In one or more embodiments, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, suitable (e.g., excellent) luminescence characteristics may be obtained without a substantial increase in driving voltage.

Host

In one or more embodiments, the host may include a compound represented by Formula 301 below:

Formula 301

In Formula 301,

Ar$_{301}$ and L$_{301}$ may each independently be a $C_3$-$C_{60}$ carbocyclic group unsubstituted or substituted with at least one R$_{10a}$ or a $C_1$-$C_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$ (to be described in more detail below).

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

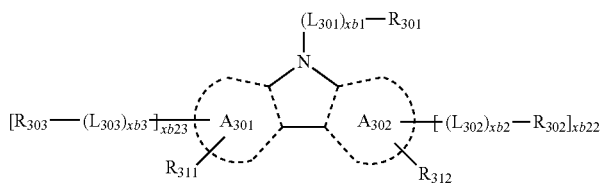

Formula 301-1

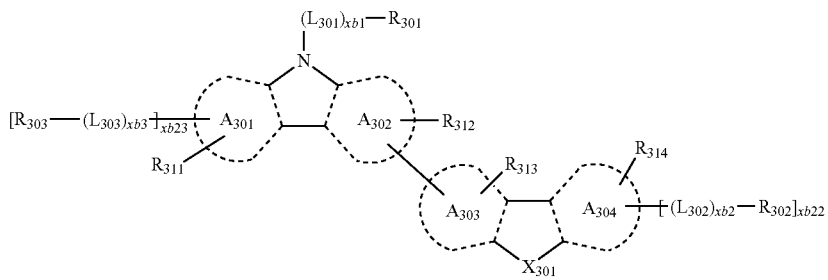

Formula 301-2

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as respectively described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkaline earth metal complex, a post-transition metal complex, or a combination thereof. In one or more embodiments, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

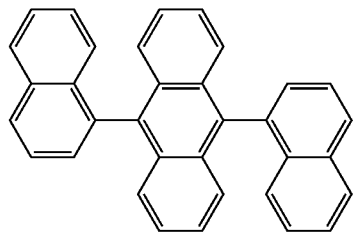

H1

-continued

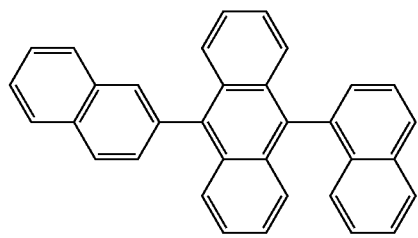

H2

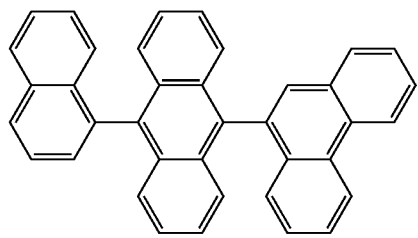

H3

-continued
H4
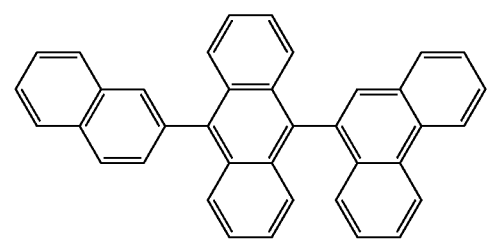
H5
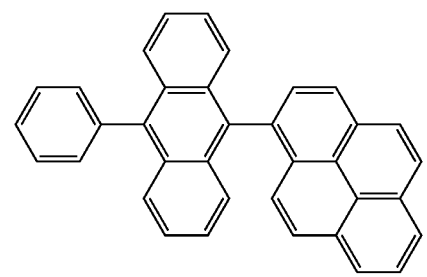
H6
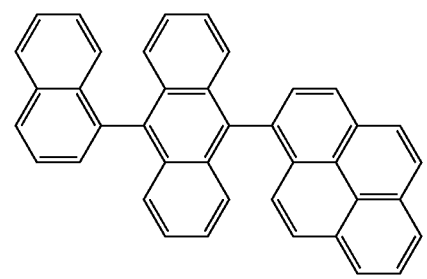
H7
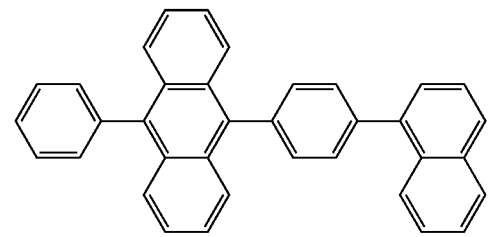
H8
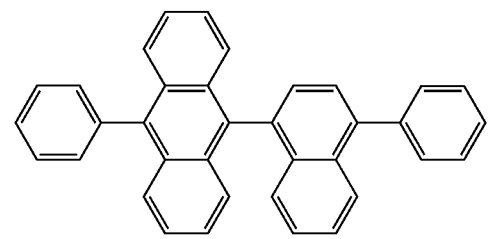
H9
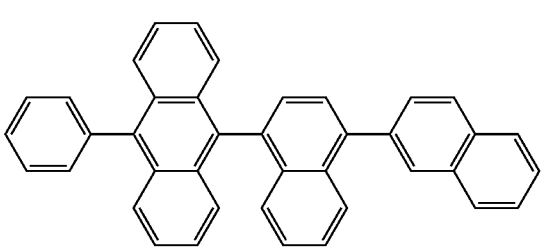
-continued
H10
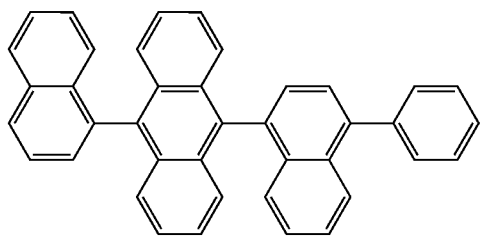
H11
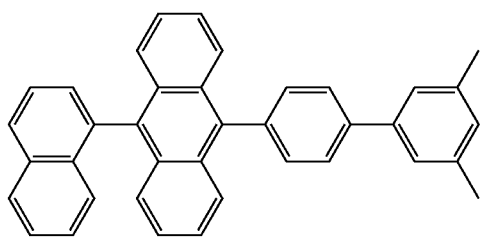
H12
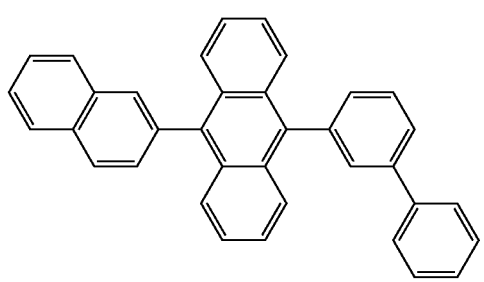
H13
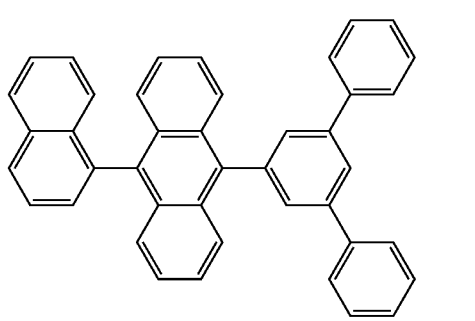
H14
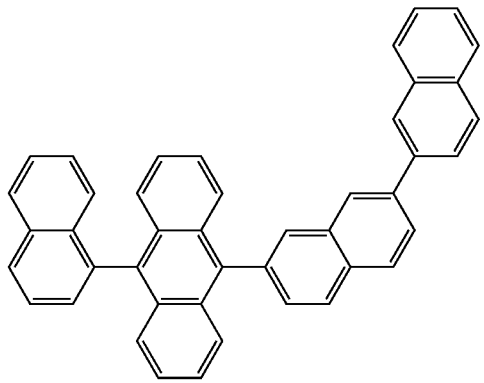

H15
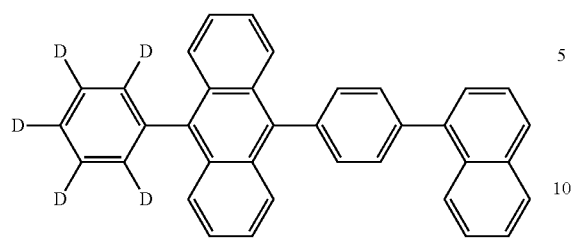
H16
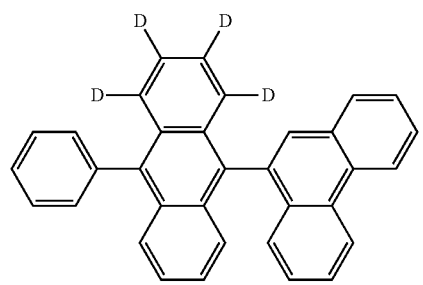
H17
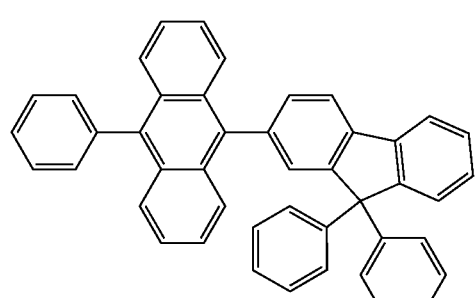
H18
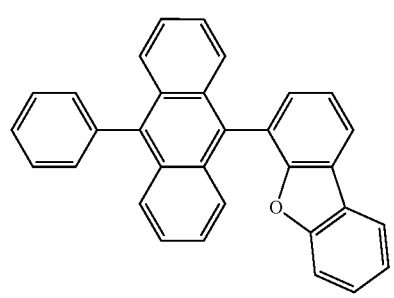
H19
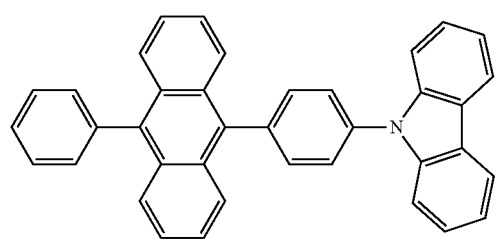
H20
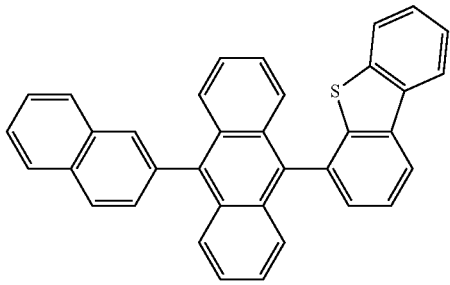
H21
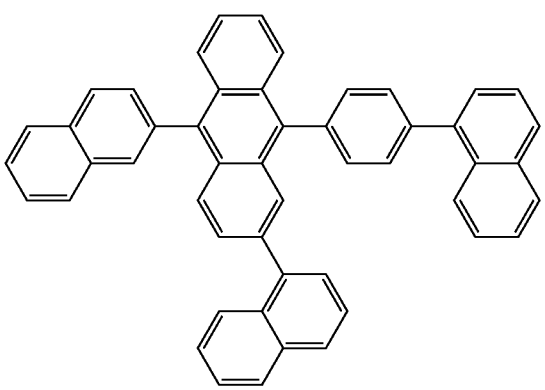
H22
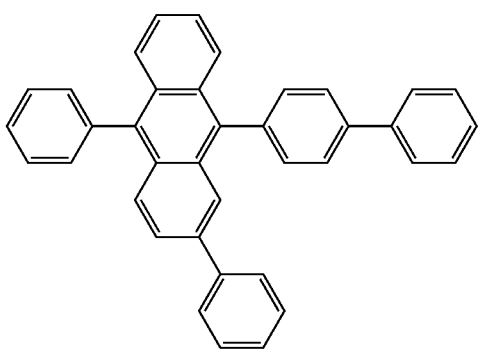
H23
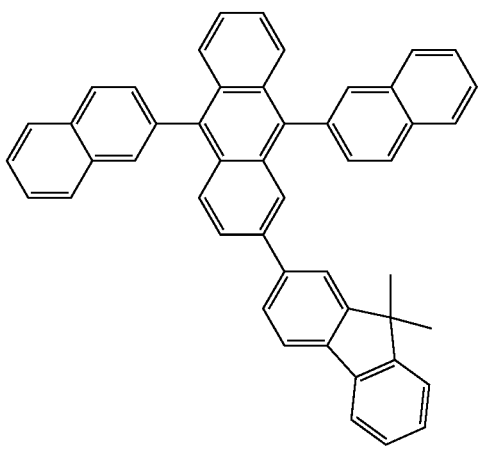

H24

H25

H26

H27

H28

H29

H30
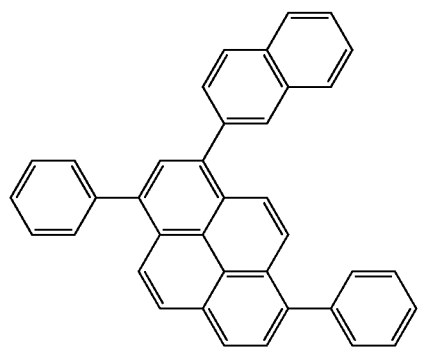
H31
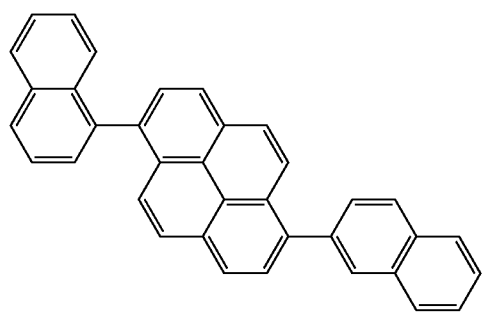
H32
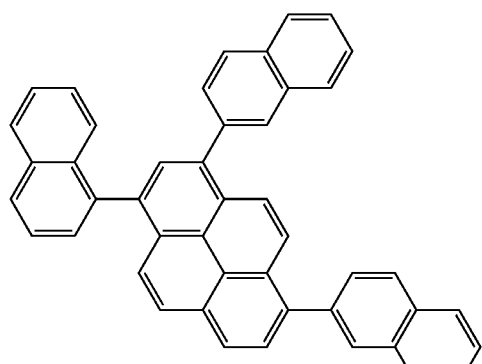
H33
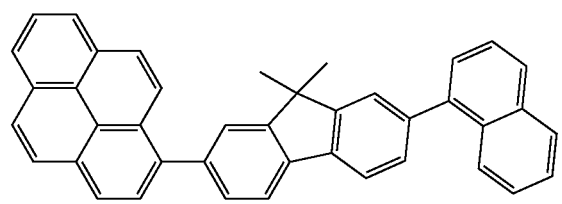
H34
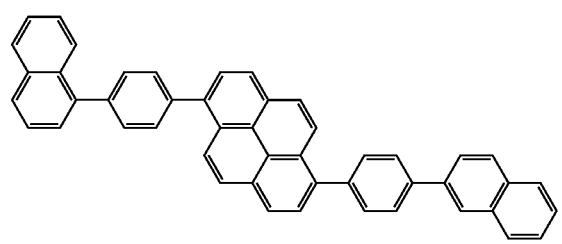
H35
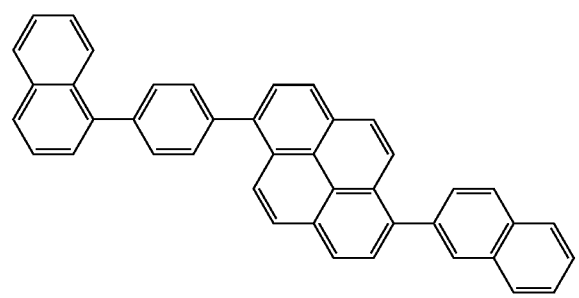
H36
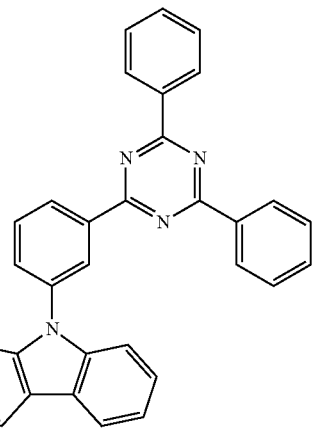
H37
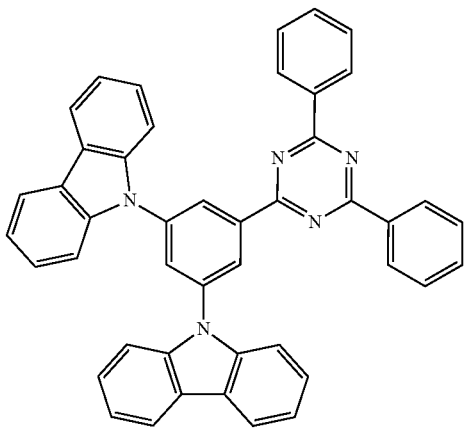
H38
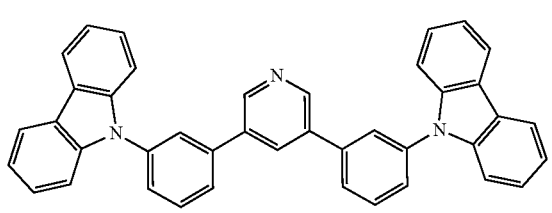

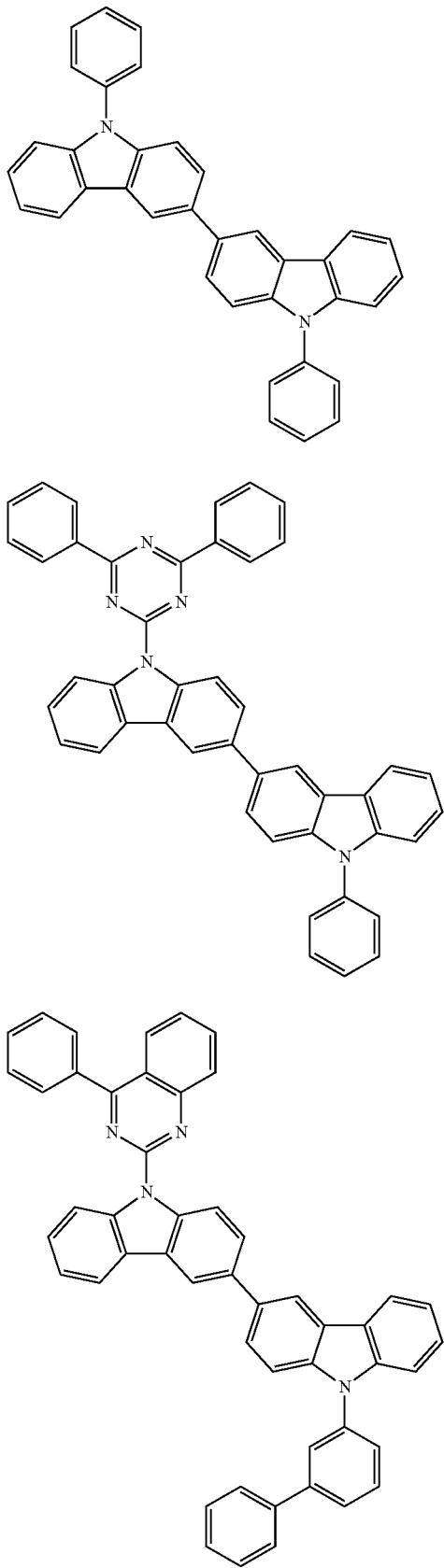
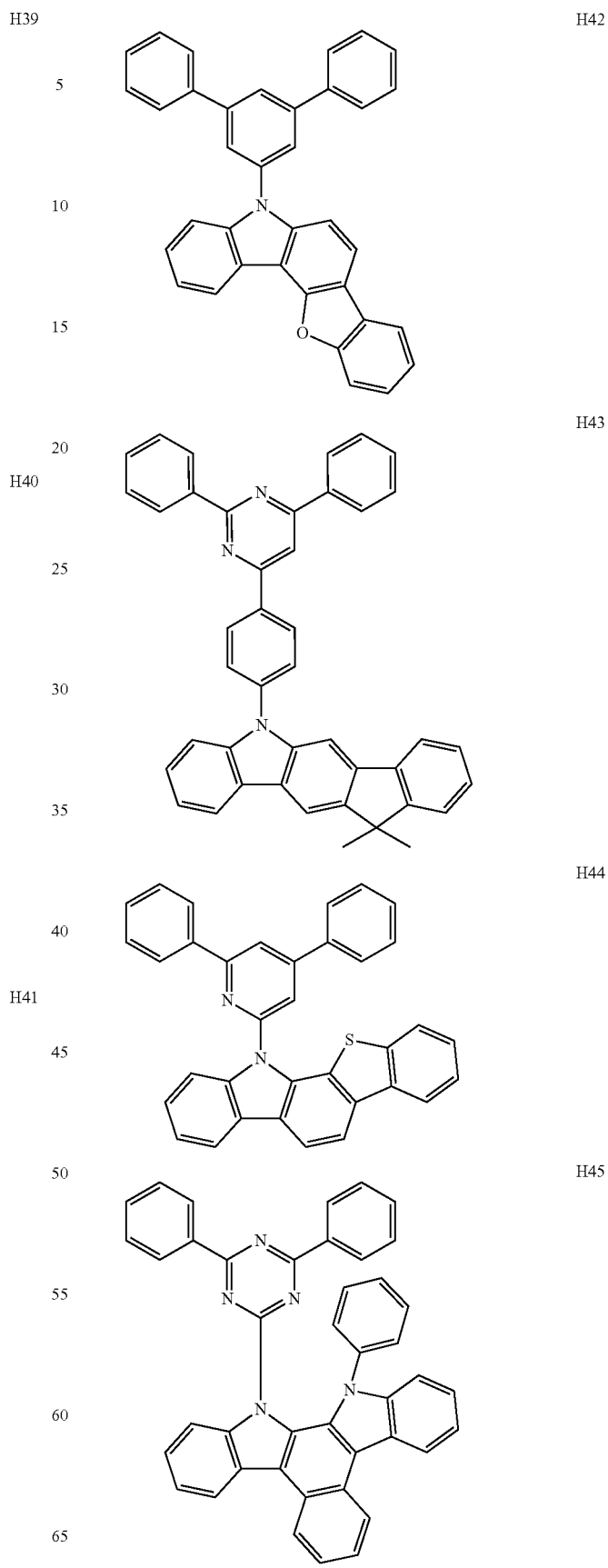

H46 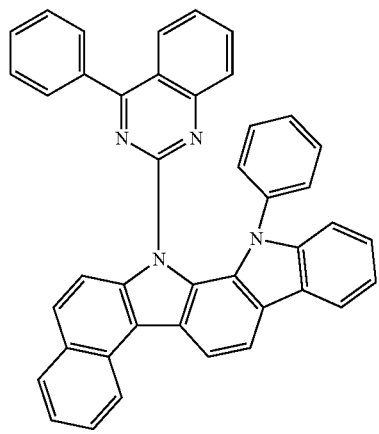
H47 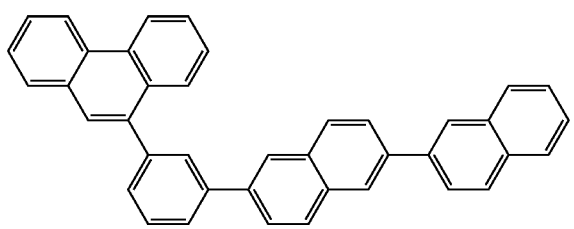
H48 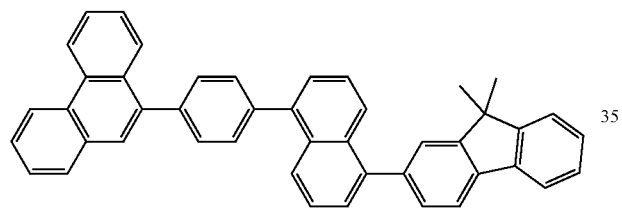
H49 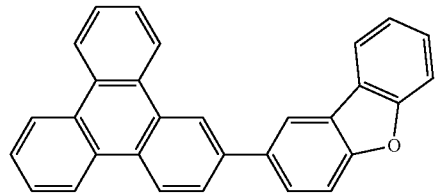
H50 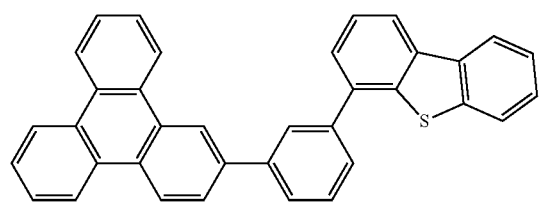
H51 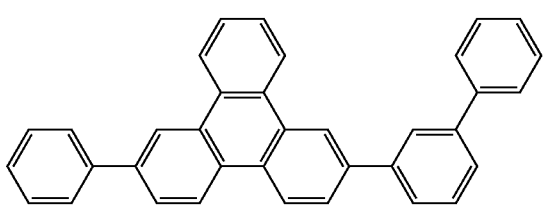
H52 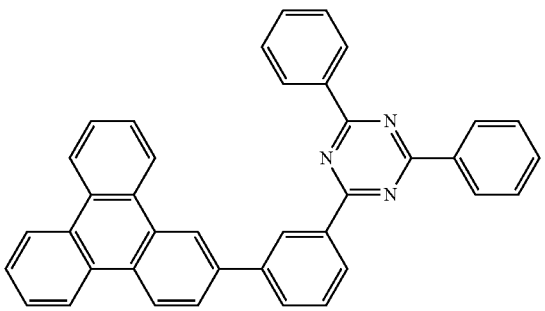
H53 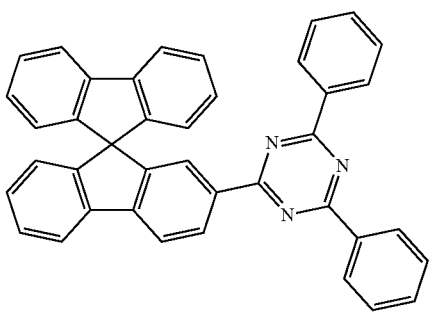
H54 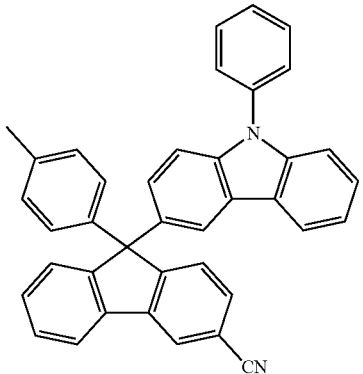
H55 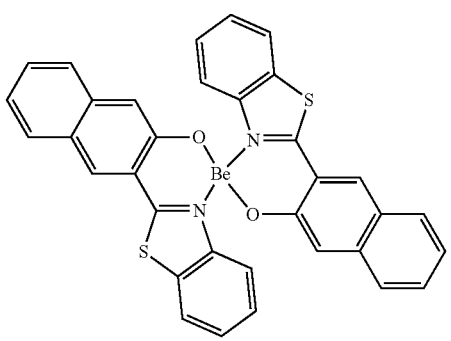

-continued
H56
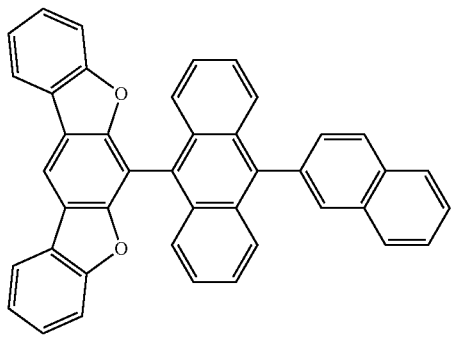
H57
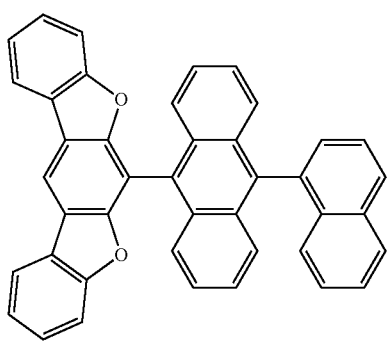
H58
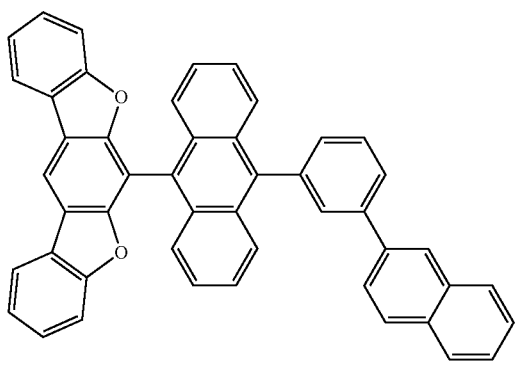
H59
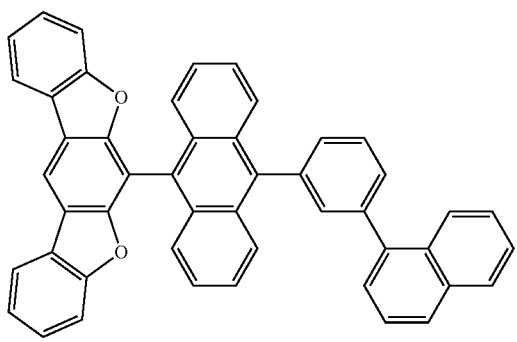
-continued
H60
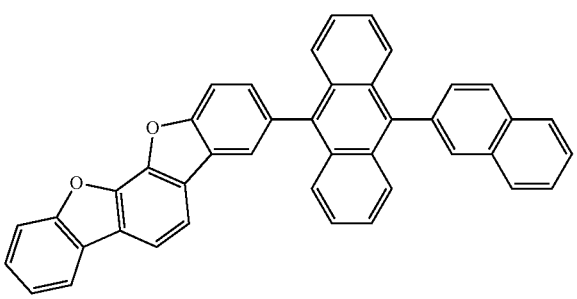
H61
H62
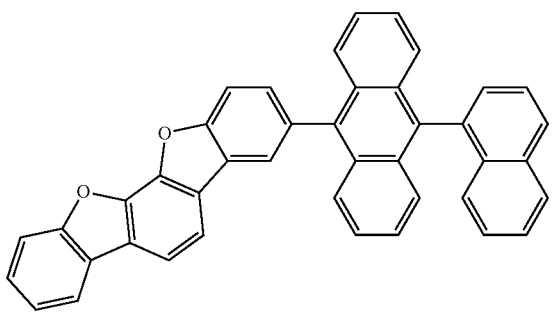
H63
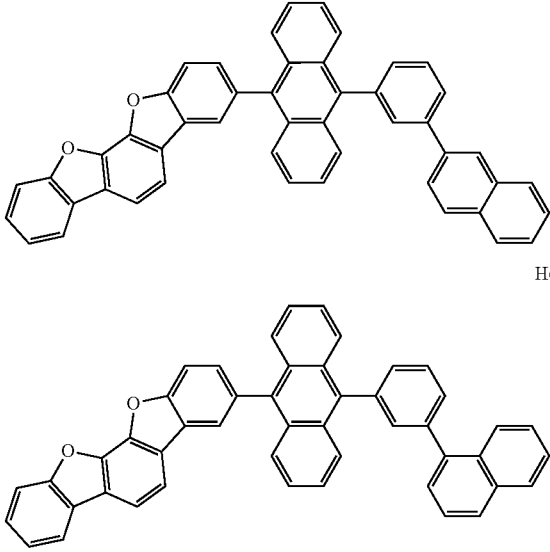
H64
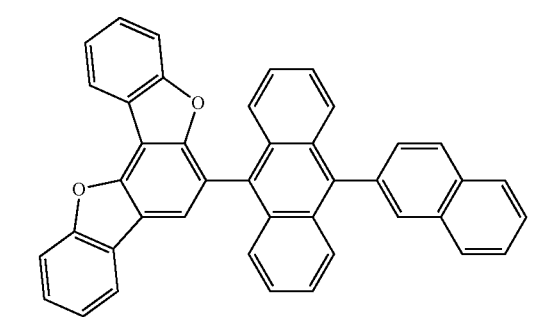

-continued
H65
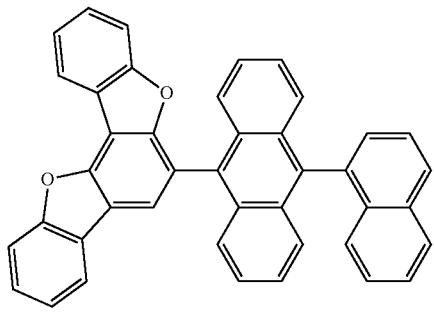
H66
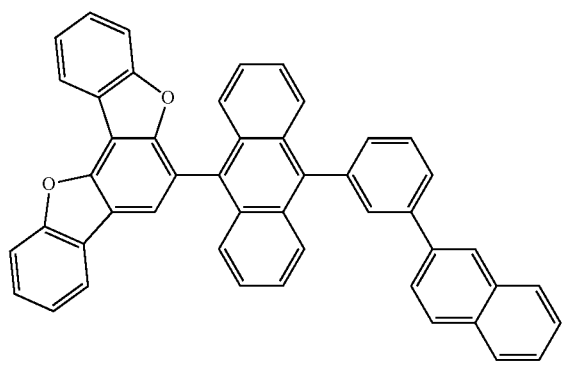
H67
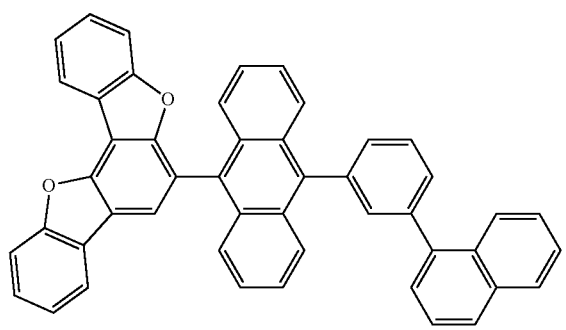
H68
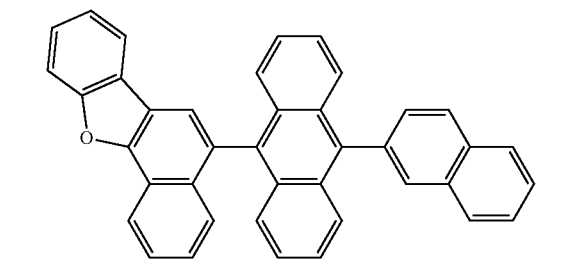
H69
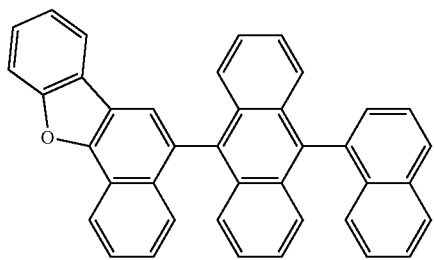
-continued
H70
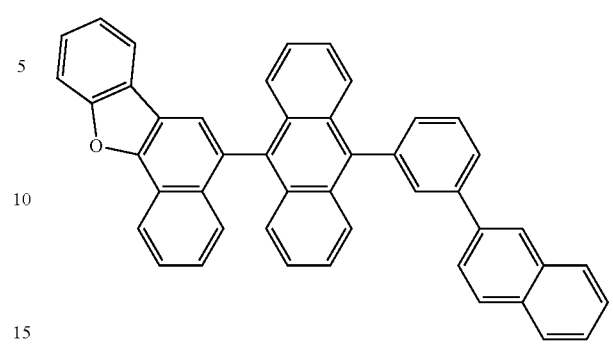
H71
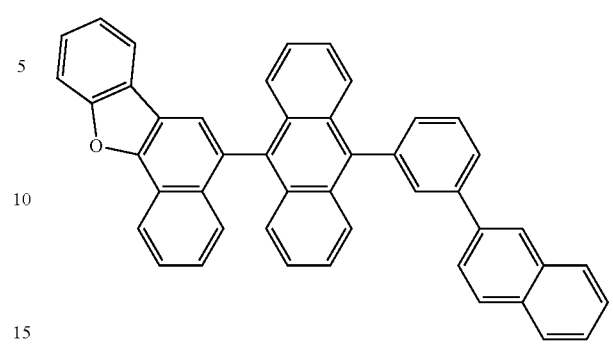
H72
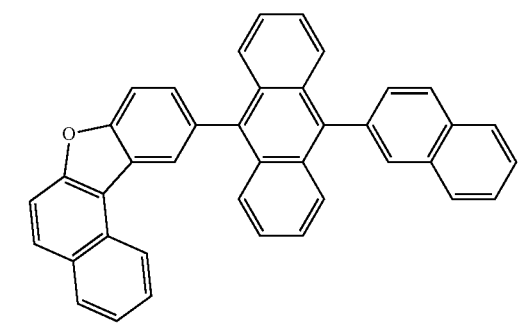
H73
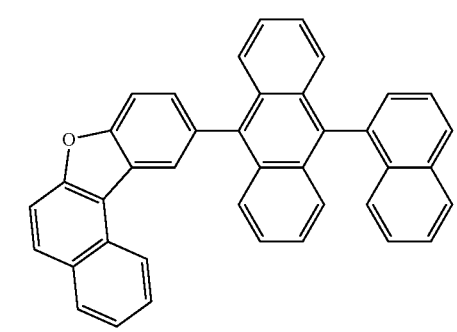

H74
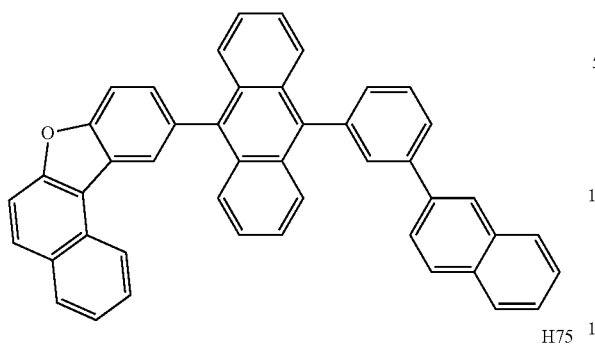
H75
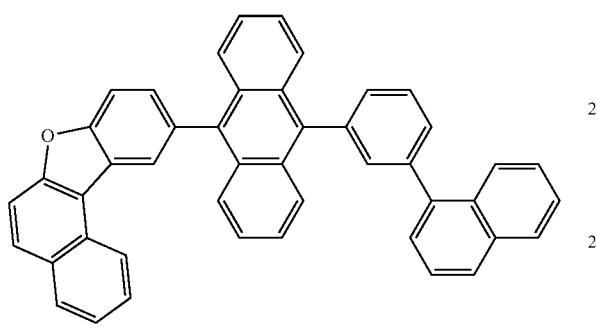
H76
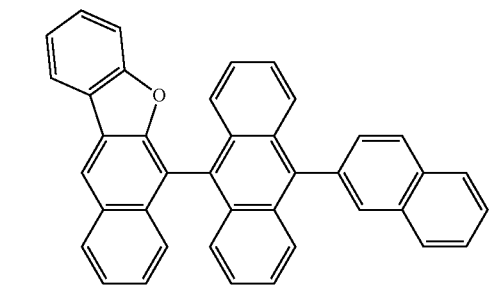
H77
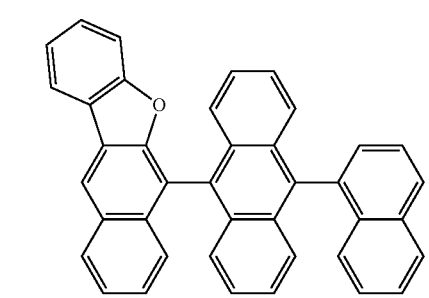
H78
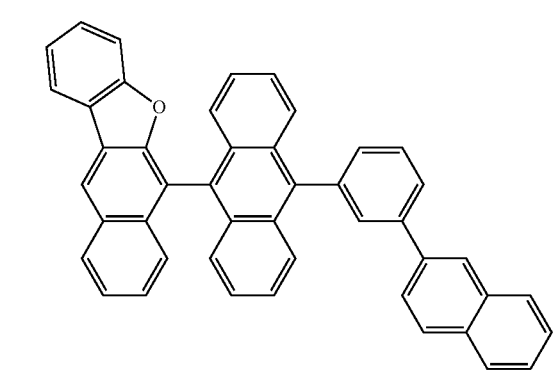
H79
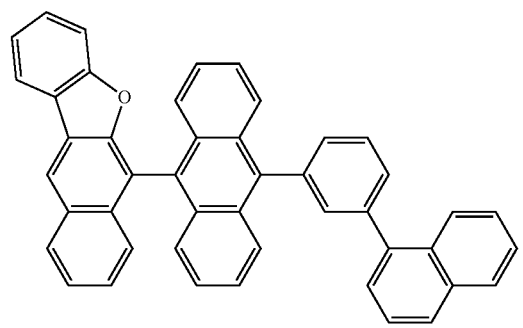
H80
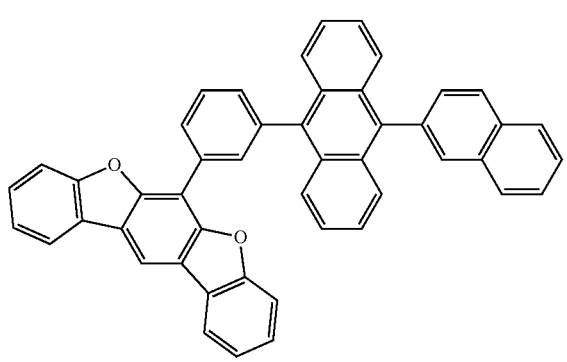
H81
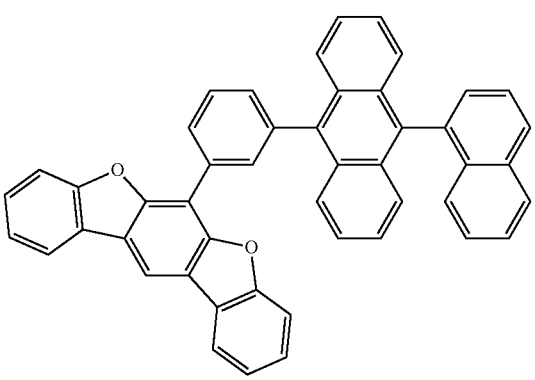
H82
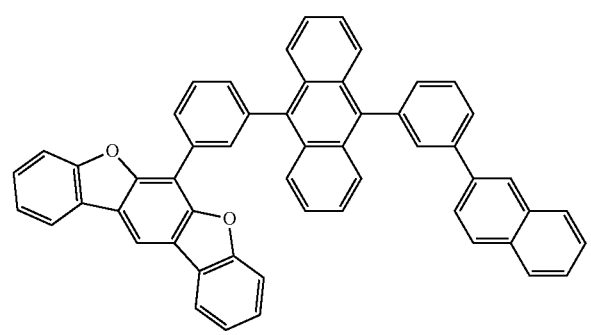

H83
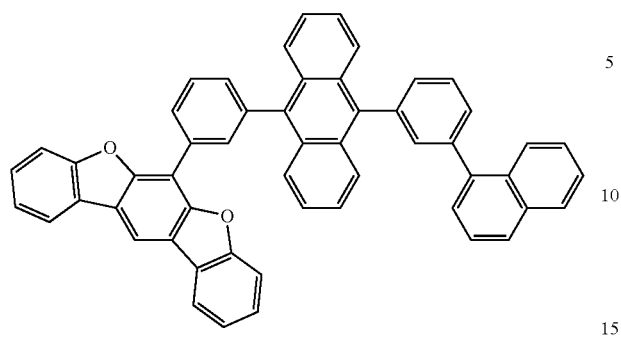
H84
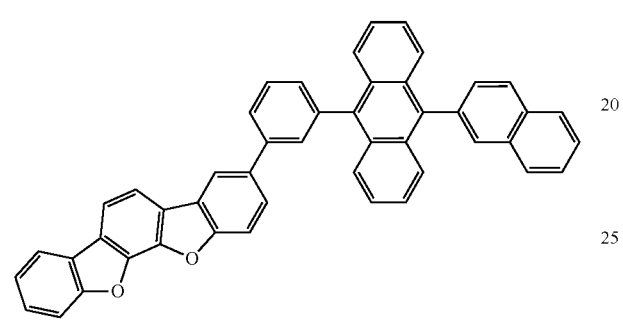
H85
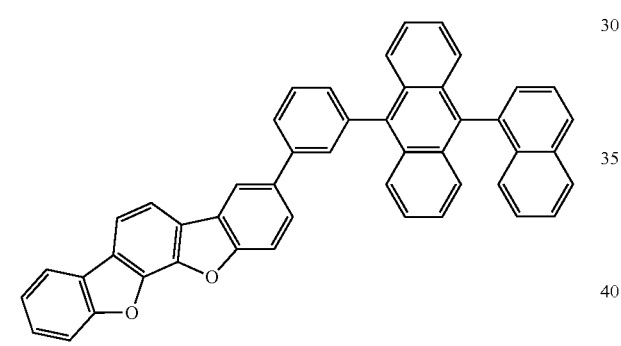
H86
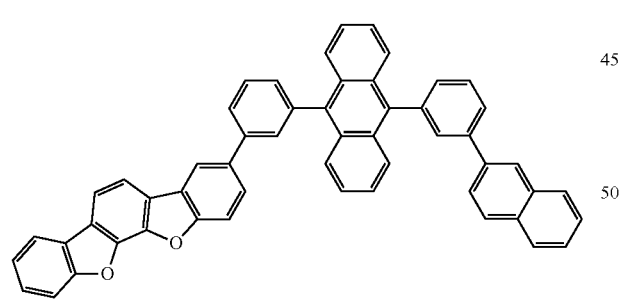
H87
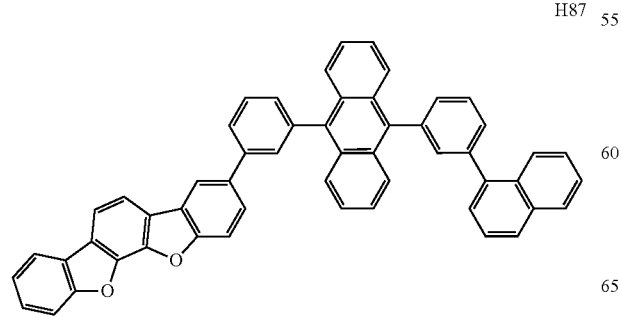
H88
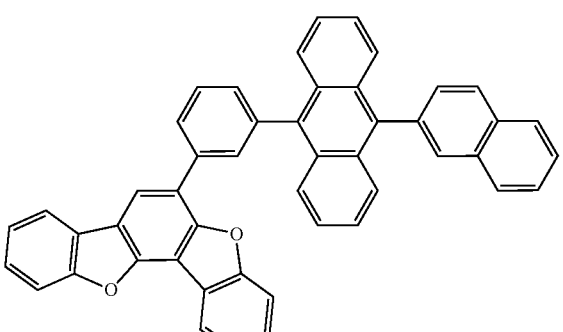
H89
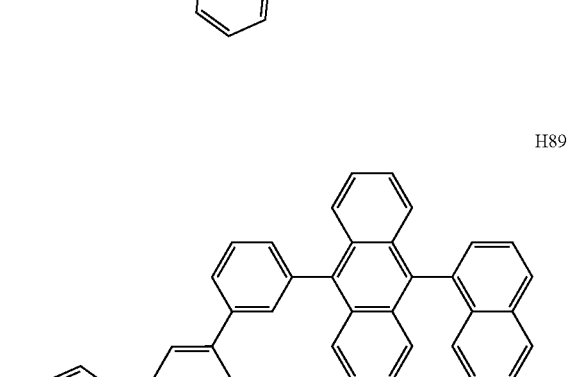
H90
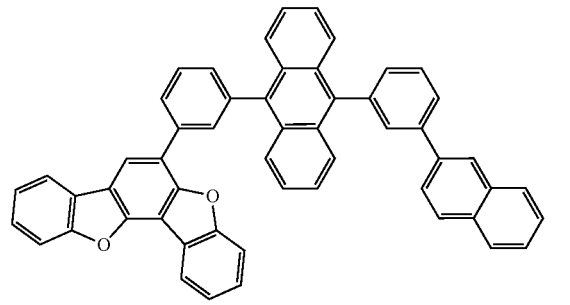
H91
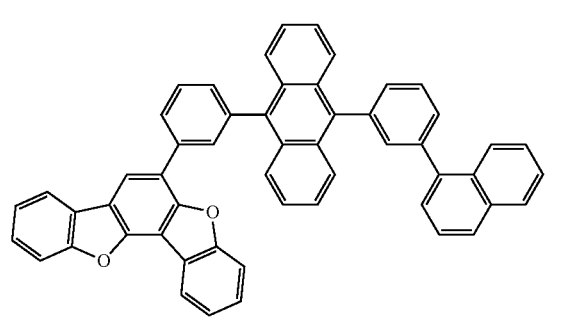

H92
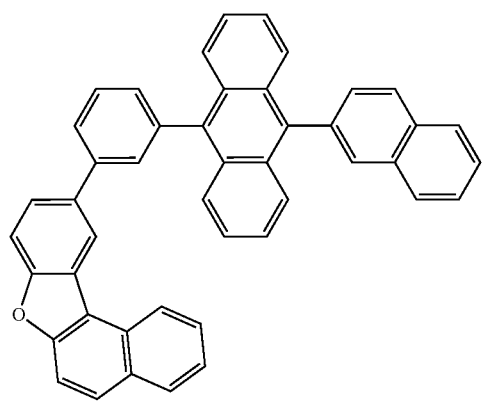
H93
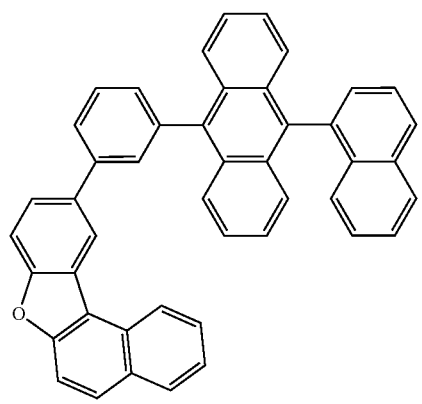
H94
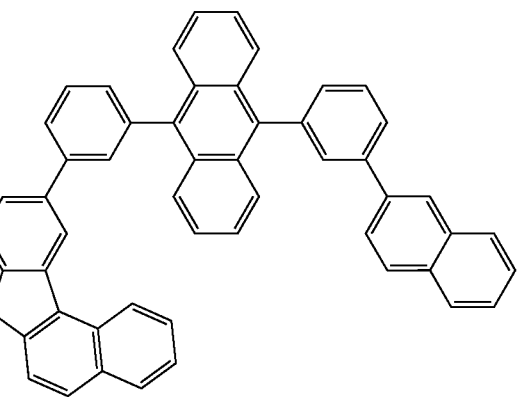
H95
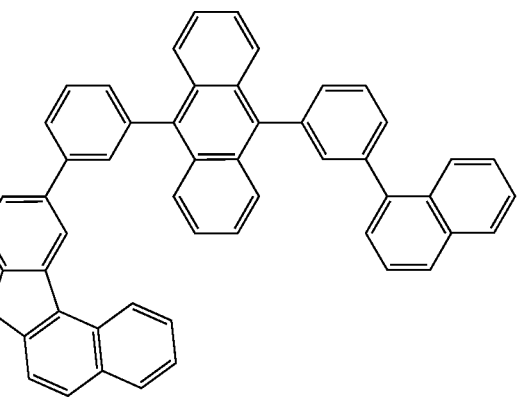
H96
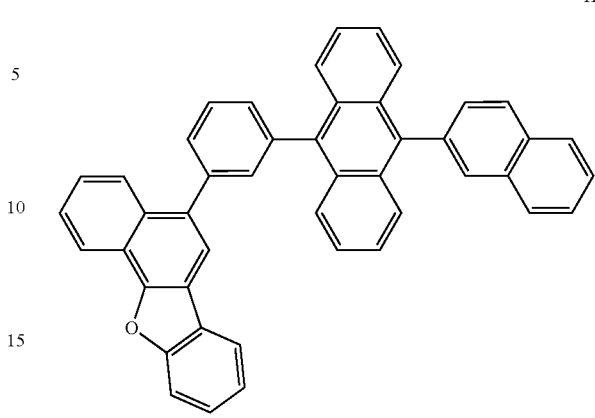
H97
H98
H99

-continued
H100
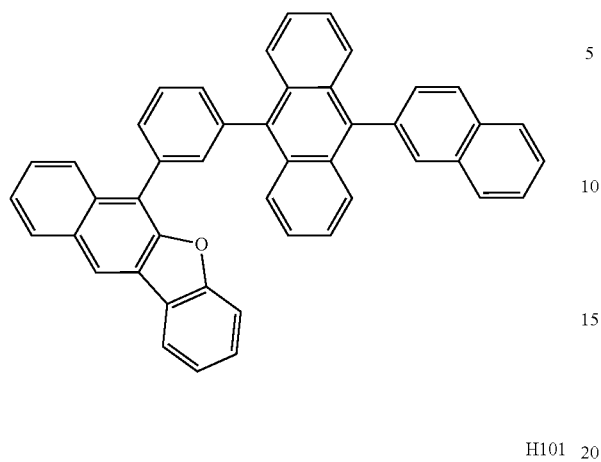
H101
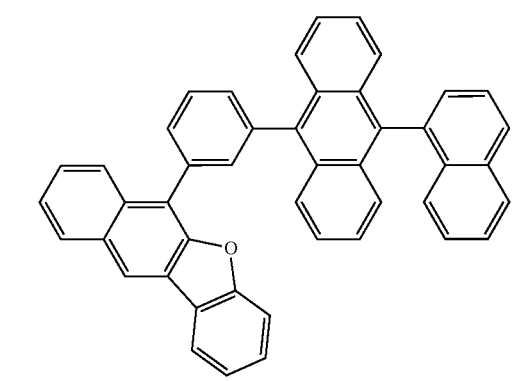
H102
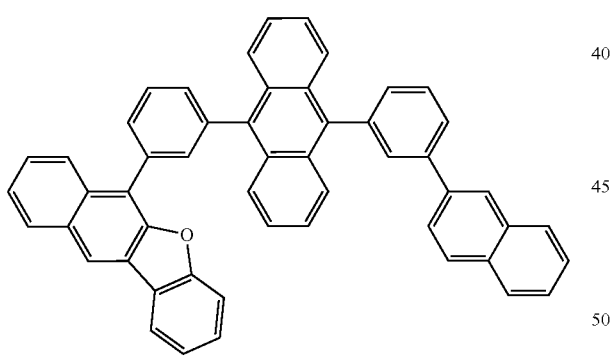
H103
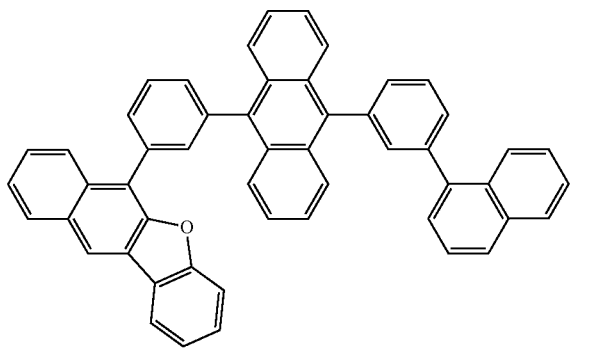
-continued
H104
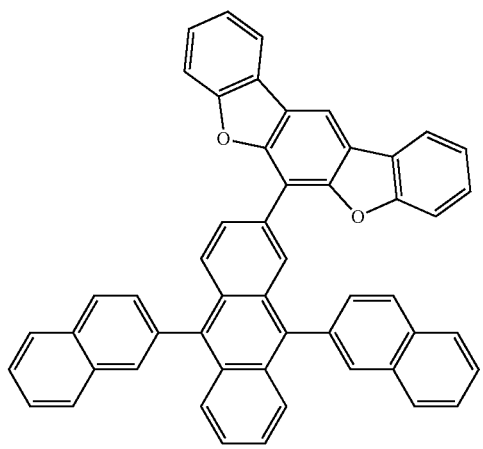
H105
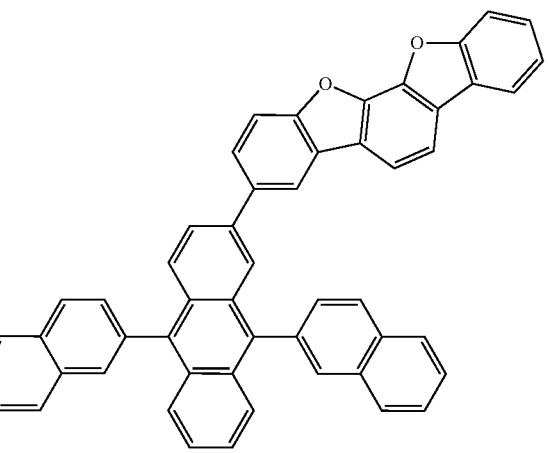
H106
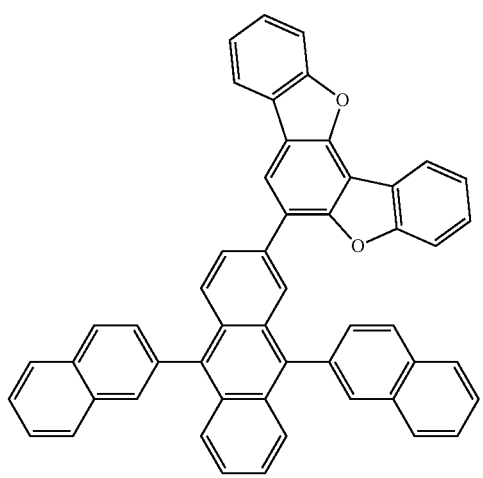

H107
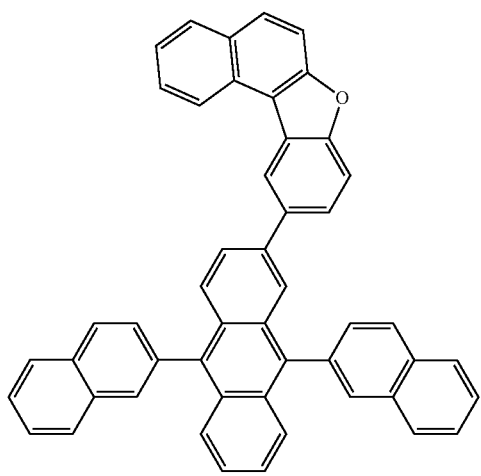
H108
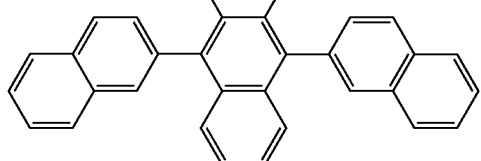
H109
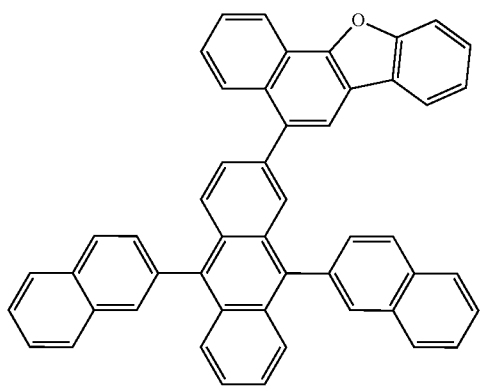
H110
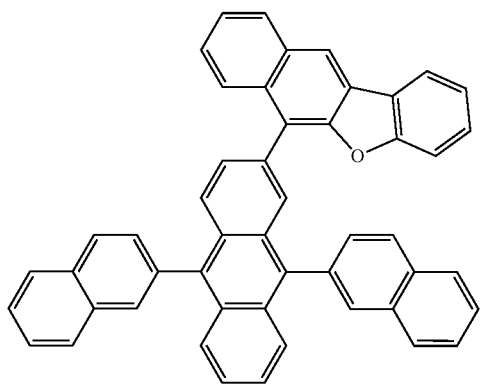
H111
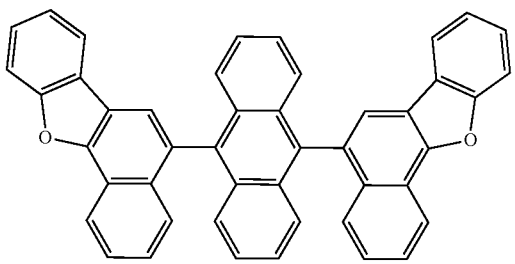
H112
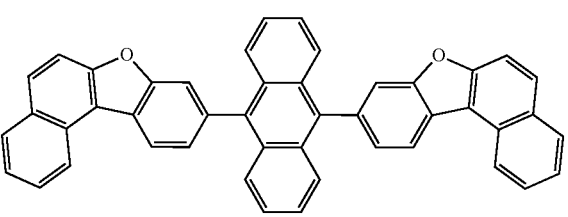
H113
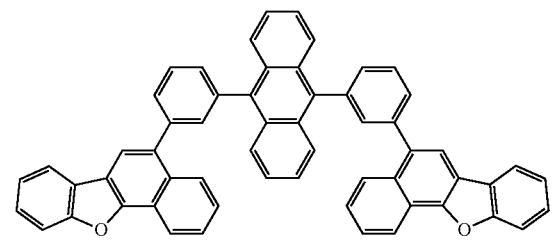
H114
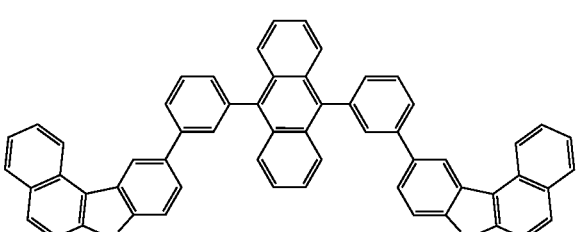
H115
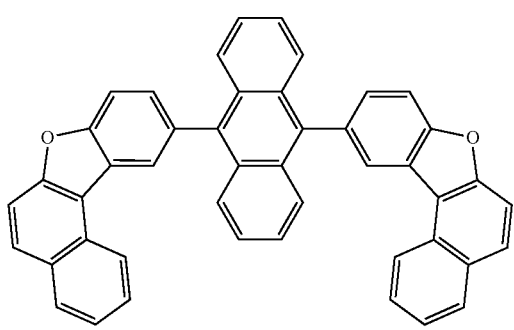
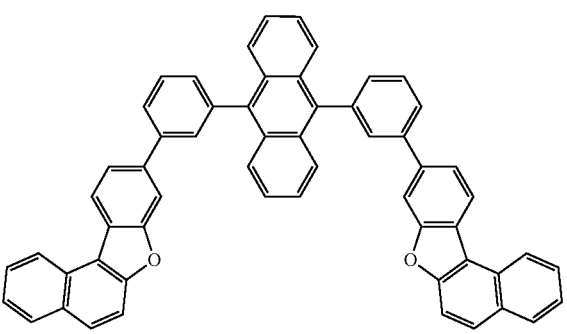

-continued
H116
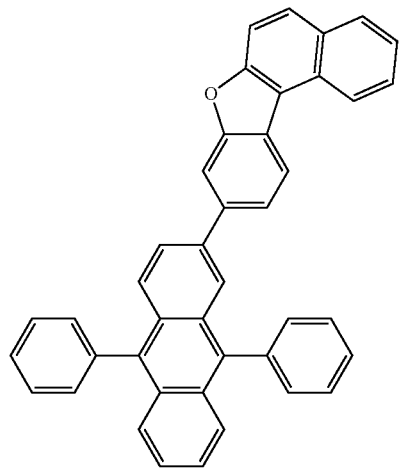
H117
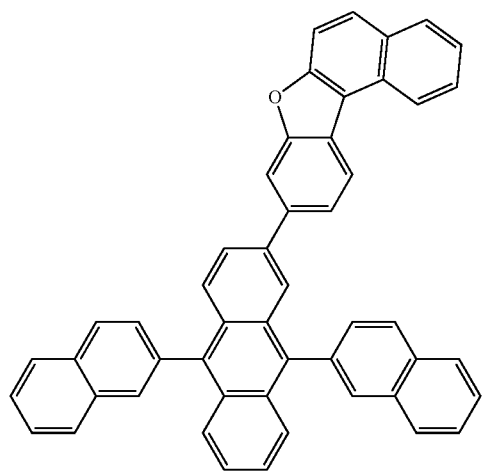
H118
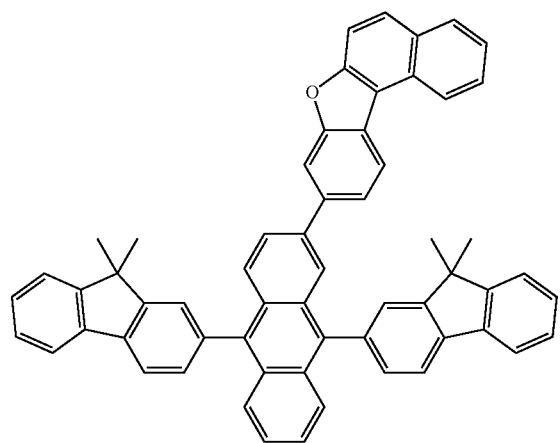
-continued
H119
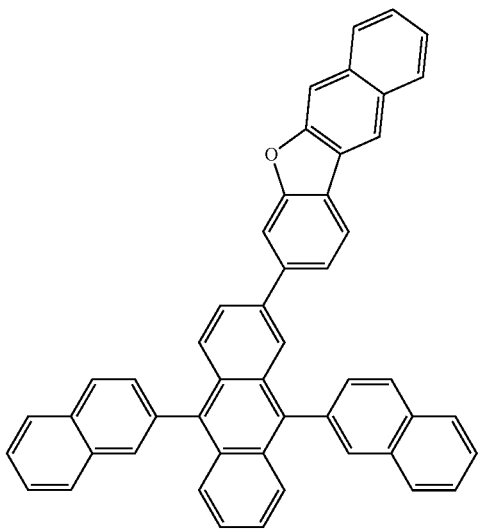
H120
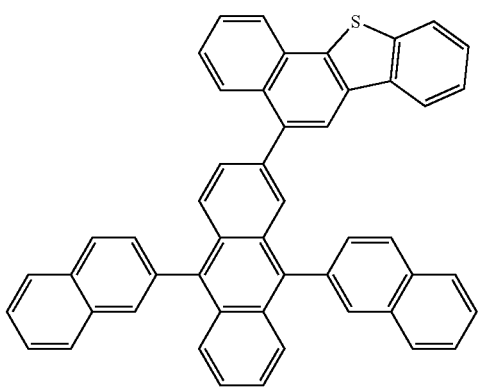
H121
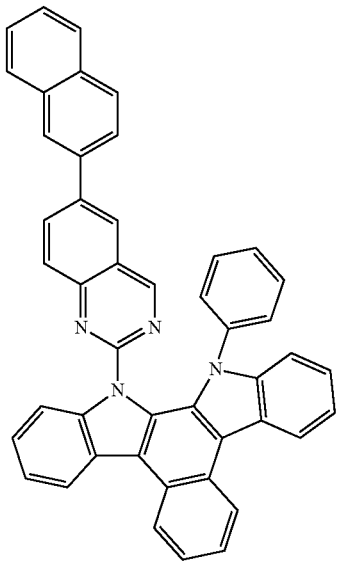

-continued

H122

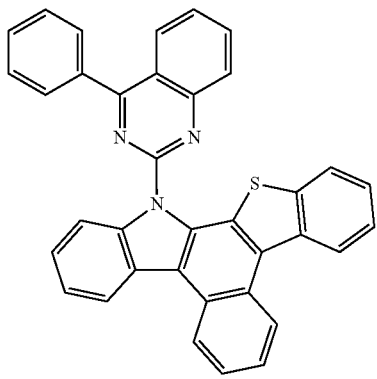

H123

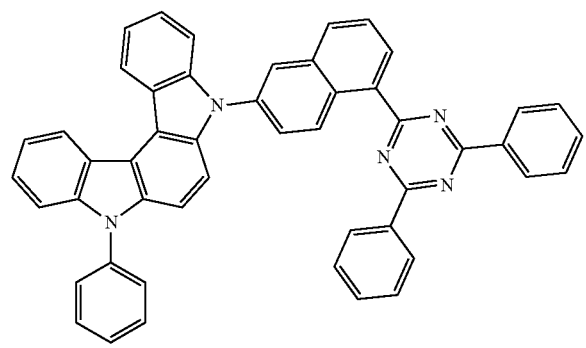

H124

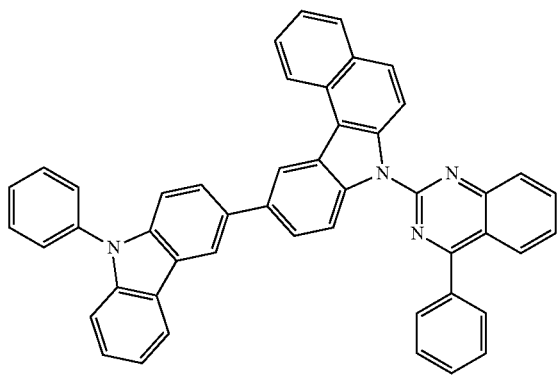

Phosphorescent Dopant

The phosphorescent dopant may include at least one transition metal as a central metal (e.g., a central metal atom).

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

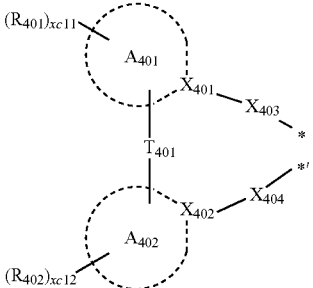

Formula 402

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), and/or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)*', *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$ (to be described in more detail below), $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more of $L_{401}$(s) may be optionally linked to each other via $T_{402}$, which is a linking group, and/or two ring $A_{402}$(s) in two or more of $L_{401}$(s) may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of Compounds PD1 to PD25, or any combination thereof:

PD1

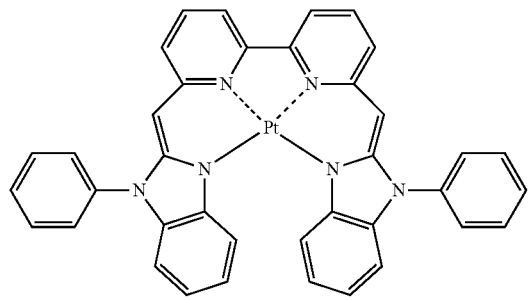

PD2

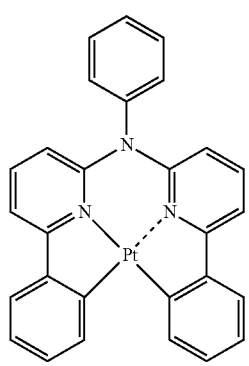

PD3

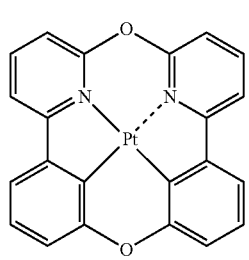

PD4

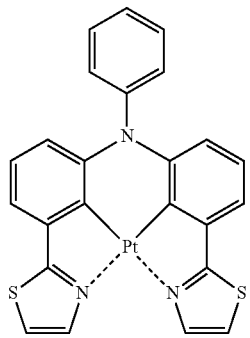

PD5

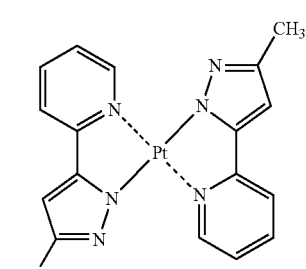

PD6

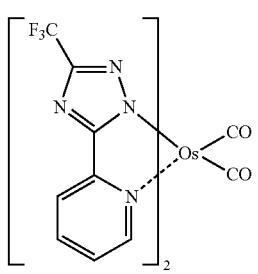

PD7

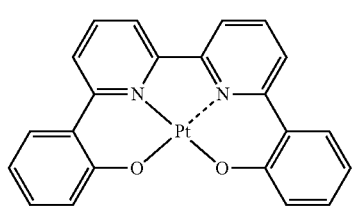

PD8

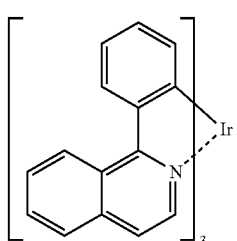

PD9

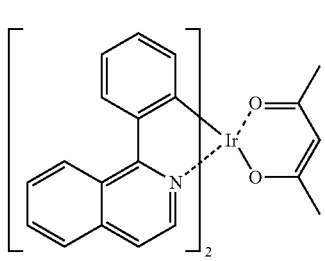

PD10
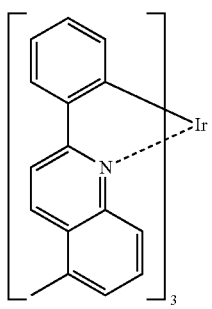
PD11
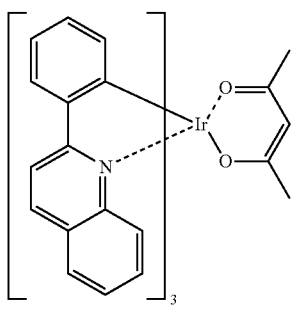
PD12
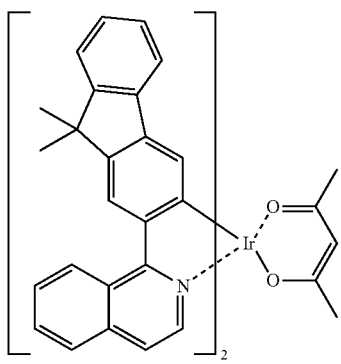
PD13
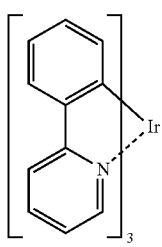
PD14
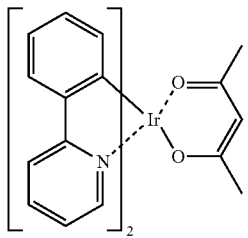
PD15
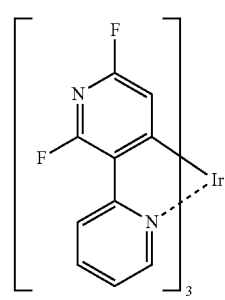
PD16
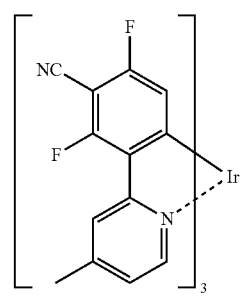
PD17
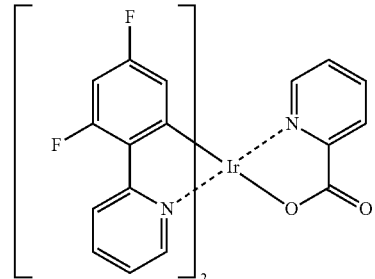
PD18
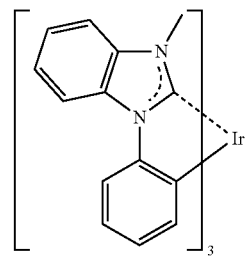
PD19
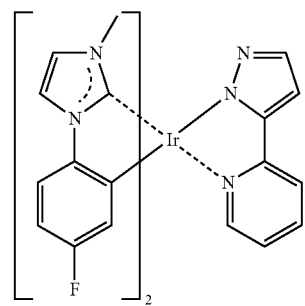

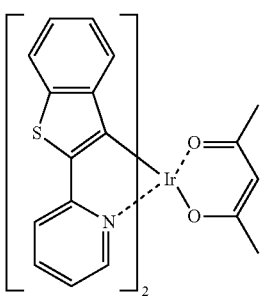

PD20

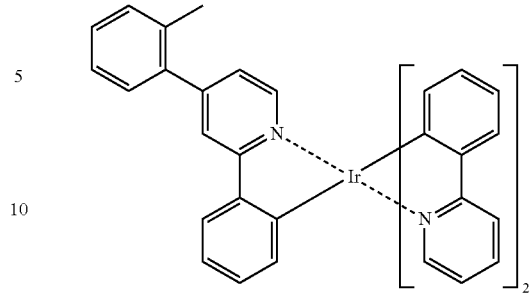

PD24

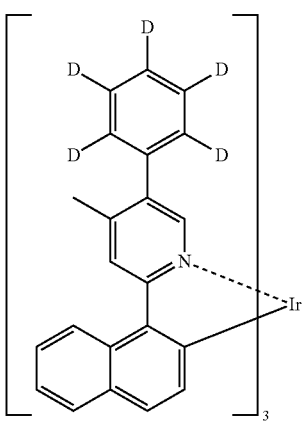

PD21

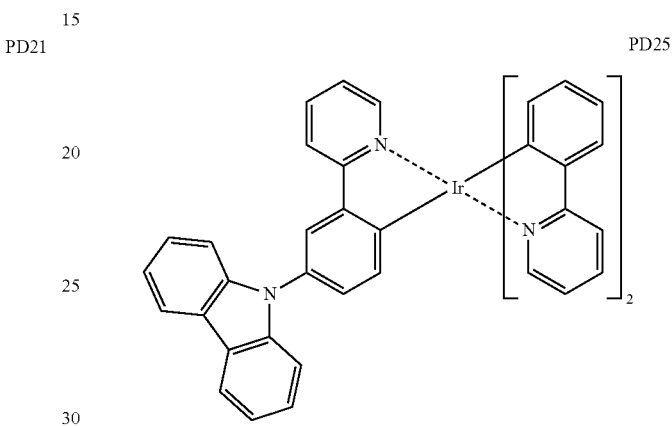

PD25

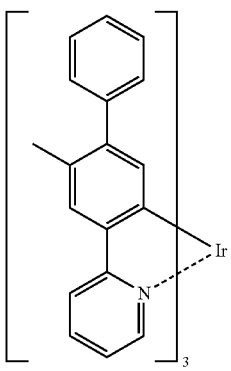

PD22

Fluorescent Dopant

The fluorescent dopant may include an amine group-containing compound, a styryl group-containing compound, or any combination thereof.

In one or more embodiments, the fluorescent dopant may include a compound represented by Formula 501:

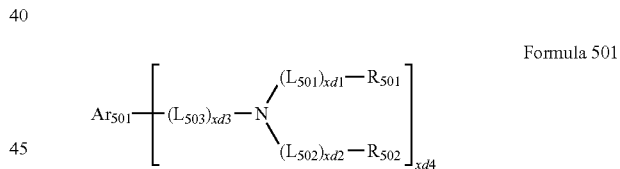

Formula 501

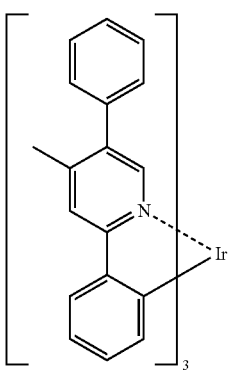

PD23 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, and/or a pyrene group) in which three or more monocyclic groups are condensed together.

In one or more embodiments, xd4 in Formula 501 may be 2.

In one or more embodiments, the fluorescent dopant may include: one of Compounds FD1 to FD36; DPVBi; DPAVBi; or any combination thereof:

79 80
FD1 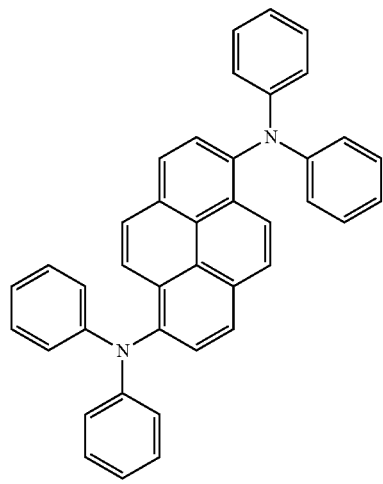 FD2 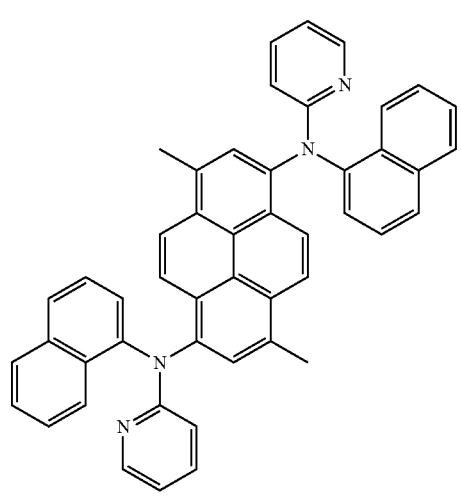
FD3 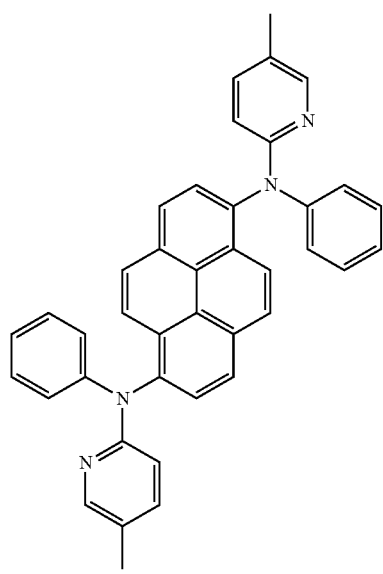 FD4 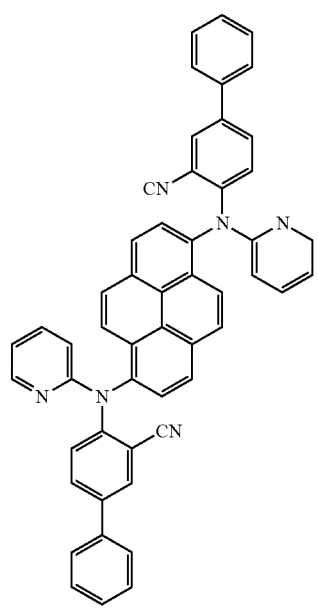
FD5 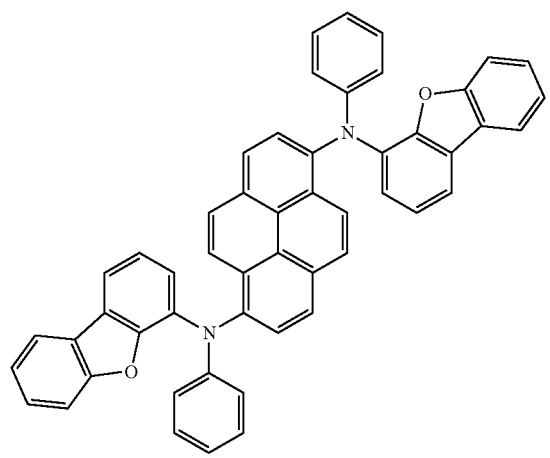 FD6 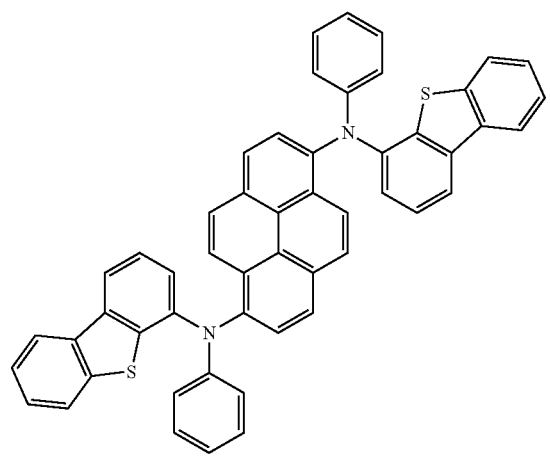

-continued
FD7
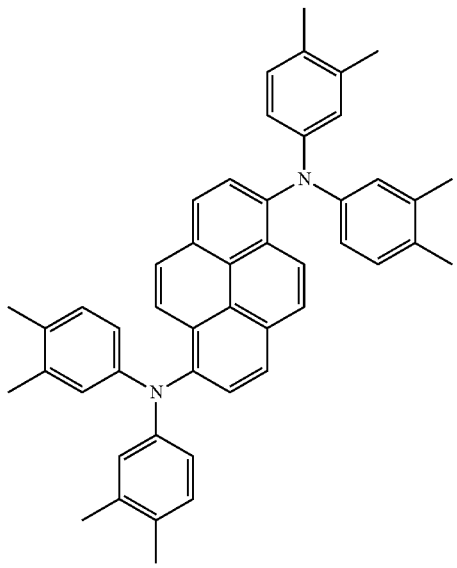
FD8
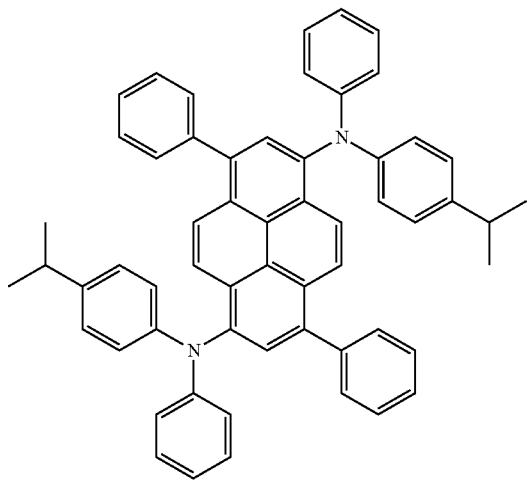
FD9
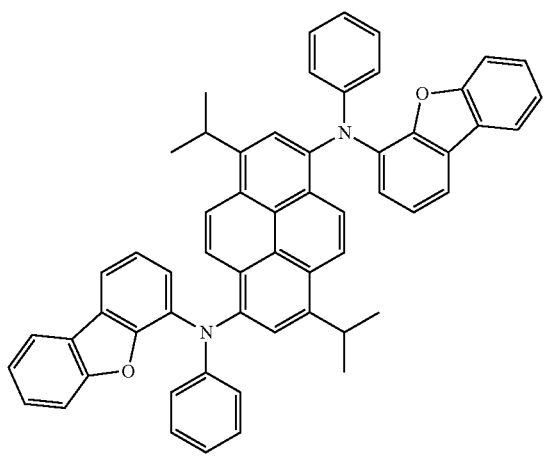
FD10
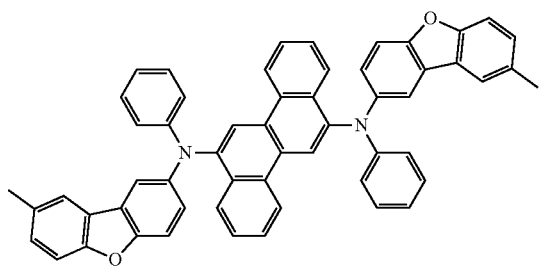
FD11
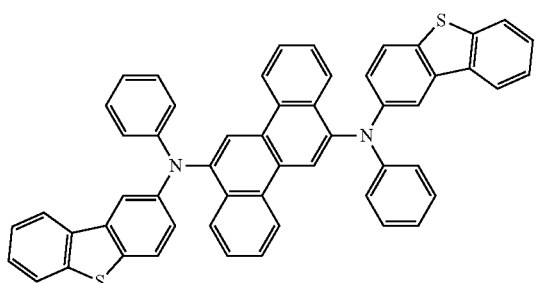
FD12
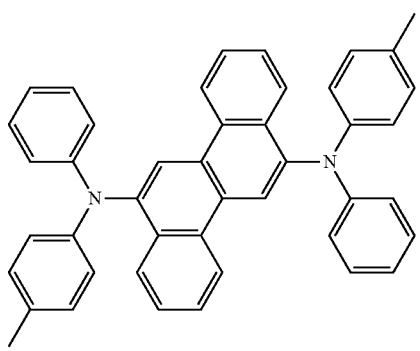

-continued
FD13
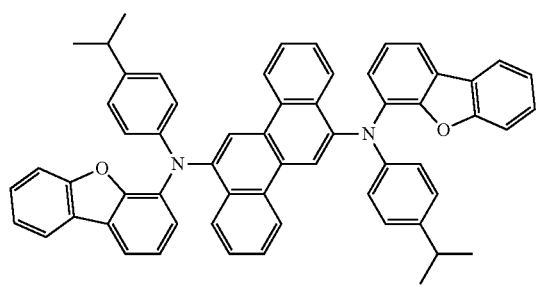
FD14
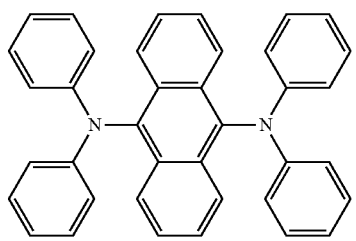
FD15
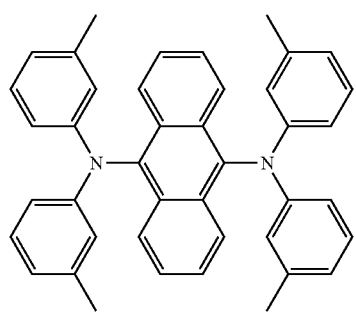
FD16
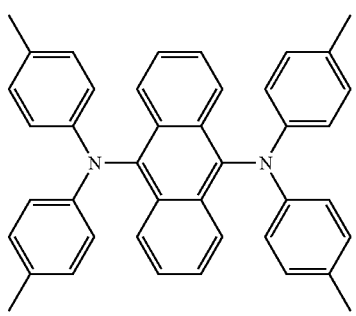
FD17
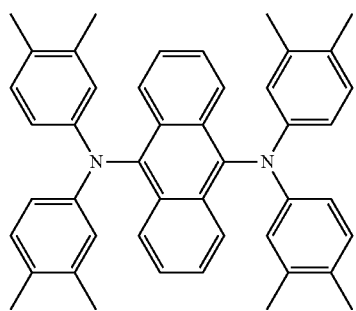
FD18
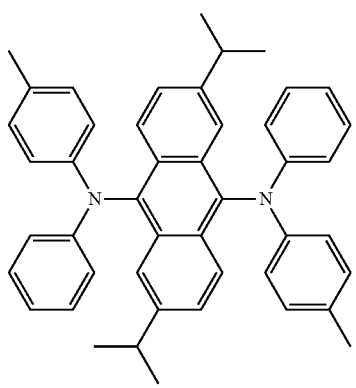
FD19
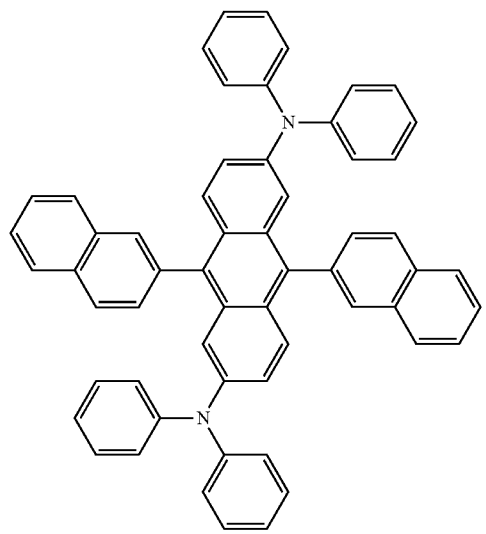
FD20
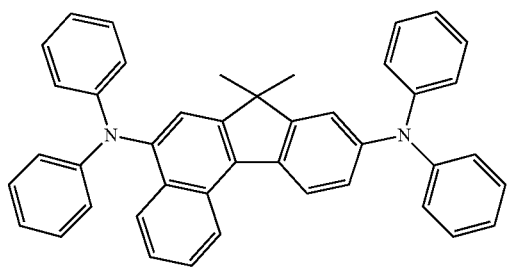

-continued
FD21
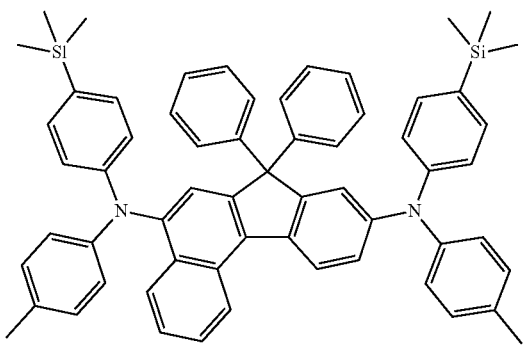
FD22
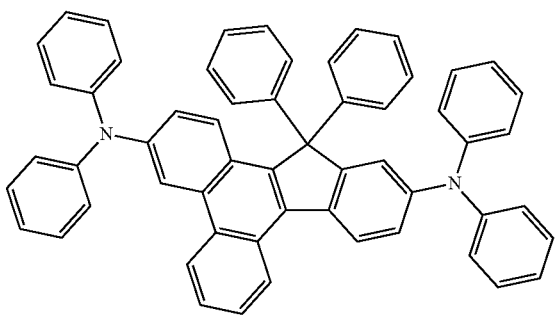
FD23
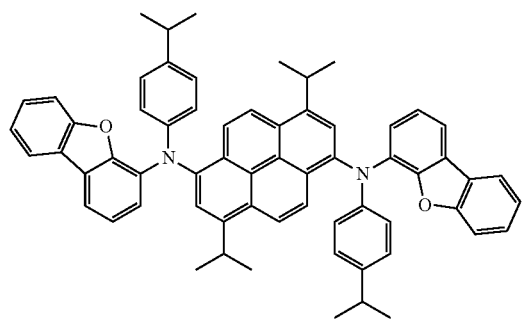
FD24
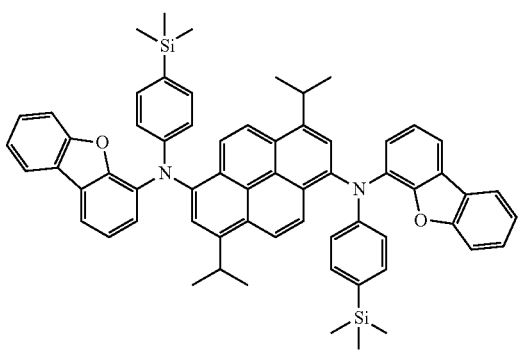
FD25
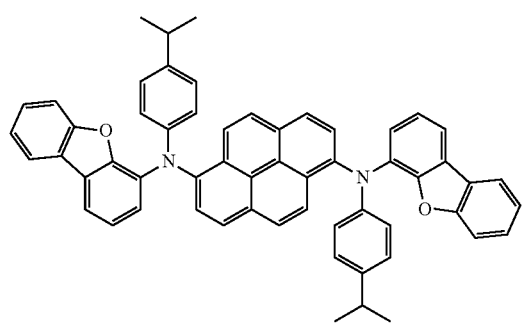
FD26
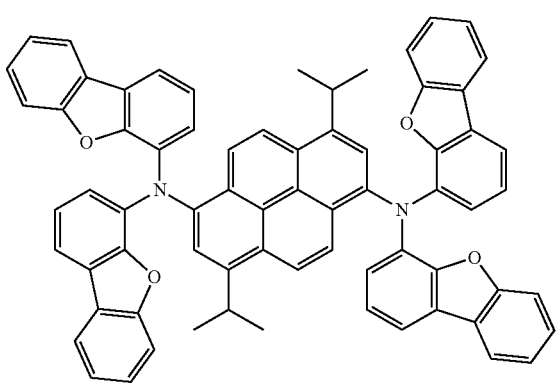
FD27
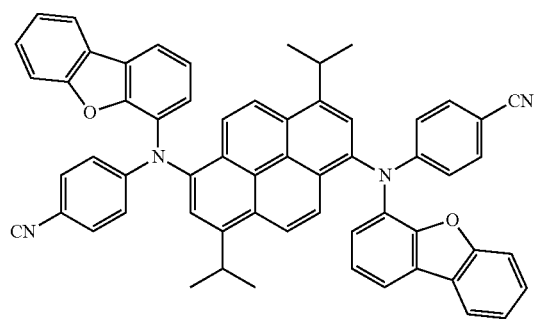
FD28
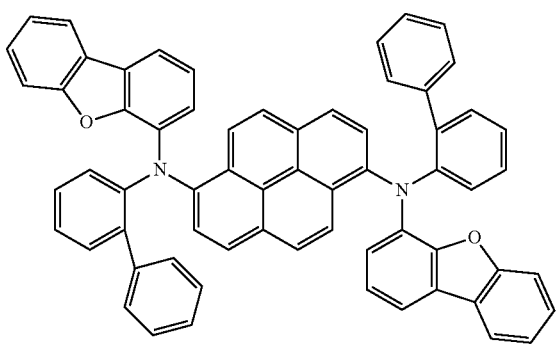

-continued
FD29
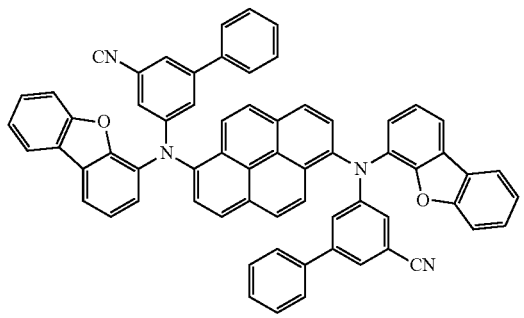
FD30
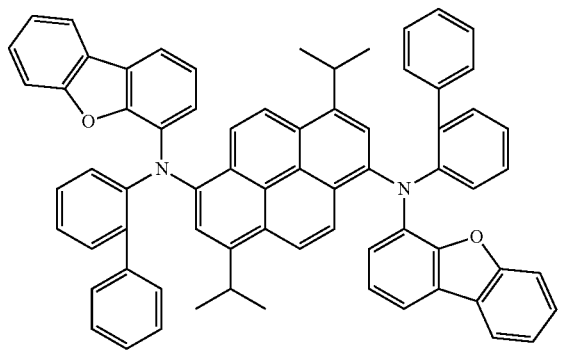
FD31
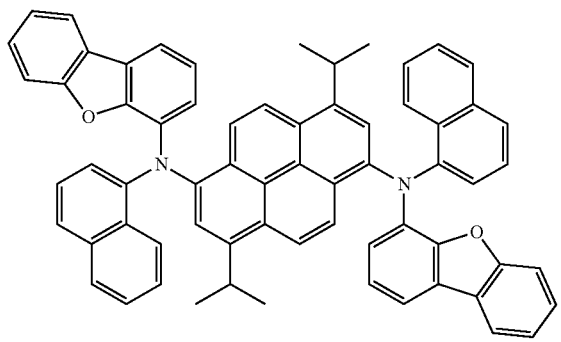
FD32
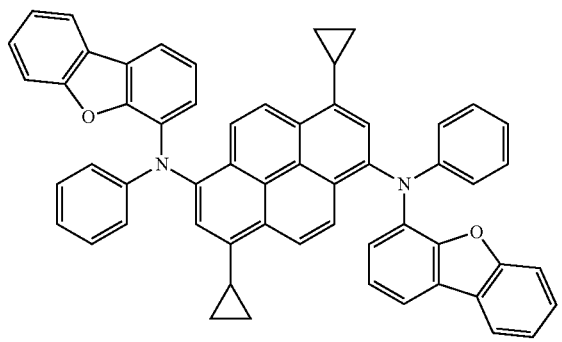
FD33
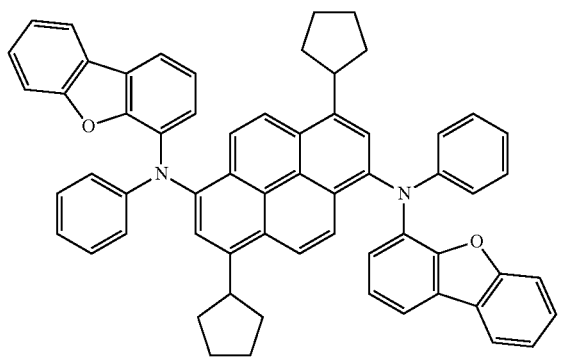
FD34
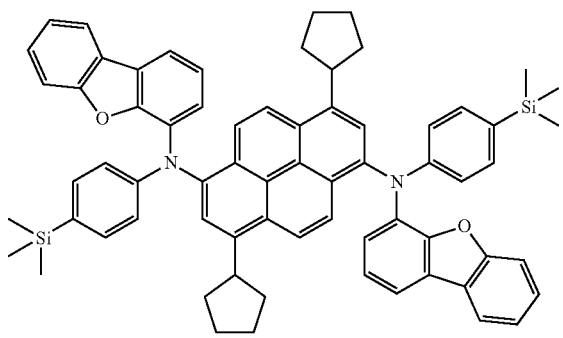
FD35
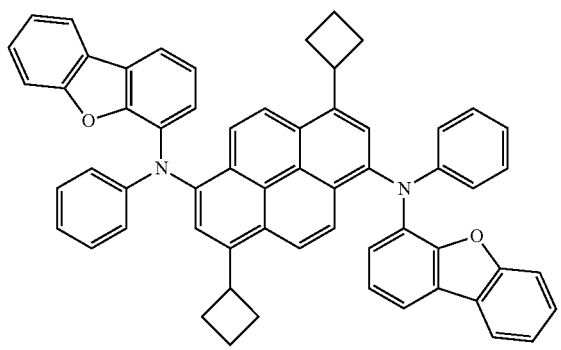
FD36
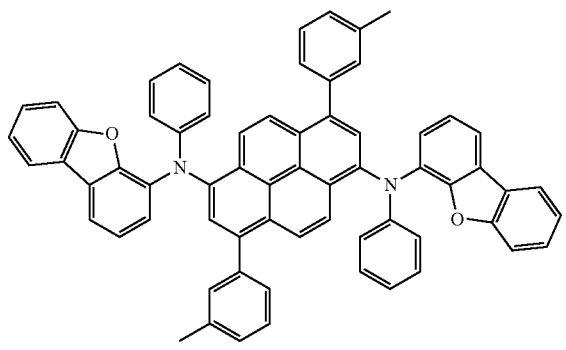

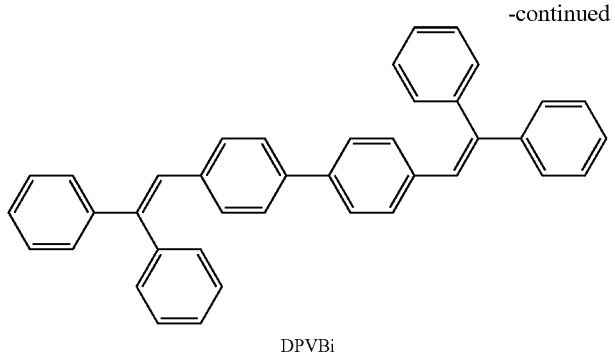
DPVBi

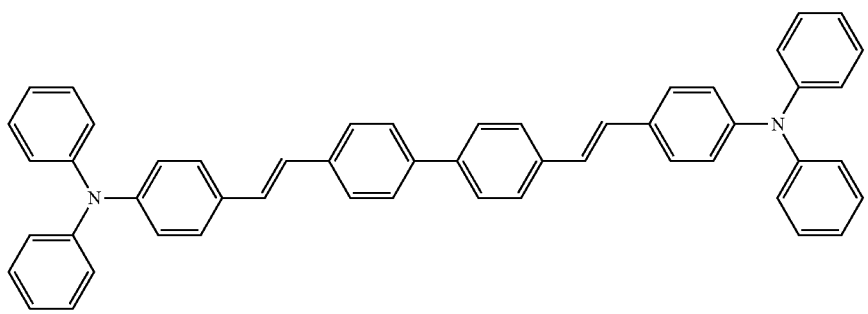
DPAVBi

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act (e.g., serve) as a host or a dopant depending on the kind (e.g., type) of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may occur effectively, and thus, the emission efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

In one or more embodiments, the delayed fluorescence material may include at least one of the following compounds DF1 to DF9:

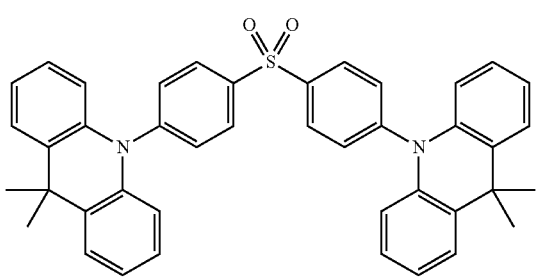
DF1(DMAC-DPS)

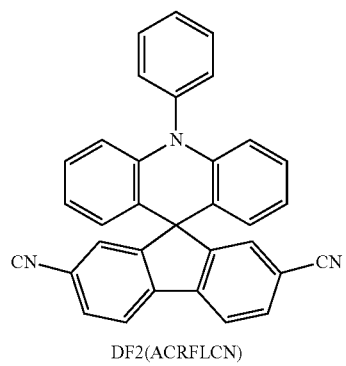
DF2(ACRFLCN)

-continued

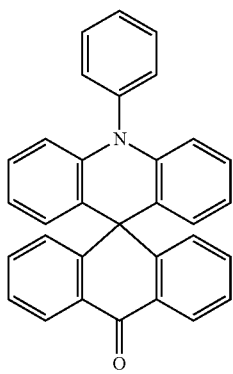

DF3(ACRSA)

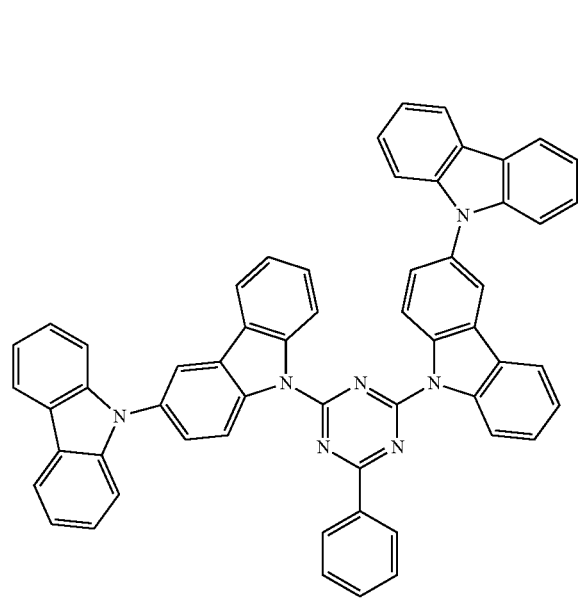

DF4(CC2TA)

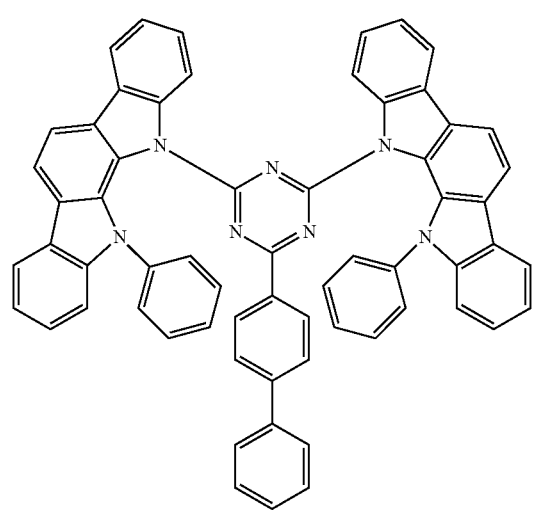

DF5(PIC-TRZ)

-continued

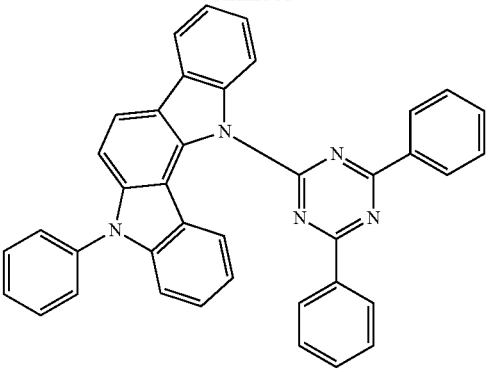

DF6(PIC-TRZ2)

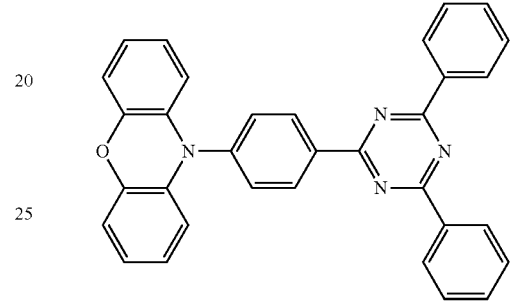

DF7(PXZ-TRZ)

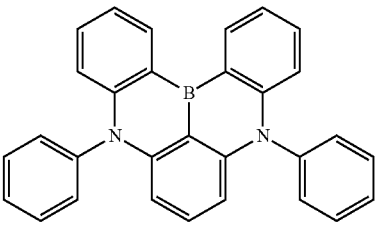

DF8(DABNA-1)

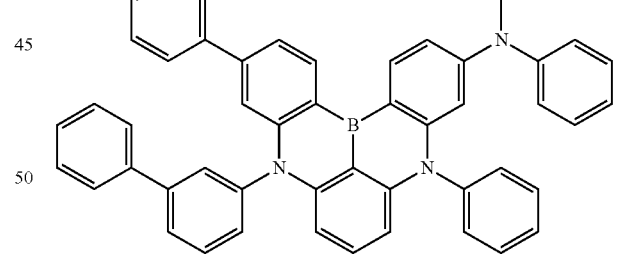

DF9(DABNA-2)

Quantum Dot

The emission layer may include a quantum dot.

In the present specification, a quantum dot refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic (e.g., organometallic) chemical vapor deposition process, a molecular beam epitaxy process, or any process similar thereto.

According to the wet chemical process, a precursor material is mixed with an organic solvent to grow a quantum dot crystal particle. When the crystal grows, the organic solvent naturally acts as a dispersant coordinated on the surface of the quantum dot crystal and controls the growth of the crystal. Therefore, the growth of quantum dot particles may be controlled through a low cost process which is more easily performed than vapor deposition methods, such as metal organic (e.g., organometallic) chemical vapor deposition (MOCVD) and/or molecular beam epitaxy (MBE).

The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Examples of the Group II-VI semiconductor compound may include a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. In one or more embodiments, the Groups III-V semiconductor compound may further include a Group II element. Examples of the Groups III-V semiconductor compound further including the Group II element may include InZnP, InGaZnP, InAlZnP, etc.

Examples of the Group III-VI semiconductor compound may include a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group I-III-VI semiconductor compound may include a ternary compound, such as AgInS, $AgInS_2$, $CuInS$, $CuInS_2$, $CuGaO_2$, $AgGaO_2$, and/or $AgAlO_2$; or any combination thereof.

Examples of the Group IV-VI semiconductor compound may include a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include a single element material, such as Si and/or Ge; a binary compound, such as SiC and/or SiGe; or any combination thereof.

Each element included in a multi-element compound such as the binary compound, the ternary compound and/or the quaternary compound, may exist in a particle with a uniform concentration or a non-uniform concentration.

In some embodiments, the quantum dot may have a single structure or a dual core-shell structure. In the case of the quantum dot having a single structure, the concentration of each element included in the corresponding quantum dot may be uniform. In one or more embodiments, in a quantum dot with a core-shell structure, the material contained in the core and the material contained in the shell may be different from each other.

The shell of the quantum dot may act (e.g., serve) as a protective layer to prevent or reduce chemical degeneration of the core to maintain semiconductor characteristics and/or serve as a charging layer to impart electrophoretic characteristics to the quantum dot. The shell may be a single layer or a multi-layer. The interface between the core and the shell may have a concentration gradient in which the concentration of elements existing in the shell decreases toward the center of the core.

Examples of the shell of the quantum dot may include a metal oxide, a metalloid oxide, a non-metal oxide, a semiconductor compound, or any combination thereof. Examples of the metal oxide, the metalloid oxide, and the non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound may include, as described herein, Group II-VI semiconductor compounds; Group III-V semiconductor compounds; Group III-VI semiconductor compounds; Group I-III-VI semiconductor compounds; Group IV-VI semiconductor compounds; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color gamut (e.g., color reproducibility) may be increased. In addition, because the light emitted through the quantum dot is emitted in all directions, a wide viewing angle may be improved.

In addition, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap may be adjusted by controlling the size of the quantum dot, light having various suitable wavelength bands may be obtained from the quantum dot emission layer. Therefore, by utilizing quantum dots of different sizes, a light-emitting device that emits light of various suitable wavelengths may be implemented. In one or more embodiments, the size of the quantum dot may be selected to emit red, green and/or blue light. In addition, the size of the quantum dot may be configured to emit white light by combining light of various suitable colors.

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer in the respective stated order.

In an embodiment, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21}$$
Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In an embodiment, the electron transport region may include a compound represented by Formula 601-1:

Formula 601-1

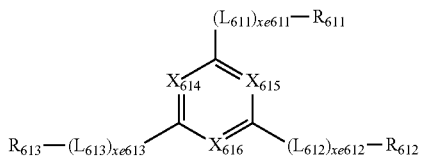

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

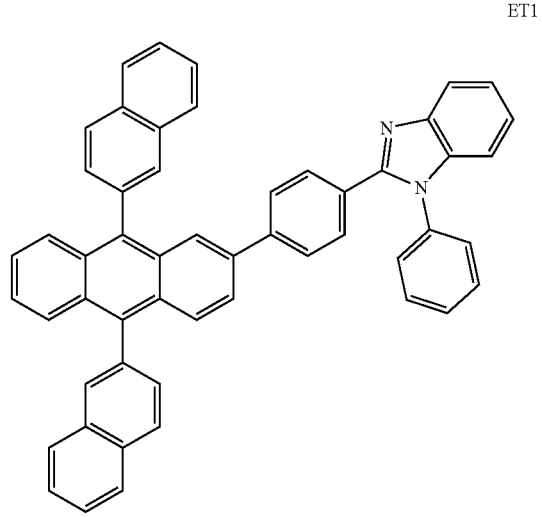

ET2

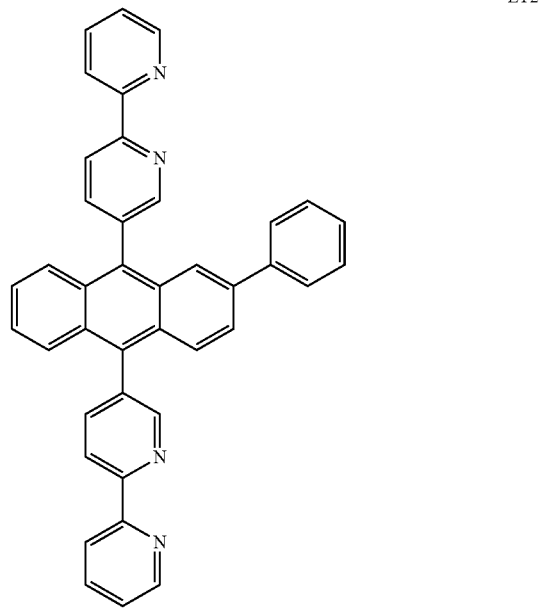

-continued
ET3
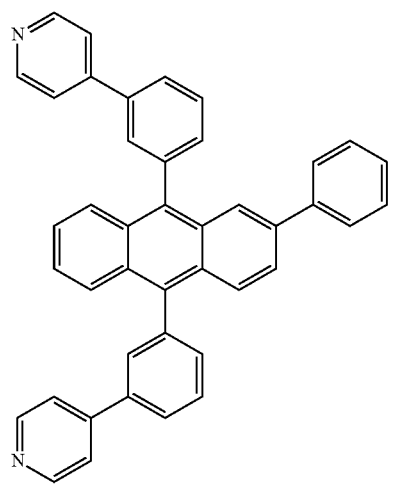
ET4
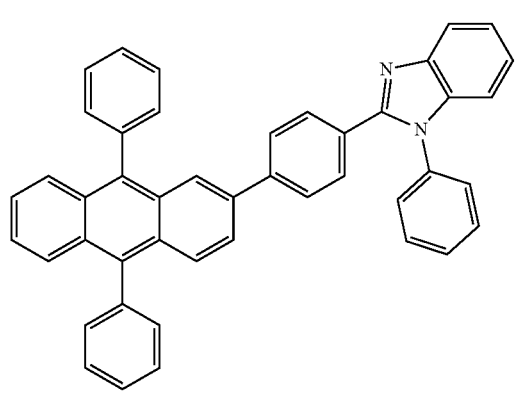
ET5
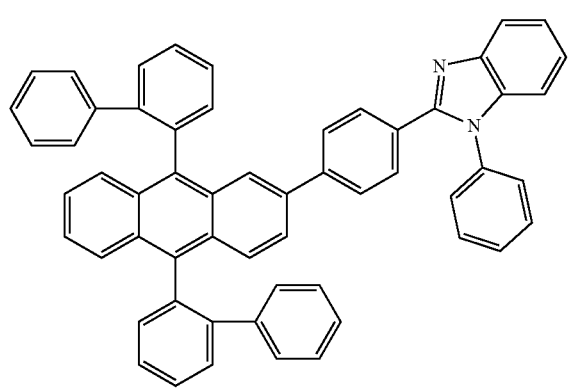
-continued
ET6
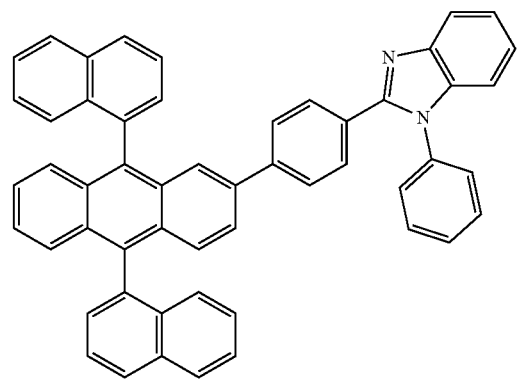
ET7
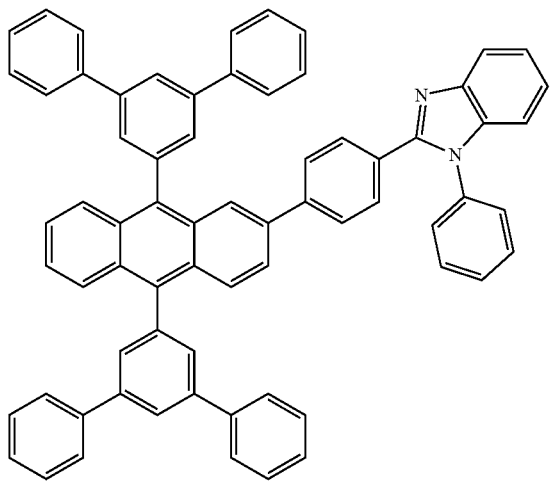
ET8
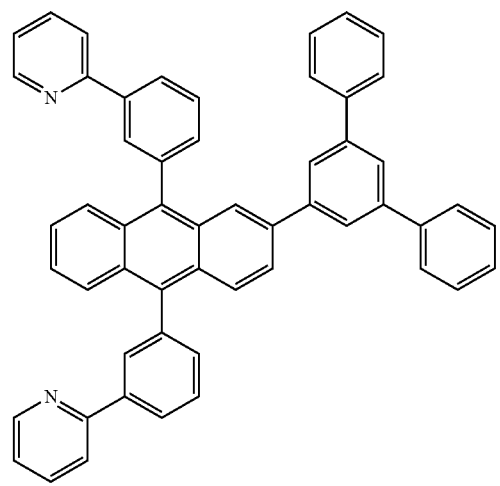

ET9
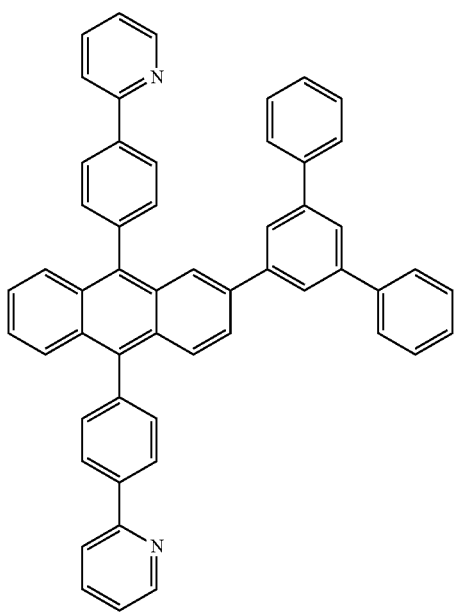
ET10
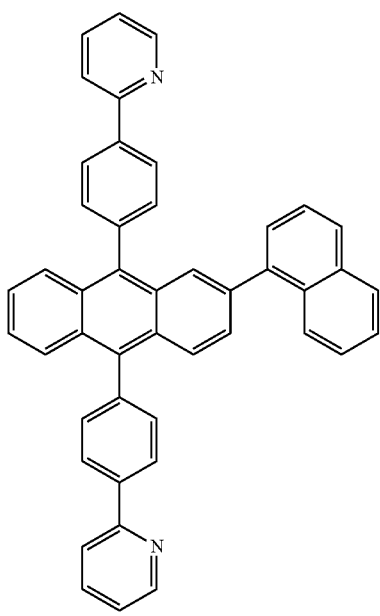
ET11
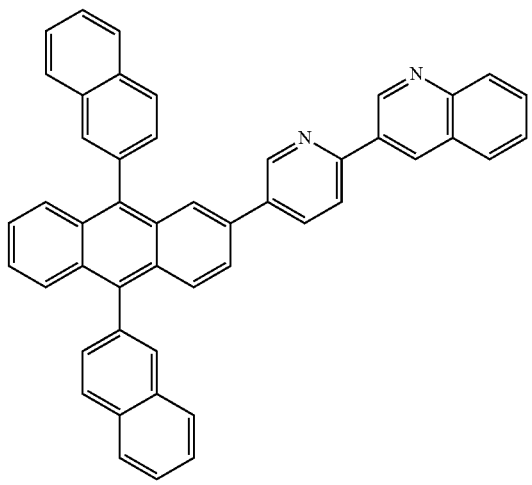
ET12
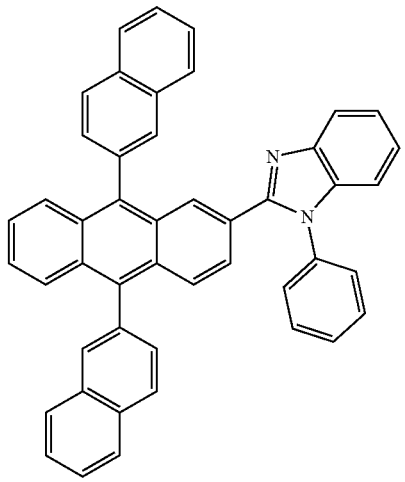
ET13
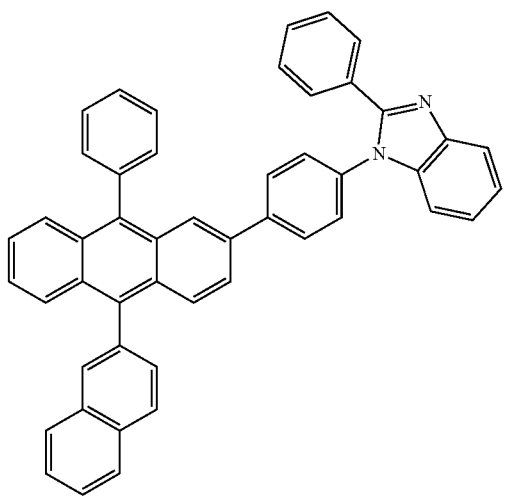

ET14
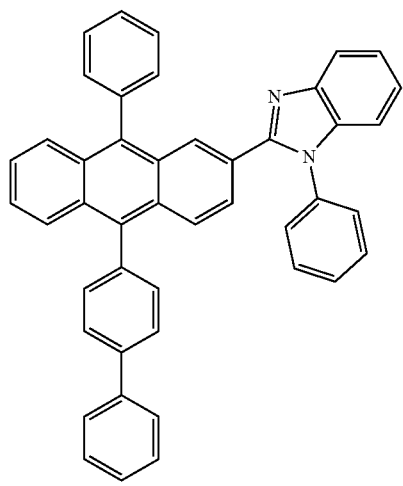
ET15
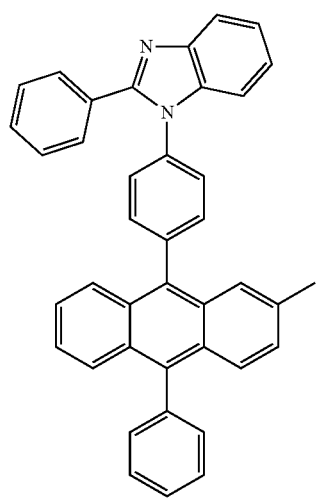
ET16
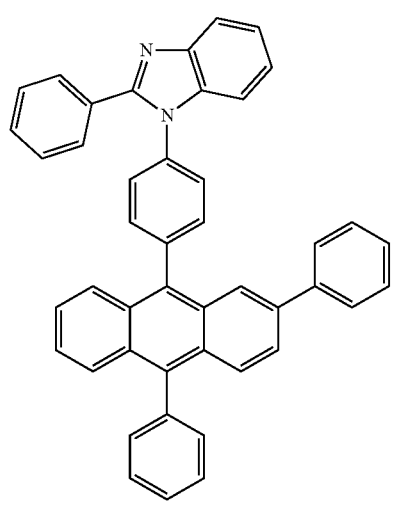
ET17
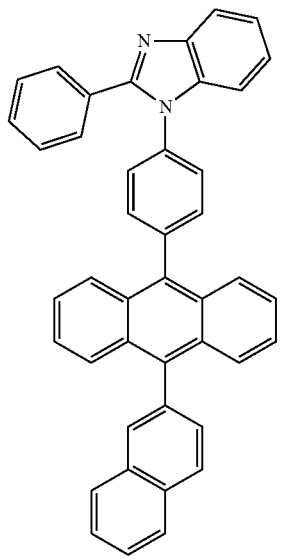
ET18
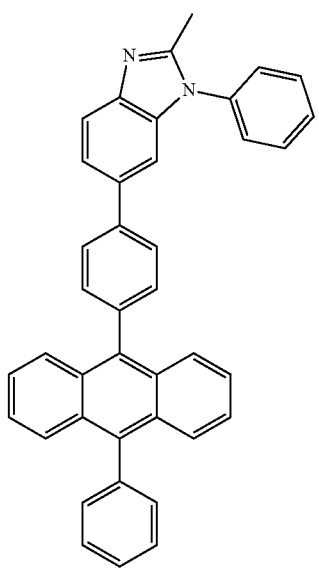
ET19
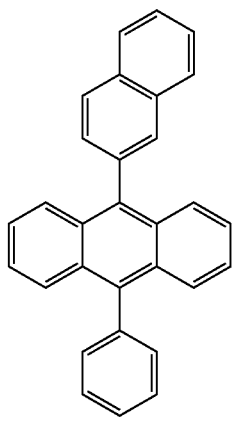

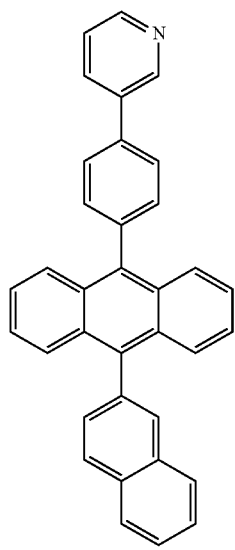
ET20
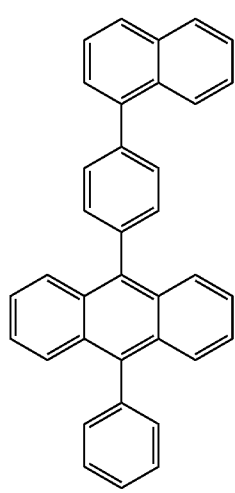
ET21
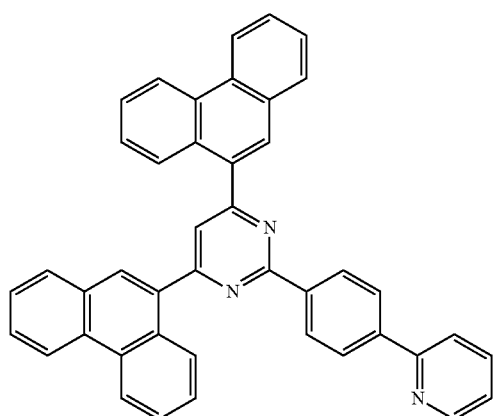
ET22
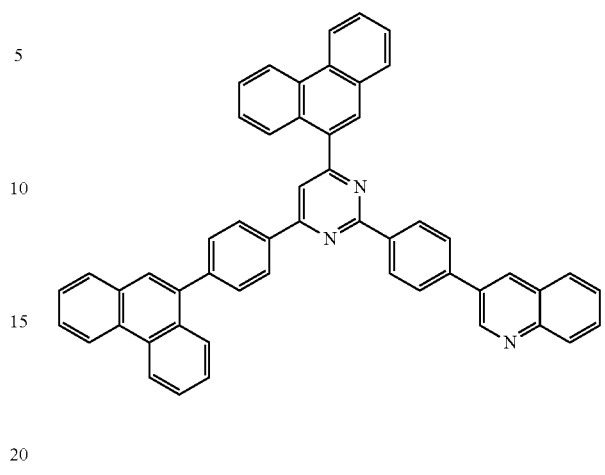
ET23
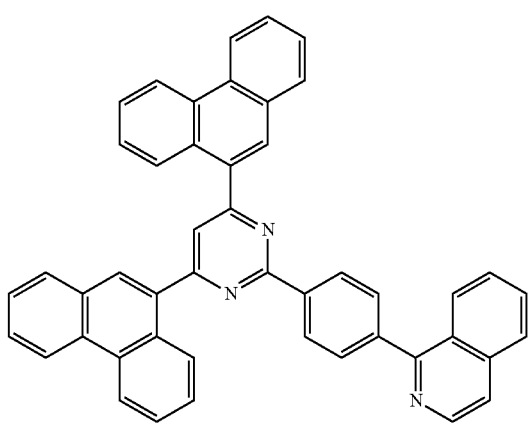
ET24
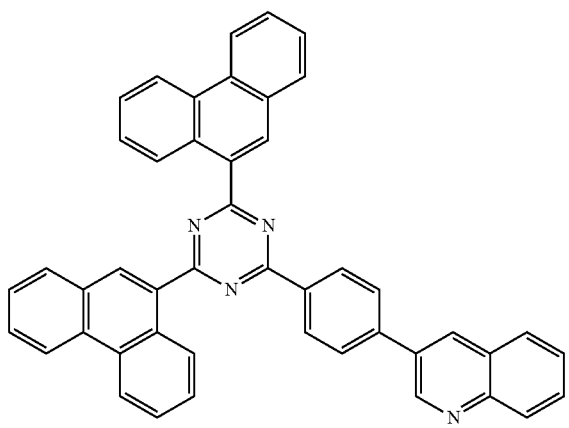
ET25

ET26
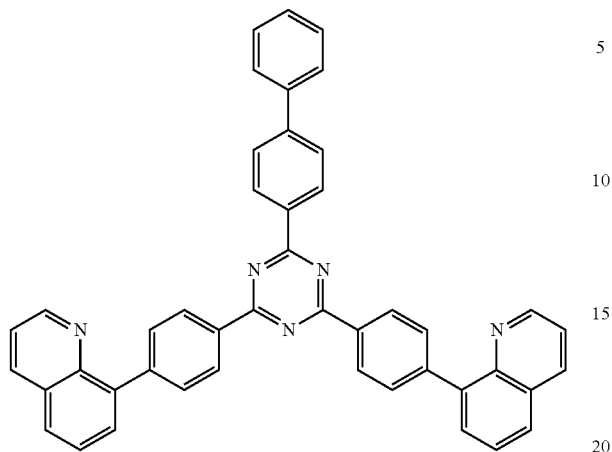
ET29
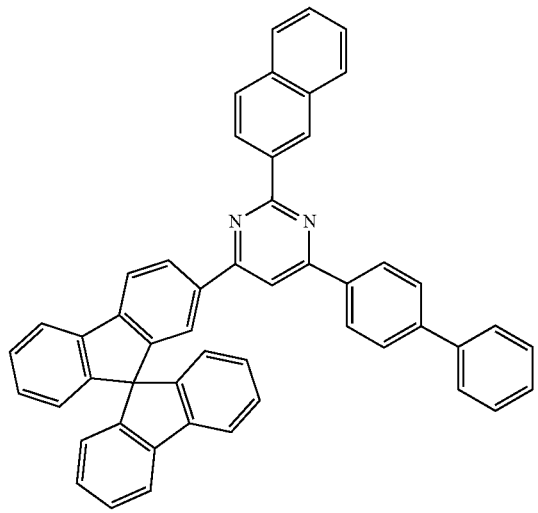
ET27
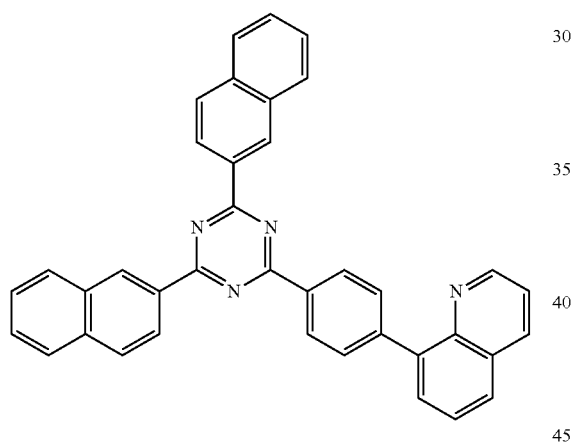
ET30
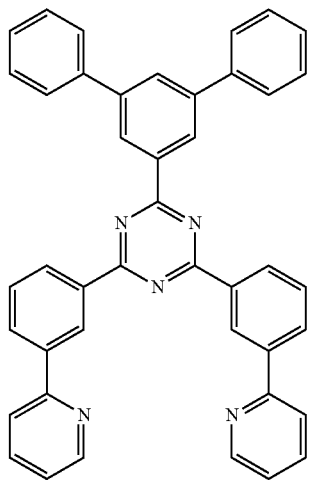
ET28
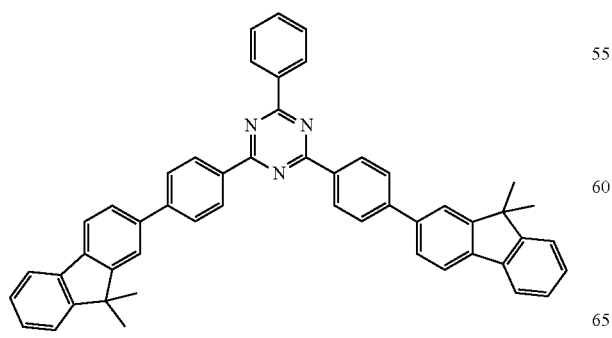
ET31
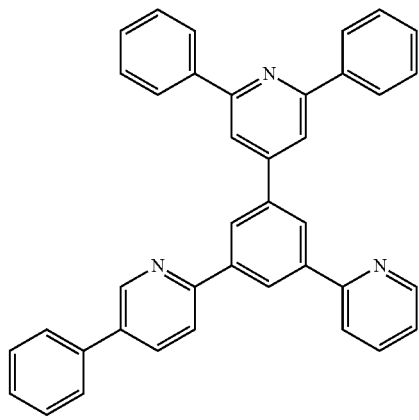

ET32
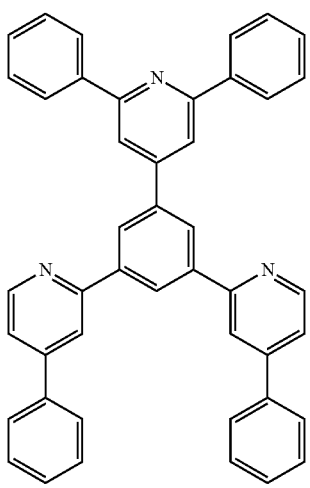
ET33
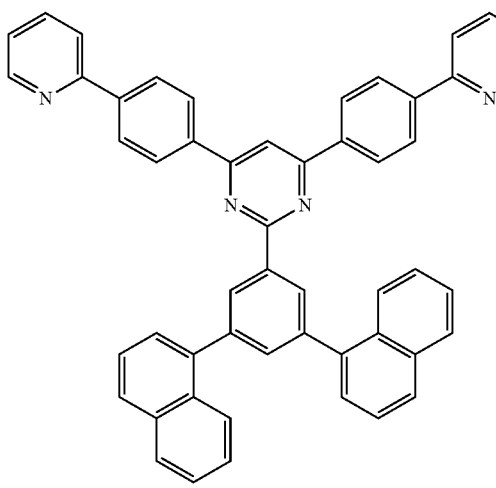
ET34
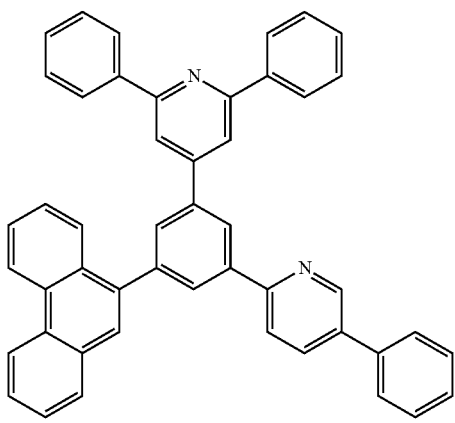
ET35
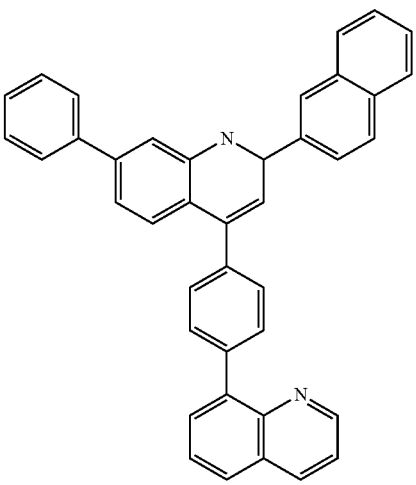
ET36
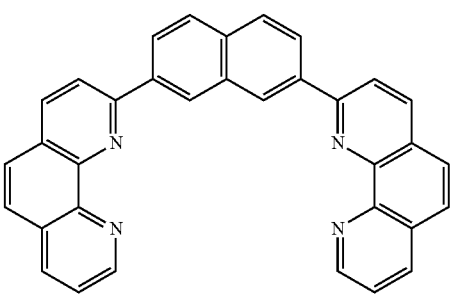
ET37
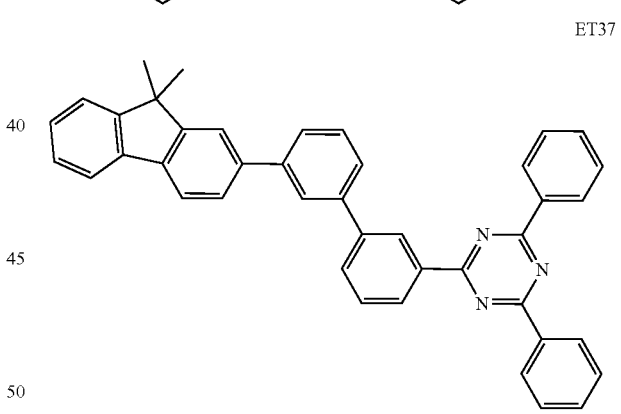
ET38
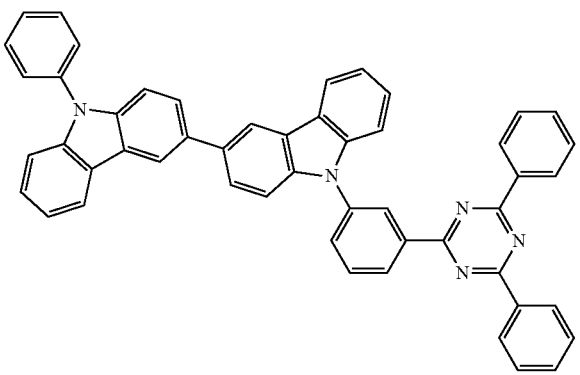

ET39
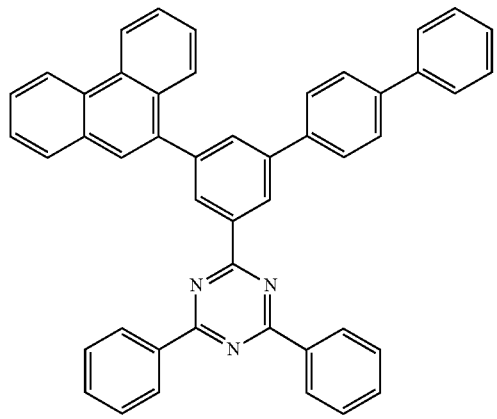
ET40
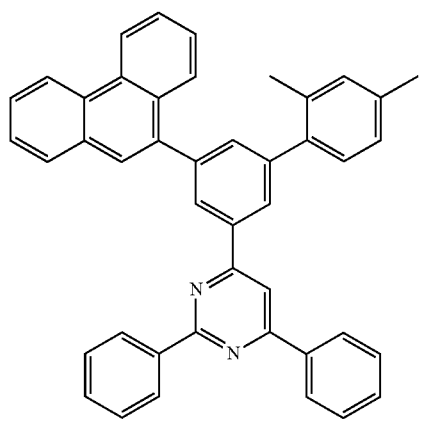
ET41
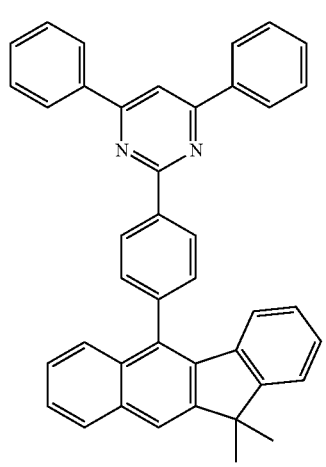
ET42
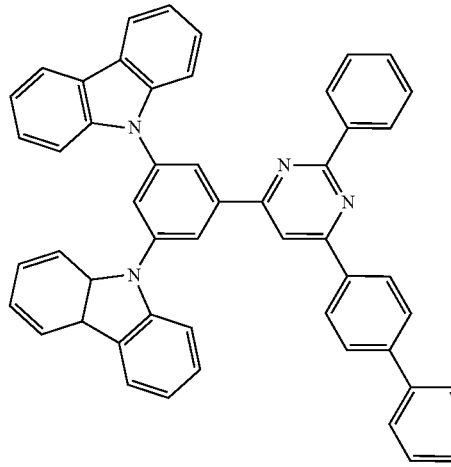
ET43
ET44
ET45

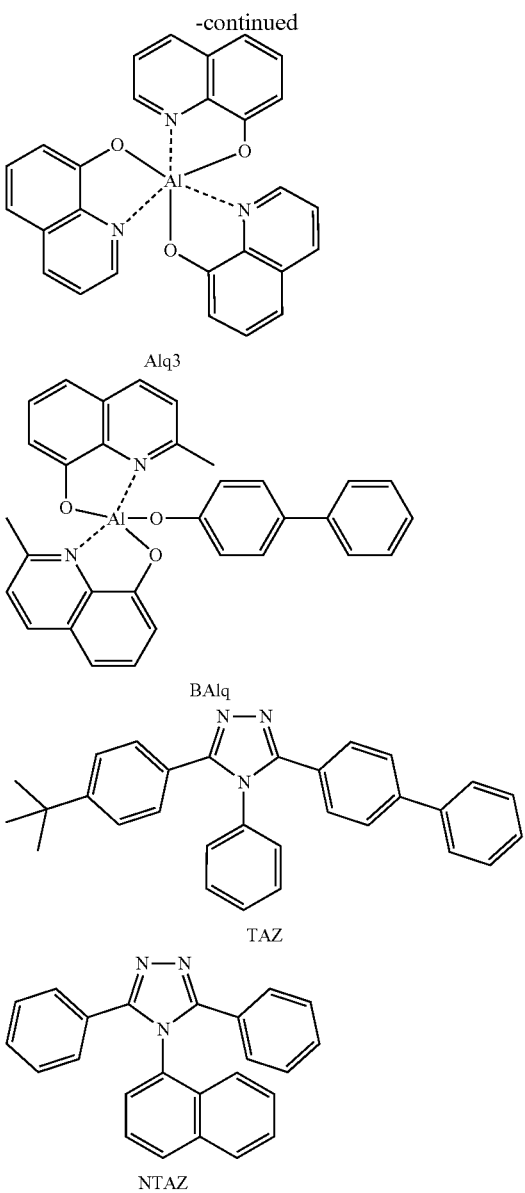

Alq3

BAlq

TAZ

NTAZ

A thickness of the electron transport region may be from about 100 Å to about 5,000 Å, for example, from about 160 Å to about 4,000 Å. When the electron transport region includes a buffer layer, a hole blocking layer, an electron control layer, or any combination thereof, thicknesses of the buffer layer, the hole blocking layer, and/or the electron control layer may each independently be about 20 Å to about 1,000 Å, for example, about 30 Å to about 300 Å. When the thicknesses of the buffer layer, the hole blocking layer, and/or the electron control layer are within these ranges, satisfactory hole transporting characteristics may be obtained without a substantial increase in driving voltage.

The electron transport region (for example, the second electron transport layer in the electron transport region) may further include, in addition to the materials described above, a metal-containing material.

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be one or more oxides, halides (for example, fluorides, chlorides, bromides, and/or iodides), and/or tellurides of the alkali metal, the alkaline earth metal, and the rare earth metal, or any combination thereof.

The alkali metal-containing compound may include one or more alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal oxide, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode (e.g., on the side opposite to the second electrode) 110, and/or a second capping layer may be located outside the second electrode (e.g., on the side opposite to the first electrode) 150. In one or more embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward (e.g., transmitted or provided to) the outside through the first electrode 110, which is a semi-transmissive electrode or a transmissive electrode, and the first capping layer, and/or light generated in the emission layer of the interlayer 130 of the light-emitting device 10 may be extracted toward (e.g., transmitted or provided to) the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth metal complex, or any combination thereof. The carbocyclic compound, the heterocyclic compound, and/or the amine group-containing compound may be optionally substituted with a substituent containing O, N, S, Se, Si, F, Cl, Br, I, or any combination thereof. In one or more embodiments, at least one of the first capping layer or the second capping layer may each independently include an amine group-containing compound.

In one or more embodiments, at least one of the first capping layer or the second capping layer may each independently include a compound represented by Formula 201, a compound represented by Formula 202, or any combination thereof.

In one or more embodiments, at least one of the first capping layer or the second capping layer may each independently include one of Compounds HT28 to HT33, one of Compounds CP1 to CP6, β-NPB, or any combination thereof:

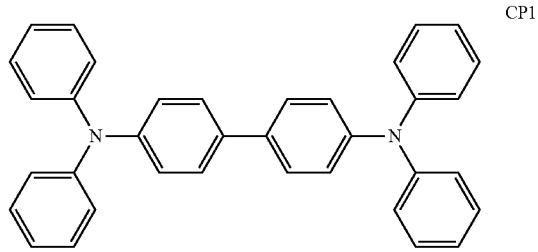

CP1

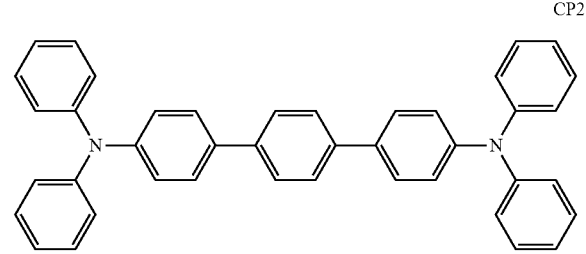

CP2

-continued

CP3

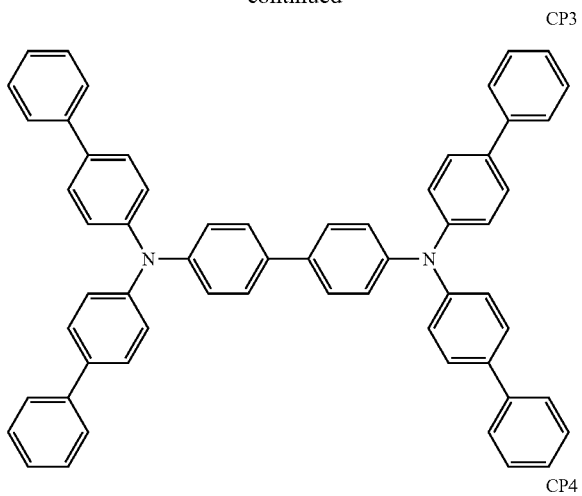

CP4

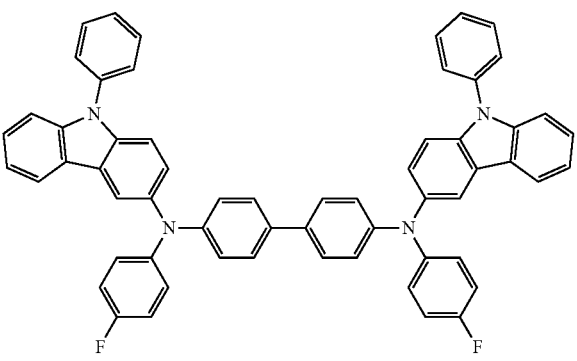

CP5

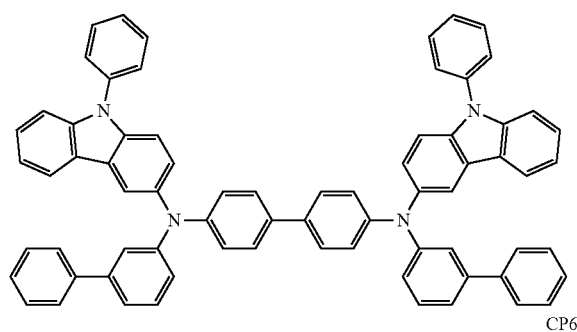

CP6

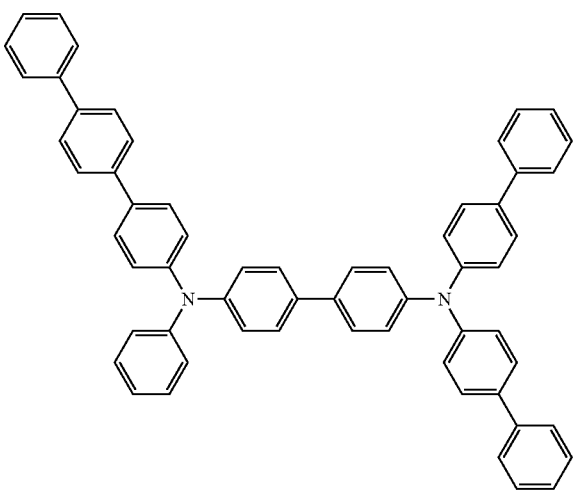

-continued

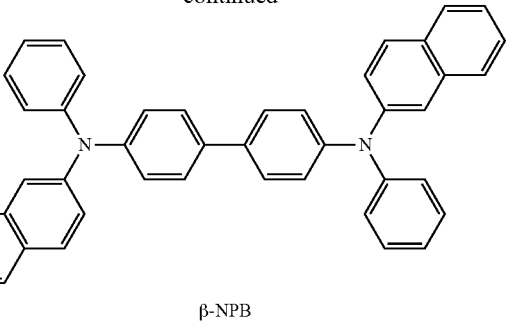

β-NPB

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, the light emitted from the light-emitting device may be blue light or white light. The light-emitting device may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be located among the plurality of subpixel areas to define each of the subpixel areas.

The color filter may further include a plurality of color filter areas and light-shielding patterns located among the plurality of color filter areas, and the color conversion layer may include a plurality of color conversion areas and light-shielding patterns located among the plurality of color conversion areas.

The plurality of color filter areas (or the plurality of color conversion areas) may include a first area emitting a first color light, a second area emitting a second color light, and/or a third area emitting a third color light, and the first color light, the second color light, and/or the third color light may have different maximum emission wavelengths from one another. In one or more embodiments, the first color light may be red light, the second color light may be green light, and the third color light may be blue light. In one or more embodiments, the plurality of color filter areas (or the color plurality of conversion areas) may include quantum dots. In an embodiment, the first area may include a red quantum dot (e.g., a red-light emitting quantum dot), the second area may include a green quantum dot (e.g., a green-light emitting quantum dot), and the third area may not include a quantum dot. The quantum dot may be the same as described in the present specification. The first area, the second area, and/or the third area may each include a scatterer.

In one or more embodiments, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer (e.g., an active layer), wherein the source electrode or the drain electrode may be electrically connected to the first electrode or the second electrode of the light-emitting device.

The thin-film transistor may further include a gate electrode, a gate insulating film, etc.

The activation layer may include crystalline silicon, amorphous silicon, an organic semiconductor, an oxide semiconductor, and/or the like.

The electronic apparatus may further include a sealing portion for sealing the light-emitting device. The sealing portion may be placed between the color filter and the light-emitting device and/or between the light-emitting device and the color conversion layer. The sealing portion allows light from the light-emitting device to be extracted to the outside, while concurrently (or simultaneously) preventing or substantially preventing external ambient air and/or moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting (e.g., lighting apparatuses), personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

DEFINITION OF TERMS

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atom(s), a heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example,
the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group),
the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein may each refer to a group condensed to any cyclic group or a monovalent or polyvalent group (for example, a divalent group, a trivalent group, a tetravalent group, etc.), depending on the structure of a formula in connection with which the terms are used. In one or more embodiments, "a benzene group" may be a benzene ring, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its entire molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its entire molecular structure when considered as a whole. Examples of the monovalent non-aromatic condensed heteropolycyclic group may include an azaadamantyl group and a 9,10-dihydroacridinyl group and a 9H-xanthenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ aryl alkyl group" as used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, and any combination thereof.

The term "transition metal" as used herein may include hafnium (Hf), tantalum (Ta), tungsten(W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a light-emitting device according to embodiments will be described in more detail with reference to Examples.

EXAMPLES

Preparation Example 1

A solute was mixed with a mixed solvent including 28 wt % of cyclohexylbenzene, 52 wt % of 2-ethylnaphthalene, and 20 wt % of diisopropyl biphenyl at a solid content concentration of 1.4 wt % to prepare a composition for forming a light-emitting device. As the diisopropyl biphenyl, a diisopropyl biphenyl isomer mixture was utilized.

Physical properties of each solvent utilized in Preparation Example 1 are shown in Table 1.

TABLE 1

| Solvent | Vapor pressure (torr) | Boiling point (° C.) | Surface tension (dyne/cm) | Viscosity (cP) |
|---|---|---|---|---|
| Cyclohexylbenzene (CHB) | $4 \times 10^{-2}$ | 240 | 33 | 3.6 |
| 2-Ethylnaphthalene (EtNa) | $2 \times 10^{-2}$ | 260 | 38 | 2.8 |
| Diisopropyl biphenyl (IIBP) | $3 \times 10^{-5}$ | 330 | 34 | 17.7 |

Comparative Preparation Example 1

A solute was mixed with a mixed solvent including 72 wt % of 2-ethylnaphthalene and 28 wt % of 2-ethylbiphenyl at a solid content concentration of 1.4 wt % to prepare a composition for forming a light-emitting device.

Physical properties of each solvent utilized in Comparative Preparation Example 1 are shown in Table 2.

TABLE 2

| Solvent | Vapor pressure (torr) | Boiling point (° C.) | Surface tension (dyne/cm) | Viscosity (cP) |
|---|---|---|---|---|
| 2-Ethylnaphthalene (EtNa) | $2 \times 10^{-2}$ | 260 | 38 | 2.8 |
| 2-Ethylbiphenyl (EBP) | $2 \times 10^{-3}$ | 300 | 38 | 4.2 |

Example 1

As a substrate, a 15 Ω/cm² ITO glass substrate, which is a product of Corning Inc., was cut to a size of 50 mm×50 mm×0.7 mm, and sonicated with isopropyl alcohol and pure water each for 5 minutes. Then, through photolithography, a bank having a size of 45 nm×35 nm×1,000 nm (W×L×H) was formed on the substrate. The composition for forming a light-emitting device prepared in Preparation Example 1 was added dropwise to the bank (e.g., to the inside area surrounded by the bank) by utilizing an inkjet printer, dried at 1 torr for 2 minutes and at $10^{-5}$ Torr for 10 minutes, and then, heated at 230° C. for 30 minutes to form a thin film.

Comparative Example 1

A film was formed utilizing substantially the same method as in Example 1 except that the composition for forming a light-emitting device prepared in Comparative Preparation Example 1 was utilized instead of the composition for forming a light-emitting device prepared in Preparation Example 1 to form a thin film.

Figure 2A:
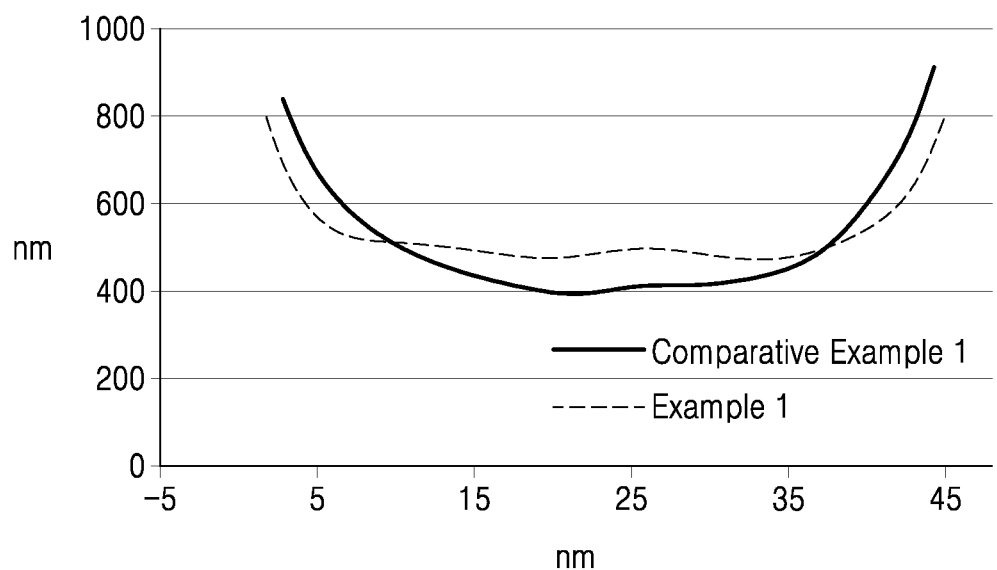
FIG. 2A is a diagram showing x-profile analysis results of thin films of Example 1 and Comparative Example 1.
Figure 2B:
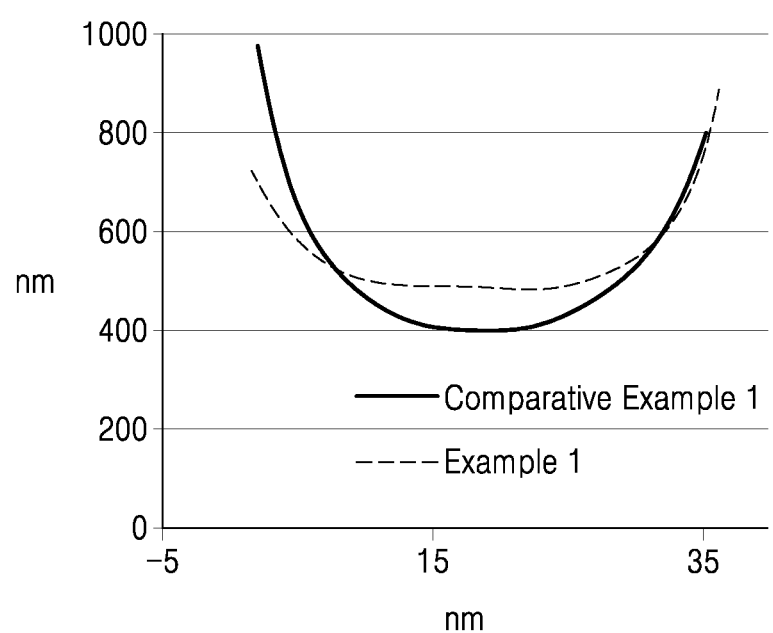
FIG. 2B is a diagram showing y-profile analysis results of thin films of Example 1 and Comparative Example 1.

FIGS. 2A and 2B show analysis results of x-profiles and y-profiles of the films formed in Example 1 and Comparative Example 1, respectively. The x and y-profiles were analyzed by measuring a surface utilizing a surface profiling system.

Referring to FIGS. 2A and 2B, it was confirmed that the x and y-profiles of Example 1 showed a more gentle slope compared to the x and y-profiles of Comparative Example 1. As a result of the x,y-profile analysis, it was confirmed that the thin film of Example 1 showed an IPU of about 60%, and thus had a significantly improved IPU compared to the thin film of Comparative Example 1 which showed an IPU of about 30%.

Example 2

As a substrate, a 15 Ω/cm² ITO glass substrate, which is a product of Corning Inc., was cut to a size of 50 mm×50 mm×0.7 mm, and sonicated with isopropyl alcohol and pure water each for 5 minutes. Then, through photolithography, a bank having a size of 45 nm×35 nm×3,000 nm (W×L×H) was formed on the substrate.

A composition for forming a hole injection layer, a composition for forming a hole transport layer, and a composition for forming an emission layer as described below were sequentially added dropwise on the bank (e.g., to the inside area surrounded by the bank) by utilizing an inkjet printer, and dried at 1 torr for 2 minutes and at $10^{-5}$ torr for 10 minutes to sequentially form a hole injection layer, a hole transport layer, and an emission layer on the ITO anode, thereby completing the manufacture of a hole only device (HOD) light-emitting device.

Composition for Forming Hole Injection Layer: PEDOT:PSS

Composition for forming hole transport layer (HTL1): hole transporting-material (HTM1)+solvent (mixed solvent including 28 wt % of cyclohexylbenzene, 52 wt % of 2-ethylnaphthalene, and 20 wt % of diisopropyl biphenyl) HTM1

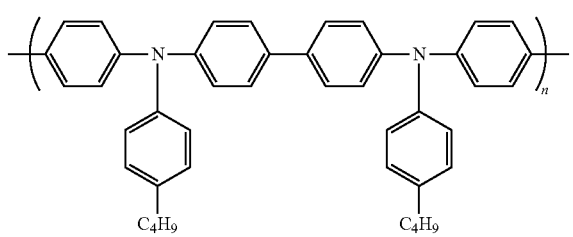

Composition for forming emission layer: light-emitting material+solvent (mixed solvent including 82 wt % of ethyl 4-methylbenzoate and 18 wt % of diisopropyl biphenyl)

Comparative Example 2

A HOD light-emitting device was manufactured in the same manner as in Example 2, except that, a hole transport layer was formed by utilizing a composition for forming a hole transport layer HTL2 in which, as a solvent, a mixed solvent including 72 wt % of 2-ethylnaphthalene and 28 wt % of 2-ethylbiphenyl was utilized instead of a mixed solvent including cyclohexylbenzene, 2-ethylnaphthalene, and diisopropyl biphenyl.

Figure 3A:
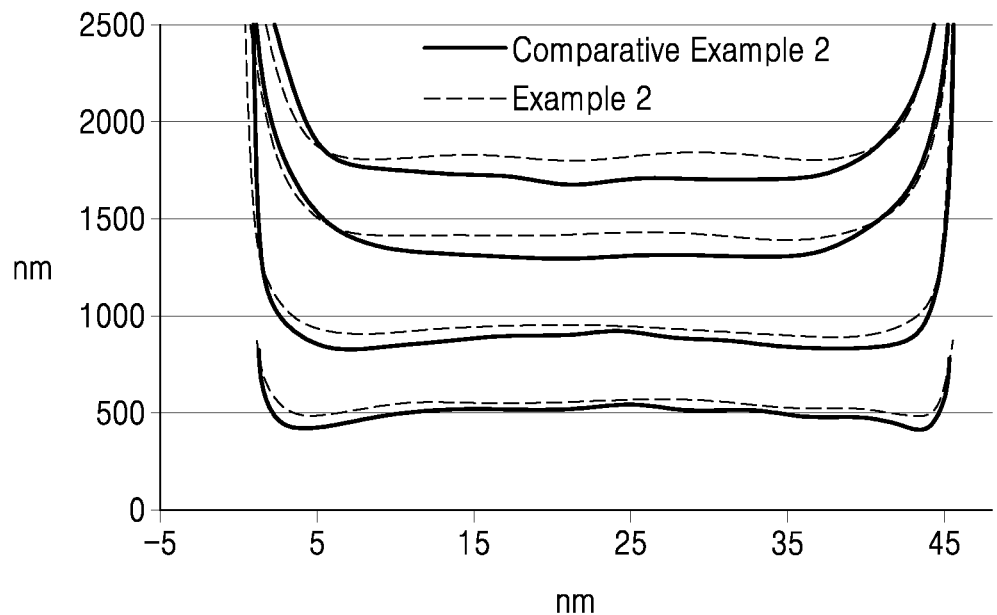
FIG. 3A is a diagram showing x-profile analysis results of HOD devices of Example 2 and Comparative Example 2.
Figure 3B:
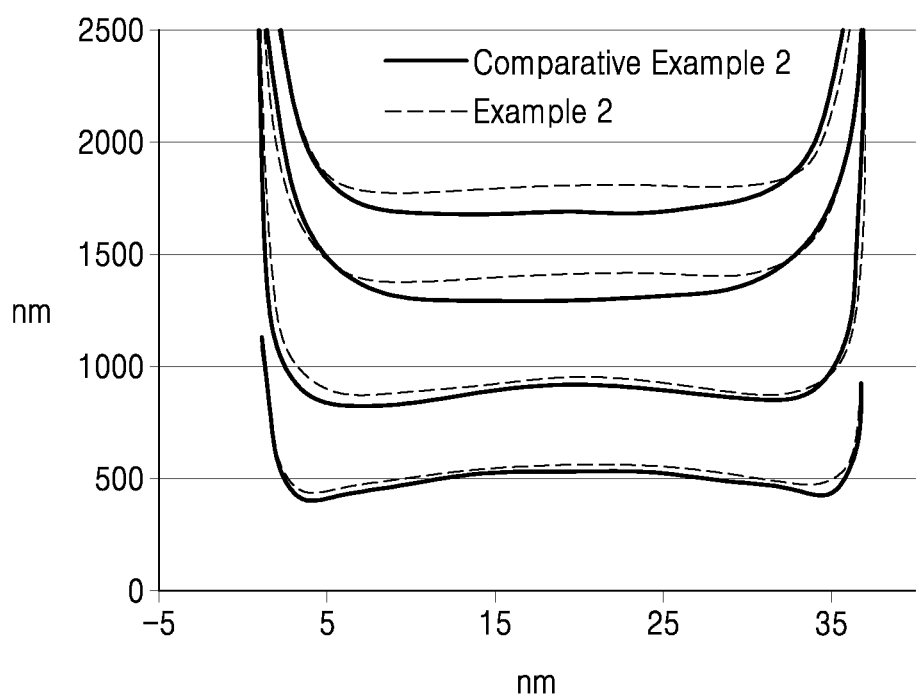
FIG. 3B is a diagram showing y-profile analysis results of HOD devices of Example 2 and Comparative Example 2.

FIGS. 3A and 3B show analysis results of x-profiles and y-profiles of the HOD light-emitting devices formed in Example 2 and Comparative Example 2, respectively. The x and y-profiles were analyzed by measuring a surface utilizing a surface profiling system.

Referring to FIGS. 3A and 3B, it was confirmed that the x and y-profiles of Example 2 showed a more gentle slope compared to the x and y-profiles of Comparative Example 2. As a result of the x,y-profile analysis, it was confirmed that the HOD light-emitting device of Example 2 showed an IPU of about 60%, and thus had a significantly improved IPU compared to the HOD light-emitting device of Comparative Example 2 which showed an IPU of about 30%.

Example 3

An ITO glass substrate (50×50 mm), which is an organic light-emitting device (OLED) glass (manufactured by Samsung-Corning) substrate, was subjected to ultrasonic cleaning utilizing distilled water and isopropanol, followed by UV ozone cleaning for 30 minutes.

PEDOT: PSS was spin coated on the glass substrate with a transparent electrode line attached thereon after the cleaning to form a film with a thickness of 60 nm, and then baked at 200° C. for 30 minutes to form a hole injection layer.

The composition for forming a hole transport layer HTL1 of Example 2 was spin coated on the hole injection layer to form a film having a thickness of 20 nm, and then baked at 230° C. for 30 minutes to form a hole transport layer.

The composition for forming an emission layer of Example 2, in which a blue light-emitting material was included, was spin coated on the hole transport layer to form a film having a thickness of 30 nm, and then baked at 140° C. for 10 minutes to form an emission layer.

$Alq_3$ was deposited on the emission layer to form an electron transport layer having a thickness of 20 nm. Al was deposited on the electron transport layer to form a cathode having a thickness of 100 nm, thereby completing the manufacture of a light-emitting device.

Comparative Example 3

A light-emitting device was manufactured in the same manner as in Example 3, except that the composition for forming a hole transport layer HTL2 of Comparative Example 2 was utilized in forming a hole transport layer.

Example 4

A light-emitting device was manufactured in the same manner as in Example 3, except that a green light-emitting material was utilized instead of a blue light-emitting material in forming an emission layer.

Comparative Example 4

A light-emitting device was manufactured in the same manner as in Example 4, except that the composition for forming a hole transport layer HTL2 of Comparative Example 2 was utilized in forming a hole transport layer.

Example 5

A light-emitting device was manufactured in the same manner as in Example 3, except that a red light-emitting material was utilized instead of a blue light-emitting material in forming an emission layer.

Comparative Example 5

A light-emitting device was manufactured in the same manner as in Example 5, except that the composition for forming a hole transport layer HTL2 of Comparative Example 2 was utilized in forming a hole transport layer.

The efficiency, color conversion efficiency (efficiency/CIEY of blue light), and T95 lifespan of each of the light-emitting devices manufactured in Examples 3 to 5 and Comparative Examples 3 to 5 were measured by utilizing Keithley SMU 236 and luminance meter PR650, and results thereof are shown in Table 3. T95 lifespan is the time taken for the luminance to drop from the initial luminance to 95% of the initial luminance.

TABLE 3

| | Efficiency (cd/A) | Color converison efficiency (cd/A/CIE$_y$) | CIE$_x$ | CIE$_y$ | T95 Lifespan (h) |
|---|---|---|---|---|---|
| Comparative Example 3 | 4.0 | 65.7 | 0.137 | 0.060 | 3000 |
| Example 3 | 5.4 | 85.9 | 0.135 | 0.064 | 3100 |
| Comparative Example 4 | 74.0 | — | 0.328 | 0.646 | 3000 |
| Example 4 | 73.3 | — | 0.353 | 0.627 | 3000 |
| Comparative Example 5 | 26.2 | — | 0.681 | 0.318 | 1900 |
| Example 5 | 28.7 | — | 0.683 | 0.316 | 2000 |

From Table 3, it can be seen that the light-emitting devices of Examples 3 to 5 each have an equal or improved lifespan and improved efficiency and color purity, compared to the light-emitting devices of each of Comparative Examples 3 to 5.

Without being bound by any specific theory, this may be understood as that the efficiency, lifespan, and color reproducibility of the light-emitting devices of Examples 3 to 5 are improved due to the improvement in the IPU.

A light-emitting device manufactured utilizing the composition for forming a light-emitting device according to an embodiment may have, due to improved film flatness of an interlayer, high efficiency, high color purity, and/or a long lifespan. In addition, because a solution process is utilized in forming the light-emitting device, it is suitable (e.g., advantageous) to manufacture a large-area light-emitting device, and the manufacturing cost may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A composition for forming a light-emitting device, the composition comprising three or more solvents,
a boiling point of a first solvent having the highest boiling point among the three or more solvents is greater than 320° C., and a boiling point of a second solvent is greater than a boiling point of a third solvent,
a viscosity at 25° C. of the first solvent is from about 10 centipoise (cP) to about 30 cP, and a viscosity at 25° C. of the second solvent is lower than a viscosity at 25° C. of the third solvent,
the first solvent is comprised in a range of about 15 wt % to about 25 wt % in amount based on a total weight of the composition,
the second solvent is comprised in a range of about 50 wt % to about 55 wt % in amount based on the total weight of the composition, and
the third solvent is comprised in a range of about 25 wt % to about 30 wt % in amount based on the total weight of the composition, and
the first solvent comprises a compound represented by Formula 1:

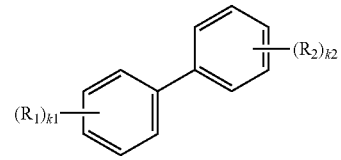

Formula 1 wherein, in Formula 1,
$R_1$ and $R_2$ are each independently a $C_1$-$C_{10}$ alkyl group unsubstituted or substituted with at least one $R_{10a}$, a $C_2$-$C_{10}$ alkenyl group unsubstituted or substituted with at least one $R_{10a}$, a $C_3$-$C_{10}$ cycloalkyl group unsubstituted or substituted with at least one $R_{10a}$, a $C_3$-$C_{10}$ cycloalkenyl group unsubstituted or substituted with at least one $R_{10a}$, a $C_6$-$C_{20}$ aryl group unsubstituted or substituted with at least one $R_{10a}$, or a monovalent non-aromatic condensed polycyclic group unsubstituted or substituted with at least one $R_{10a}$,
k1 and k2 are each independently an integer from 1 to 5, and
$R_{10a}$ is:
deuterium, —F, —Cl, —Br, —I, a hydroxyl group, a cyano group, or a nitro group;
a $C_1$-$C_{60}$ alkyl group, a $C_2$-$C_{10}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, -Si$(Q_{11})(Q_{12})(Q_{13})$, -N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, -Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), -N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The composition of claim 1, wherein the compound represented by Formula 1 does not contain a heteroatom.

3. The composition of claim 1, wherein
$R_1$ and $R_2$ in Formula 1 are each independently a methyl group, an ethyl group, an n-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group.

4. The composition of claim 1, wherein
the first solvent is 4,4'-diisopropyl-1,1'-biphenyl, 3,3'-diisopropyl-1,1'-biphenyl, 2,2'-diisopropyl-1,1'-biphenyl, 3,4'-diisopropyl-1,1'-biphenyl, 2,4'-diisopropyl-1,1'-biphenyl, 2,3'-diisopropyl-1,1'-biphenyl, or any combination thereof.

5. The composition of claim 1, wherein
a vapor pressure at 25° C. of the first solvent is from about $1 \times 10^{-5}$ torr to about $1 \times 10^{-4}$ torr.

6. The composition of claim 1, wherein
the second solvent having a lower boiling point than the first solvent has a vapor pressure at 25° C. of about $1 \times 10^{-2}$ torr to about $1 \times 10^{-1}$ torr.

7. The composition of claim 1, wherein
the second solvent and the third solvent each independently have a vapor pressure at 25° C. of about $1 \times 10^{-2}$ torr to about $1 \times 10^{-1}$ torr.

8. The composition of claim 7, wherein
a ratio of a vapor pressure at 25° C. of the second solvent to a vapor pressure at 25° C. of the first solvent is from about 100 to about 10,000, and
a ratio of a vapor pressure at 25° C. of the third solvent to a vapor pressure at 25° C. of the first solvent is from about 100 to about 10,000.

9. The composition of claim 7, wherein
the second solvent and the third solvent each independently have a viscosity at 25° C. of about 1 cP to about 10 cP.

10. The composition of claim 7, wherein
the second solvent and the third solvent are each independently an aromatic hydrocarbon-based compound or a non-aromatic cyclic hydrocarbon-based compound, the aromatic hydrocarbon-based compound not containing a heteroatom and the non-aromatic cyclic hydrocarbon-based compound not containing a heteroatom.

11. The composition of claim 7, wherein
the second solvent and the third solvent are each independently cyclohexylbenzene, 1-ethylnaphthalene, 2-ethylnaphthalene, or 2-ethylbiphenyl.

12. The composition of claim 1, further comprising a light-emitting material.

13. The composition of claim 12, wherein the light-emitting material comprises a host and a dopant.

14. The composition of claim 1, further comprising a hole-transporting material.

15. The composition of claim 1, further comprising an electron-transporting material.

16. A light-emitting device comprising:
a first electrode;
a second electrode facing the first electrode; and
an interlayer between the first electrode and the second electrode and comprising an emission layer,
wherein the interlayer is formed by utilizing the composition of claim 1.

17. The light-emitting device of claim 16, wherein
the first electrode is an anode,
the second electrode is a cathode,
the interlayer further comprises a hole transport region between the first electrode and the emission layer and an electron transport region between the emission layer and the second electrode, and
at least one of the hole transport region, the emission layer, or the electron transport region is formed by utilizing the composition.

18. A method of manufacturing a light-emitting device, the method comprising forming, on a first electrode, an interlayer comprising an emission layer,
wherein the forming of the interlayer comprises a solution process utilizing a composition for forming a light-emitting device,
the composition for forming a light-emitting device comprises three or more solvents,
a boiling point of a first solvent having the highest boiling point among the three or more solvents is greater than 320° C., and a boiling point of a second solvent is greater than a boiling point of a third solvent,
a viscosity at 25° C. of the first solvent is from about 10 centipoise (cP) to about 30 cP, and a viscosity at 25° C. of the second solvent is lower than a viscosity at 25° C. of the third solvent,
the first solvent is comprised in a range of about 15 wt % to about 25 wt % in amount based on a total weight of the composition,
the second solvent is comprised in a range of about 50 wt % to about 55 wt % in amount based on the total weight of the composition, and
the third solvent is comprised in a range of about 25 wt % to about 30 wt % in amount based on the total weight of the composition, and
the first solvent comprises a compound represented by Formula 1:

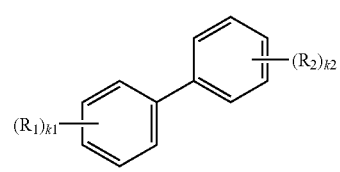

Formula 1 wherein, in Formula 1, $R_1$ and $R_2$ are each independently a $C_1$-$C_{10}$ alkyl group unsubstituted or substituted with at least one $R_{10a}$, a $C_2$-$C_{10}$ alkenyl group unsubstituted or substituted with at least one $R_{10a}$, a $C_3$-$C_{10}$ cycloalkyl group unsubstituted or substituted with at least one $R_{10a}$, a $C_3$-$C_{10}$ cycloalkenyl group unsubstituted or substituted with at least one $R_{10a}$, a $C_6$-$C_{20}$ aryl group unsubstituted or substituted with at least one $R_{10a}$, or a monovalent non-aromatic condensed polycyclic group unsubstituted or substituted with at least one $R_{10a}$, k1 and k2 are each independently an integer from 1 to 5, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, -Si($Q_{11}$)($Q_{12}$)($Q_{13}$), -N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, -Si($Q_{21}$)($Q_{22}$)($Q_{23}$), -N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), -N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

19. The method of claim 18, wherein the solution process is performed by inkjet printing, nozzle printing, screen printing, flexographic printing, and/or offset printing.

* * * * *